(12) United States Patent
Nagano et al.

(10) Patent No.: US 10,512,148 B2
(45) Date of Patent: Dec. 17, 2019

(54) SYSTEM AND METHOD FOR GENERATING EXTREME ULTRAVIOLET LIGHT EMPLOYING LASER PULSE INCLUDING PEDESTAL

(71) Applicant: GIGAPHOTON INC., Oyama-shi, Tochigi (JP)

(72) Inventors: Hitoshi Nagano, Himeji (JP); Yasunori Wada, Chigasaki (JP); Tatsuya Yanagida, Hiratsuka (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 321 days.

(21) Appl. No.: 15/447,013

(22) Filed: Mar. 1, 2017

(65) Prior Publication Data

US 2017/0196072 A1    Jul. 6, 2017

Related U.S. Application Data

(62) Division of application No. 14/241,023, filed as application No. PCT/IB2012/001717 on Sep. 5, 2012, now abandoned.

(30) Foreign Application Priority Data

Oct. 5, 2011 (JP) ................................ 2011-220911
Jun. 15, 2012 (JP) ................................ 2012-135472

(51) Int. Cl.
*H05G 2/00* (2006.01)
*H01S 3/107* (2006.01)
(Continued)

(52) U.S. Cl.
CPC ............. *H05G 2/008* (2013.01); *G21K 1/062* (2013.01); *H01L 21/0275* (2013.01);
(Continued)

(58) Field of Classification Search
CPC ........ H05G 2/008; H05G 2/005; H05G 2/003; H05G 2/00; H05G 2/001; H01S 3/1305;
(Continued)

(56) References Cited

U.S. PATENT DOCUMENTS 4,620,113 A    10/1986 Sizer, II et al.
5,089,711 A    2/1992 Morsell et al.
(Continued)

FOREIGN PATENT DOCUMENTS

EP    1 617 713 A1    1/2006
JP    2003-224052 A    8/2003

OTHER PUBLICATIONS

International Search Report issued in International Application No. PCT/IB2012/001717 dated Mar. 5, 2013.
(Continued)

*Primary Examiner* — Brooke Purinton
(74) *Attorney, Agent, or Firm* — Studebaker & Brackett PC

(57) ABSTRACT

A system for generating extreme ultraviolet light, in which a target material inside a chamber is irradiated with a laser beam to be turned into plasma, includes a first laser apparatus configured to output a first laser beam, a second laser apparatus configured to output a pedestal and a second laser beam, and a controller connected to the first and second laser apparatuses and configured to cause the first laser beam to be outputted first, the pedestal to be outputted after the first laser beam, and the second laser beam having higher energy than the pedestal to be outputted after the pedestal.

20 Claims, 43 Drawing Sheets

(51) Int. Cl.
*H01S 3/23* (2006.01)
*H01S 3/00* (2006.01)
*H01S 3/13* (2006.01)
*H01S 3/16* (2006.01)
*G21K 1/06* (2006.01)
*H01L 21/027* (2006.01)

(52) U.S. Cl.
CPC ............ *H01S 3/005* (2013.01); *H01S 3/1075* (2013.01); *H01S 3/1305* (2013.01); *H01S 3/1643* (2013.01); *H01S 3/2316* (2013.01); *H05G 2/005* (2013.01)

(58) Field of Classification Search
CPC .... H01S 3/005; H01S 3/10038; H01S 3/2316; H01S 3/1075; H01L 21/0275; G03F 7/70033; G03F 7/70041; G03F 7/70025
See application file for complete search history.

(56) References Cited

U.S. PATENT DOCUMENTS

| | | | |
|---|---|---|---|
| 5,148,318 A * | 9/1992 | Okamoto | G02B 17/004 359/629 |
| 7,602,825 B1 | 10/2009 | Lin et al. | |
| 10,064,261 B2 * | 8/2018 | Tao | H05G 2/008 |
| 2003/0142198 A1 | 7/2003 | Miyake | |
| 2004/0022295 A1 | 2/2004 | Weulersse et al. | |
| 2005/0205811 A1 | 9/2005 | Partlo et al. | |
| 2006/0215712 A1 | 9/2006 | Ziener et al. | |
| 2007/0001131 A1 * | 1/2007 | Ershov | H05G 2/003 250/503.1 |
| 2010/0181503 A1 | 7/2010 | Yanagida et al. | |
| 2010/0193710 A1 | 8/2010 | Wakabayashi et al. | |
| 2010/0220756 A1 | 9/2010 | Krzysztof et al. | |
| 2011/0211601 A1 * | 9/2011 | Ariga | H01S 3/2308 372/27 |
| 2011/0284507 A1 | 11/2011 | Deladurantaye et al. | |
| 2012/0092746 A1 * | 4/2012 | Hou | H01S 3/076 359/285 |
| 2013/0207004 A1 | 8/2013 | Ceglio et al. | |
| 2013/0234036 A1 | 9/2013 | Kakutani et al. | |

OTHER PUBLICATIONS

H. Kuroda et al., "Studies of advanced soft X-ray laser and coherent higher harmonic generation using intense subpicosecond laser produced high density plasma," Journal of Luminescence, vol. 100, (2002), pp. 291-300.

V.S. Belyaev et al., "On the Role of Prepulses during Solid Target Heating by Picosecond Laser Pulses," Journal of Experimental and Theoretical Physics, vol. 96, No. 5, 2003, pp. 897-903.

Y. Okano et al., "Energy distribution of electrons ejected from a copper target in a femtosecond laser field of 1017 W/cm2," Journal of Applied Physics, vol. 95, No. 5, Mar. 1, 2004, pp. 2278-2282.

Notification Concerning Transmittal of International Preliminary Report on Patentability issued in International Application No. PCT/IB2012/001717 dated Apr. 17, 2014.

* cited by examiner

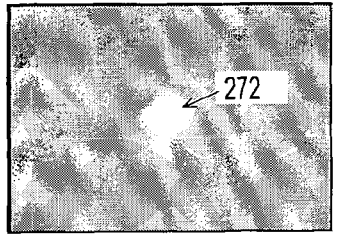

DROPLET DIAMETER: 20 μm
PULSE DURATION OF PRE-PULSE LASER BEAM: 5 ns
FLUENCE OF PRE-PULSE LASER BEAM: 480 mJ/cm$^2$
ELAPSED TIME FROM PRE-PULSE LASER IRRADIATION : 0 μs

FIG. 66

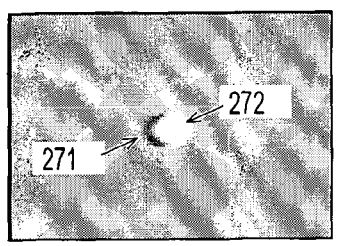

DROPLET DIAMETER: 20 μm
PULSE DURATION OF PRE-PULSE LASER BEAM: 5 ns
FLUENCE OF PRE-PULSE LASER BEAM: 480 mJ/cm$^2$
ELAPSED TIME FROM PRE-PULSE LASER IRRADIATION : 0.5 μs

FIG. 67

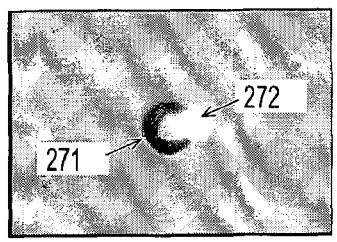

DROPLET DIAMETER: 20 μm
PULSE DURATION OF PRE-PULSE LASER BEAM: 5 ns
FLUENCE OF PRE-PULSE LASER BEAM: 480 mJ/cm$^2$
ELAPSED TIME FROM PRE-PULSE LASER IRRADIATION : 1.0 μs

FIG. 68

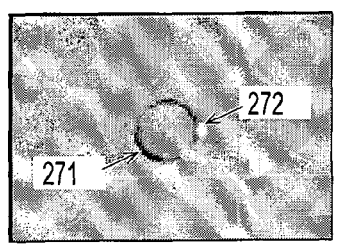

DROPLET DIAMETER: 20 μm
PULSE DURATION OF PRE-PULSE LASER BEAM: 5 ns
FLUENCE OF PRE-PULSE LASER BEAM: 480 mJ/cm$^2$
ELAPSED TIME FROM PRE-PULSE LASER IRRADIATION : 1.5 μs

FIG. 69

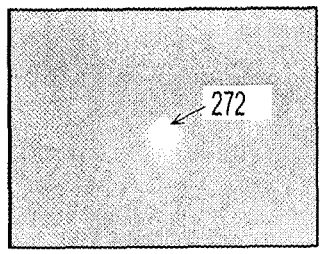

DROPLET DIAMETER: 20 μm
PULSE DURATION OF PRE-PULSE LASER BEAM: 5 ns
FLUENCE OF PRE-PULSE LASER BEAM: 96 mJ/cm$^2$
ELAPSED TIME FROM PRE-PULSE LASER IRRADIATION : 0 μs

FIG. 70

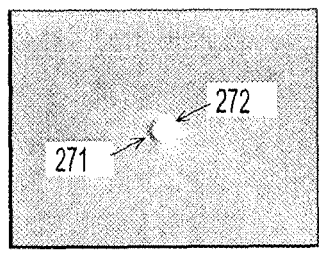

DROPLET DIAMETER: 20 μm
PULSE DURATION OF PRE-PULSE LASER BEAM: 5 ns
FLUENCE OF PRE-PULSE LASER BEAM: 96 mJ/cm$^2$
ELAPSED TIME FROM PRE-PULSE LASER IRRADIATION : 0.5 μs

FIG. 71

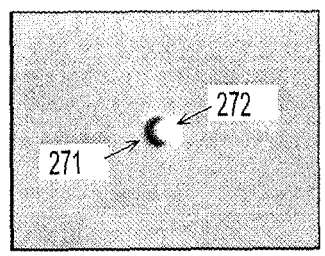

DROPLET DIAMETER: 20 μm
PULSE DURATION OF PRE-PULSE LASER BEAM: 5 ns
FLUENCE OF PRE-PULSE LASER BEAM: 96 mJ/cm$^2$
ELAPSED TIME FROM PRE-PULSE LASER IRRADIATION : 1.0 μs

FIG. 72

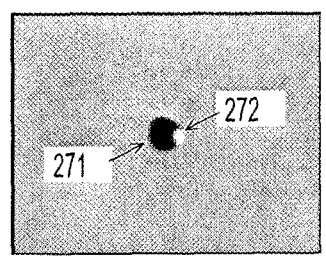

DROPLET DIAMETER: 20 μm
PULSE DURATION OF PRE-PULSE LASER BEAM: 5 ns
FLUENCE OF PRE-PULSE LASER BEAM: 96 mJ/cm$^2$
ELAPSED TIME FROM PRE-PULSE LASER IRRADIATION : 1.5 μs

FIG. 73

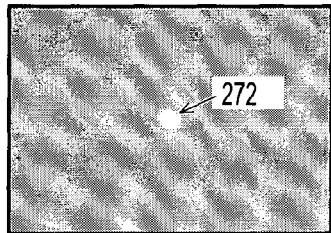

DROPLET DIAMETER: 20 μm
PULSE DURATION OF PRE-PULSE LASER BEAM: 5 ns
FLUENCE OF PRE-PULSE LASER BEAM: 19 mJ/cm$^2$
ELAPSED TIME FROM PRE-PULSE LASER IRRADIATION : 0 μs

FIG. 74

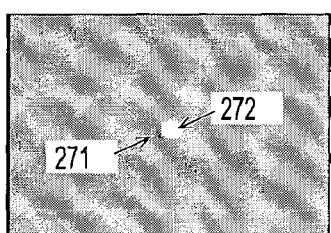

DROPLET DIAMETER: 20 μm
PULSE DURATION OF PRE-PULSE LASER BEAM: 5 ns
FLUENCE OF PRE-PULSE LASER BEAM: 19 mJ/cm$^2$
ELAPSED TIME FROM PRE-PULSE LASER IRRADIATION : 0.5 μs

FIG. 75

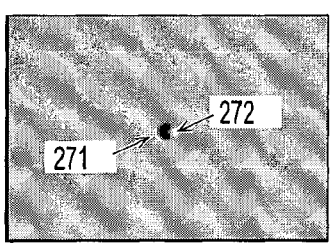

DROPLET DIAMETER: 20 μm
PULSE DURATION OF PRE-PULSE LASER BEAM: 5 ns
FLUENCE OF PRE-PULSE LASER BEAM: 19 mJ/cm$^2$
ELAPSED TIME FROM PRE-PULSE LASER IRRADIATION : 1.0 μs

FIG. 76

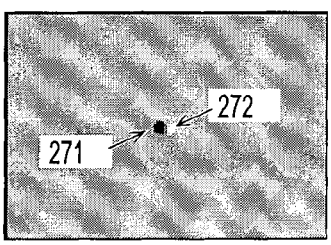

DROPLET DIAMETER: 20 μm
PULSE DURATION OF PRE-PULSE LASER BEAM: 5 ns
FLUENCE OF PRE-PULSE LASER BEAM: 19 mJ/cm$^2$
ELAPSED TIME FROM PRE-PULSE LASER IRRADIATION : 1.5 μs

FIG. 77

SYSTEM AND METHOD FOR GENERATING EXTREME ULTRAVIOLET LIGHT EMPLOYING LASER PULSE INCLUDING PEDESTAL

CROSS-REFERENCE TO RELATED APPLICATIONS

The present application is a Divisional of U.S. application Ser. No. 14/241,023 filed on Feb. 25, 2014, which is the U.S. National Phase under 35 U.S.C. § 371 of International Application no. PCT/IB2012/001717, filed on Sep. 5, 2012, which claims priority from Japanese Patent Application No. 2011-220911 filed Oct. 5, 2011, and Japanese Patent Application No. 2012-135472 filed Jun. 15, 2012, the disclosures of which Applications are incorporated by reference herein.

BACKGROUND

1. Technical Field

This disclosure relates to a system and a method for generating extreme ultraviolet (EUV) light.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed which combines a system for generating EUV light at a wavelength of approximately 13 nm with a reduced projection reflective optical system.

Three kinds of systems for generating EUV light are known in general, including a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

A system for generating extreme ultraviolet light according to one aspect of this disclosure, in which a target material inside a chamber is irradiated with a laser beam to be turned into plasma, may include a first laser apparatus configured to output a first laser beam, a second laser apparatus configured to output a pedestal and a second laser beam, and a controller connected to the first and second laser apparatuses and configured to cause the first laser beam to be outputted first, the pedestal to be outputted after the first laser beam, and the second laser beam having higher energy than the pedestal to be outputted after the pedestal.

A method for generating extreme ultraviolet light according to another aspect of this disclosure, in which a target material inside a chamber is irradiated with a laser beam to be turned into plasma, may include irradiating a target material with a first laser beam, a second laser beam, and a third laser beam having energy higher than the second laser beam.

BRIEF DESCRIPTION OF THE DRAWINGS

Hereinafter, selected embodiments of this disclosure will be described with reference to the accompanying drawings. Note that a polarizer in this specification may be an example of an optical filter.

FIG. 66 shows plasma of a target material observed 0 µs after a target is irradiated with a pre-pulse laser beam having a fluence of 480 mJ/cm$^2$.

FIG. 67 shows a diffused target and plasma of a target material observed 0.5 µs after a target is irradiated with a pre-pulse laser beam having a fluence of 480 mJ/cm$^2$.

FIG. 68 shows a diffused target and plasma of a target material observed 1.0 µs after a target is irradiated with a pre-pulse laser beam having a fluence of 480 mJ/cm$^2$.

FIG. 69 shows a diffused target and plasma of a target material observed 1.5 µs after a target is irradiated with a pre-pulse laser beam having a fluence of 480 mJ/cm$^2$.

FIG. 70 shows plasma of a target material observed 0 µs after a target is irradiated with a pre-pulse laser beam having a fluence of 96 mJ/cm$^2$.

FIG. 71 shows a diffused target and plasma of a target material observed 0.5 µs after a target is irradiated with a pre-pulse laser beam having a fluence of 96 mJ/cm$^2$.

FIG. 72 shows a diffused target and plasma of a target material observed 1.0 µs after a target is irradiated with a pre-pulse laser beam having a fluence of 96 mJ/cm$^2$.

FIG. 73 shows a diffused target and plasma of a target material observed 1.5 µs after a target is irradiated with a pre-pulse laser beam having a fluence of 96 mJ/cm$^2$.

FIG. 74 shows plasma of a target material observed 0 µs after a target is irradiated with a pre-pulse laser beam having a fluence of 19.5 mJ/cm$^2$.

FIG. 75 shows a diffused target and plasma of a target material observed 0.5 µs after a target is irradiated with a pre-pulse laser beam having a fluence of 19.5 mJ/cm$^2$.

FIG. 76 shows a diffused target and plasma of a target material observed 1.0 µs after a target is irradiated with a pre-pulse laser beam having a fluence of 19.5 mJ/cm$^2$.

FIG. 77 shows a diffused target and plasma of a target material observed 1.5 µs after a target is irradiated with a pre-pulse laser beam having a fluence of 19.5 mJ/cm$^2$.

DETAILED DESCRIPTION

Figure 1:
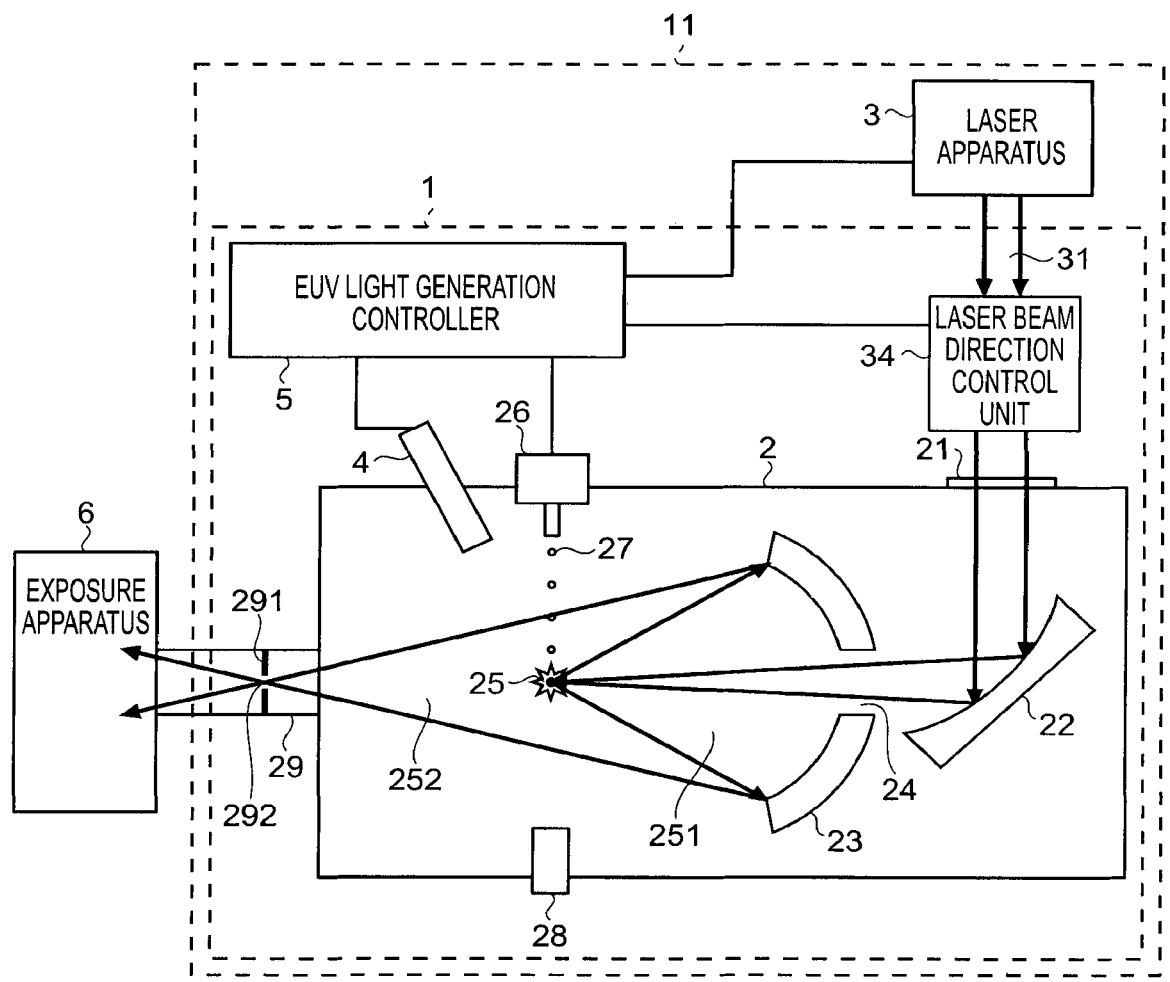
FIG. 1 schematically illustrates a configuration of an exemplary EUV light generation system.

Hereinafter, selected embodiments of this disclosure will be described in detail with reference to the accompanying drawings. The embodiments to be described below are merely illustrative in nature and do not limit the scope of this disclosure. Further, configurations and operations described in each embodiment are not all essential in implementing this disclosure. Note that like elements are referenced by like reference numerals and characters, and duplicate descriptions thereof will be omitted herein. The embodiments of this disclosure will be described following the table of contents below.

Contents
1. Overview
2. Overview of EUV Light Generation System
2.1 Configuration
2.2 Operation
3. EUV Light Generation System Including Pedestal Control Device: First Embodiment
3.1 Configuration
3.2 Operation
3.3 Relationship between Pedestal of Main Pulse Laser Beam and Conversion Efficiency
3.4 Flowcharts
3.4.1 Pedestal Control Flow
3.4.1.1 Control Flow Based on Pedestal Ratio
3.4.1.1.1 Pedestal Control Subroutine
3.4.1.1.2 Pedestal Control Subroutine: First Modification
3.4.1.1.3 Pedestal Ratio Calculation Subroutine
3.4.1.1.4 Pedestal Stabilization Subroutine
3.4.1.1.5 Pedestal Ratio Calculation Subroutine: Modification
3.4.1.1.6 Adjustment Necessity Determination Subroutine
3.4.1.1.7 Adjustment Necessity Determination Subroutine: First Modification
3.4.1.2 Control Flow Based on Pedestal Energy
3.4.1.2.1 Pedestal Control Subroutine: Second Modification
3.4.1.2.2 Pedestal Control Subroutine: Third Modification
3.4.1.2.3 Pedestal Energy Calculation Subroutine
3.4.1.2.4 Pedestal Stabilization Subroutine: Modification
3.4.1.2.5 Pedestal Energy Calculation Subroutine: Modification
3.4.1.2.6 Adjustment Necessity Determination Subroutine: Second Modification
3.4.1.2.7 Adjustment Necessity Determination Subroutine: Third Modification
4. Pedestal Control Device
4.1 Optical Shutter
4.2 Optical Shutter and Saturable Absorber Device
4.3 Combination with Pockels Cell in Master Oscillator
4.3.1 Combination with Saturable Absorber Device
4.3.2 Combination with Optical Shutter
4.4 Embodiment Where Master Oscillator Includes At Least Two Semiconductor Lasers
5. Controlling Energy of EUV Light by Controlling Pedestal of Main Pulse Laser Beam: Second Embodiment
5.1 Configuration
5.2 Operation
5.3 Effect
5.4 Flowcharts
5.4.1 Control Flow Based on Pedestal Ratio
5.4.1.1 Pedestal Control Flow
5.4.1.2 Pedestal Control Subroutine
5.4.2 Control Flow Based on Pedestal Energy
5.4.2.1 Pedestal Control Flow
5.4.2.2 Pedestal Control Subroutine Optical Shutter
6.1 Combination of Pockels Cell and Polarizer
6.2 Variations of Optical Shutter
6.2.1 First Modification
6.2.2 Second Modification
6.2.3 Third Modification
6.2.4 Fourth Modification
7. Saturable Absorber Device
7.1 Adjusting Concentration of Saturable Absorber Gas
7.2 Adjusting Optical Path Length through Saturable Absorber Gas
8. Supplementary Descriptions
8.1 Diffused Target
8.1.1 Generation of Diffused Target
8.2 Relationship Between Delay Time for Main Pulse Laser Beam and Conversion Efficiency
8.3 Relationship between Fluence of Pre-pulse Laser beam and Shape of Diffused Target
8.4 Regenerative Amplifier 1. Overview In certain embodiments of an EUV light generation system to be described below, a target material may be irradiated with a pre-pulse laser beam to thereby be turned into a diffused target, and the diffused target may be irradiated with a main pulse laser beam. Such an EUV light generation system may include a device configured to control a pedestal of the main pulse laser beam. By controlling energy of the pedestal of the main pulse laser beam, energy of EUV light to be generated in the aforementioned EUV light generation system may be controlled.

2. Overview of EUV Light Generation System 2.1 Configuration

FIG. 1 schematically illustrates a configuration of an exemplary LPP type EUV light generation system. An LPP type EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply unit. The target supply unit may be a target generator 26. The chamber 2 may be sealed airtight. The target supply unit may be mounted onto the chamber 2 to, for example, penetrate a wall of the chamber 2. A target material to be supplied by the target supply unit may include, but is not limited to, tin, terbium, gadolinium, lithium, xenon, or any combination thereof.

The chamber 2 may have at least one through-hole or opening formed in its wall, and a pulse laser beam 31 may travel through the through-hole/opening into the chamber 2. Alternatively, the chamber 2 may have a window 21, through which the pulse laser beam 31 may travel into the chamber 2. An EUV collector mirror 23 having a spheroidal surface may, for example, be provided inside the chamber 2. The EUV collector mirror 23 may have a multi-layered reflective film formed on the spheroidal surface thereof. The reflective film may include a molybdenum layer and a silicon layer, which are laminated alternately. The EUV collector mirror 23 may have a first focus and a second focus, and may be positioned such that the first focus lies in a plasma generation region 25 and the second focus lies in an intermediate focus (IF) region 292 defined by the specification of an external apparatus, such as an exposure apparatus 6. The EUV collector mirror 23 may have a through-hole 24 formed at the center thereof, and the pulse laser beam 31 may travel through the through-hole 24 toward the plasma generation region 25.

The EUV light generation system 11 may further include an EUV light generation controller 5 and a target sensor 4. The target sensor 4 may have an imaging function and detect at least one of the presence, the trajectory, and the position of a target 27.

Further, the EUV light generation system 11 may include a connection part 29 for allowing the interior of the chamber 2 to be in communication with the interior of the exposure apparatus 6. A wall 291 having an aperture may be provided inside the connection part 29, and the wall 291 may be positioned such that the second focus of the EUV collector mirror 23 lies in the aperture formed in the wall 291.

The EUV light generation system 11 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 31 travels and an actuator (not separately shown) for adjusting the position and the orientation or posture of the optical element.

2.2 Operation

With continued reference to FIG. 1, the pulse laser beam 31 outputted from the laser apparatus 3 may pass through the laser beam direction control unit 34 and be outputted therefrom after having its direction optionally adjusted. The pulse laser beam 31 may travel through the window 21 and enter the chamber 2. The pulse laser beam 31 may travel inside the chamber 2 along at least one beam path from the laser apparatus 3, be reflected by the laser beam focusing mirror 22, and strike at least one target 27.

The target supply unit may be configured to output the target(s) 27 toward the plasma generation region 25 inside the chamber 2. The target 27 may be irradiated with at least one pulse of the pulse laser beam 31. Upon being irradiated with the pulse laser beam 31, the target 27 may be turned into plasma, and rays of light 251 including EUV light 252 may be emitted from the plasma. At least the EUV light 252 included in the light 251 may be reflected selectively by the EUV collector mirror 23. The EUV light 252 reflected by the EUV collector mirror 23 may travel through the intermediate focus region 292 and be outputted to the exposure apparatus 6. Here, the target 27 may be irradiated with multiple pulses included in the pulse laser beam 31.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of the timing at which the target 27 is outputted and the direction into which the target 27 is outputted. Furthermore, the EUV light generation controller 5 may be configured to control at least one of the timing at which the laser apparatus 3 oscillates, the direction in which the pulse laser beam 31 travels, and the position at which the pulse laser beam 31 is focused. It will be appreciated that the various controls mentioned above are merely examples, and other controls may be added as necessary.

3. EUV Light Generation System Including Pedestal Control Device: First Embodiment An EUV light generation system according to a first embodiment of this disclosure will now be described in detail with reference to the drawings. In the description to follow, an EUV light generation system 11A in which a target material is irradiated with multiple pulse laser beams will be illustrated as an example.

3.1 Configuration

Figure 2:
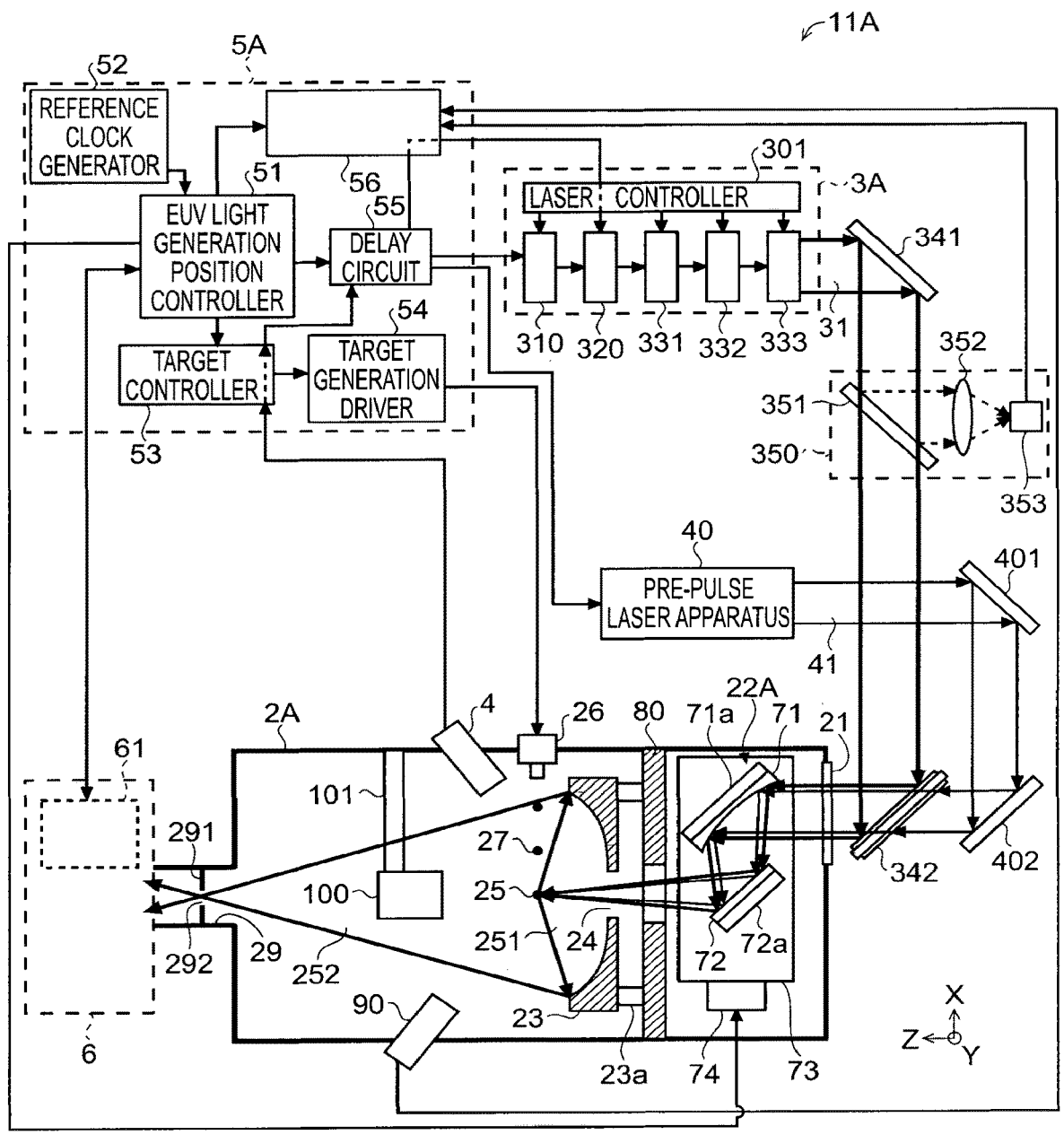
FIG. 2 schematically illustrates an exemplary configuration of an EUV light generation system according to a first embodiment of this disclosure.

FIG. 2 schematically illustrates an exemplary configuration of the EUV light generation system 11A. As shown in FIG. 2, the EUV light generation system 11A may include a main pulse laser apparatus 3A, a high-reflection mirror 341, a dichroic mirror 342, a pre-pulse laser apparatus 40, high-reflection mirrors 401 and 402, a waveform detection unit 350, a chamber 2A, and an EUV light generation controller 5A.

The main pulse laser apparatus 3A may include a master oscillator 310, a pedestal control device 320, amplifiers 331, 332, and 333, and a laser controller 301. The laser controller 301 may be configured to control each of the master oscillator 310, the pedestal control device 320, and the amplifiers 331 through 333.

The master oscillator 310 may be configured to output a pulse laser beam at a predetermined repetition rate. The pedestal control device 320 may be configured to transform a waveform of the pulse laser beam from the master oscillator 310. Each of the amplifiers 331 through 333 may contain $CO_2$ gas as a gain medium. An amplified pulse laser beam may be outputted from the main pulse laser apparatus 3A as a main pulse laser beam 31. The central wavelength of the main pulse laser beam 31 may be about 10.6 µm.

The high-reflection mirror 341 and the dichroic mirror 342 may constitute a beam delivery unit. The high-reflection mirror 341 may be coated with a film configured to reflect the main pulse laser beam 31 with high reflectance. The beam delivery unit may further include an actuator (not separately shown) for adjusting the position and the orientation of the high-reflection mirror 341. The main pulse laser beam 31 incident on the high-reflection mirror 341 may be reflected toward the dichroic mirror 342.

The pre-pulse laser apparatus 40 may be configured to output a pre-pulse laser beam 41 at a central wavelength of about 1.06 µm. The pre-pulse laser apparatus 40 may, for example, be a Yttrium Aluminum Garnet (YAG) laser apparatus. Pulse duration of the pre-pulse laser beam 41 may be about 5 ns. The pre-pulse laser beam 41 from the pre-pulse laser apparatus 40 may be reflected sequentially by the high-reflection mirrors 401 and 402 and then be incident on the dichroic mirror 342. Each of the high-reflection mirrors 401 and 402 may be coated with a film configured to reflect the pre-pulse laser beam 41 with high reflectance. Further, each of the high-reflection mirrors 401 and 402 may include an actuator (not separately shown) for adjusting the position and the orientation of the respective high-reflection mirrors 401 and 402.

The dichroic mirror 342 may serve as a beam axis adjuster for adjusting the beam axes of the main pulse laser beam 31 and the pre-pulse laser beam 41 entering the chamber 2A.

The dichroic mirror 342 may be coated on a first surface thereof with a film configured to reflect the main pulse laser beam 31 with high reflectance and transmit the pre-pulse laser beam 41 with high transmittance. The dichroic mirror 342 may be coated on a second surface thereof with a film configured to transmit the pre-pulse laser beam 41 with high transmittance. The dichroic mirror 342 may be positioned such that the main pulse laser beam 31 is incident on its first surface and the pre-pulse laser beam 41 is incident on its second surface. The substrate of the dichroic mirror 342 may, for example, be formed of diamond.

The chamber 2A may include a window 21, a laser beam focusing optical system 22A, a target generator 26, a target sensor 4, an EUV collector mirror 23, an energy sensor 90, a beam dump 100, and a connection part 29.

Each of the main pulse laser beam 31 and the pre-pulse laser beam 41 which have entered the chamber 2A through the window 21 may enter the laser beam focusing optical system 22A. The window 21 may be coated with an anti-reflection film. The laser beam focusing optical system 22A may include a laser beam focusing mirror 71 and a high-reflection mirror 72. The laser beam focusing optical system 22A may further include a moving plate 73, a plate moving device 74, and mirror holders 71a and 72a. The mirror holder 72a may be provided with an automatic tilt mechanism (not separately shown). The laser beam focusing mirror 71 may be an off-axis paraboloidal mirror. The laser beam focusing mirror 71 may be fixed to the moving plate 73 through the mirror holder 71a. The high-reflection mirror 72 may be fixed to the moving plate 73 through the mirror holder 72a. The plate moving device 74 may be configured to move the laser beam focusing mirror 71 and the high-reflection mirror 72 along with the moving plate 73.

Each of the main pulse laser beam 31 and the pre-pulse laser beam 41 which have entered the laser beam focusing optical system 22A may first be reflected by the laser beam focusing mirror 71 toward the high-reflection mirror 72. The high-reflection mirror 72 may be positioned to reflect each of the main pulse laser beam 31 and the pre-pulse laser beam 41 toward the plasma generation region 25. Then, each of the main pulse laser beam 31 and the pre-pulse laser beam 41 may be focused in the plasma generation region 25.

The plate moving device 74 may move the moving plate 73, to thereby adjust the focus position of each of the main pulse laser beam 31 and the pre-pulse laser beam 41 in the Z-direction. The mirror holder 72a may adjust a tilt angle of the high-reflection mirror 72, to thereby adjust the focus position of each of the main pulse laser beam 31 and the pre-pulse laser beam 41 along the XY plane. The above adjustment may be controlled by the EUV light generation controller 5A, which will be described later.

The target generator 26 may be configured to output targets 27 toward the plasma generation region 25. The target generator 26 may be provided with a two-axis moving device (not separately shown). The two-axis moving device may be configured to move the target generator 26, to thereby adjust the position to which the target 27 is supplied.

The target 27 that has reached the plasma generation region 25 may be sequentially irradiated with the pre-pulse laser beam 41 and the main pulse laser beam 31. The pre-pulse laser beam 41 and the main pulse laser beam 31 may strike the target 27 through a through-hole 24 formed in the EUV collector mirror 23. Upon being irradiated with the pre-pulse laser beam 41, the target 27 may be turned into a diffused target. This diffused target may then be irradiated with the main pulse laser beam 31, to thereby be turned into plasma. Light 251 including EUV light 252 may be emitted from the plasma.

Part of the pre-pulse laser beam 41 and the main pulse laser beam 31 that has passed through the plasma generation region 25 may be absorbed by the beam dump 100. The beam dump 100 may be fixed to the chamber 2A through a support 101.

The energy sensor 90 may detect energy of the EUV light 252 emitted in the plasma generation region 25. The detected energy may be inputted to the EUV light generation controller 5A.

The waveform detection unit 350 may include a beam splitter 351, a focusing lens 352, and a waveform detector 353. The beam splitter 351 may reflect a part of the main pulse laser beam 31 and transmit the remaining part. The focusing lens 352 may be positioned to focus the main pulse laser beam 31 reflected by the beam splitter 351 on a photosensitive surface of the waveform detector 353. The waveform detector 353 may monitor a waveform of the main pulse laser beam 31 imaged on the photosensitive surface. Alternatively, a diffusion plate may be provided in place of the focusing lens 352. The waveform detector 353 may then monitor a waveform of the main pulse laser beam 31 diffused by the diffusion plate. In other embodiments, a plate having a through-hole may be provided in place of the focusing lens 352. The waveform detector 353 may then monitor a waveform of the main pulse laser beam 31 that has passed through the aforementioned through-hole. In yet another embodiment, the main pulse laser beam 31 reflected by the beam splitter 351 may be directly incident on the photosensitive surface of the waveform detector 353. A waveform detected by the waveform detector 353 may reflect a part of the waveform of the main pulse laser beam 31. The detected waveform may then be inputted to the EUV light generation controller 5A. Here, the waveform detector 353 may be configured to detect a change over time in energy of the main pulse laser beam 31, and may be substituted by any suitable energy sensor as long as a value reflecting a waveform of the main pulse laser beam 31 can be obtained.

The EUV light generation controller 5A may include an EUV light generation position controller 51, a reference clock generator 52, a target controller 53, a target generation driver 54, a delay circuit 55, and a pedestal controller 56. The EUV light generation position controller 51 may be connected to each of the reference clock generator 52, the target controller 53, the pedestal controller 56, and an exposure apparatus controller 61. The EUV light generation position controller 51 may further be connected to each of the main pulse laser apparatus 3A and the pre-pulse laser apparatus 40 through the delay circuit 55. The target controller 53 may be connected to each of the target sensor 4 and the target generation driver 54. The target generation driver 54 may be connected to the target generator 26. The pedestal controller 56 may be connected to the pedestal control device 320 of the main pulse laser apparatus 3A and to the energy sensor 90.

The interior of the chamber 2A may be divided into upstream and downstream spaces by a partition 80. The plasma generation region 25 may be set in the downstream space. The partition 80 may serve to reduce the amount of debris of the target material generated in the downstream space which enters the upstream space. The partition 80 may have a through-hole formed therein, through which the main pulse laser beam 31 and the pre-pulse laser beam 41 may travel toward the plasma generation region 25. The partition 80 may be positioned such that the through-hole in the partition 80 is aligned with the through-hole 24 in the EUV collector mirror 23. The EUV collector mirror 23 may be fixed to the partition 80 through a holder 23a.

3.2 Operation

An operation of the EUV light generation system 11A shown in FIG. 2 will now be described. The EUV light generation system 11A may be configured to operate under the control of the EUV light generation controller 5A. The EUV light generation controller 5A may receive a request from the exposure apparatus controller 61 regarding a position at which the light 251 is to be generated or the plasma generation region 25. The EUV light generation controller 5A may then control each component so that the light 251 is generated in an EUV light generation request position indicated by the request from the exposure apparatus controller 61. Alternatively, the EUV light generation controller 5A may control each component so that the EUV light generation request position indicated by the request from the exposure apparatus controller 61 coincides with the plasma generation region 25.

The EUV light generation position controller 51 may be configured to control the laser beam focusing optical system 22A. The EUV light generation position controller 51 may send driving signals respectively to the mirror holder 72a and the plate moving device 74. The mirror holder 72a may control a tilt angle of the high-reflection mirror 72 in θx- and θy-directions in accordance with a driving signal from the EUV light generation position controller 51. The plate moving device 74 may move the moving plate 73 in the Z-direction in accordance with a driving signal from the EUV light generation position controller 51.

The EUV light generation controller 5A may receive an EUV light generation request signal from the exposure apparatus controller 61 requesting generation of the EUV light 252. Upon receiving the EUV light generation request signal, the EUV light generation controller 5A may input an EUV light generation request signal to the target controller 53. Upon receiving the EUV light generation request signal, the target controller 53 may send an output signal of a target 27 to the target generator 26.

The target sensor 4 may be configured to detect a position and a timing at which the target 27 reaches the plasma generation region 25. Detection results may be inputted to the target controller 53. The target controller 53 may control the two-axis moving device (not separately shown) of the target generator 26 in accordance with the inputted detection results. Further, the target controller 53 may be configured to adjust a delay time in the delay circuit 55 in accordance with the inputted detection results. The main pulse laser apparatus 3A and the pre-pulse laser apparatus 40 may be configured to respectively output the main pulse laser beam 31 and the pre-pulse laser beam 41 at timings defined by the delay time set in the delay circuit 55.

A waveform of the main pulse laser beam 31 may be detected by the waveform detection unit 350. The waveform detection unit 350 may send a detected waveform to the pedestal controller 56. The pedestal controller 56 may carry out a feedback-control on the pedestal control device 320 of the main pulse laser apparatus 3A in accordance with the inputted waveform of the main pulse laser beam 31 under the control of the EUV light generation position controller 51.

Energy of the EUV light 252 detected by the energy sensor 90 may be inputted to the pedestal controller 56. The pedestal controller 56 may carry out a feedback-control on the pedestal control device 320 of the main pulse laser apparatus 3A in accordance with the inputted energy of the EUV light 252.

By controlling energy of a pedestal of the main pulse laser beam 31, energy conversion efficiency from the main pulse laser beam 31 to the EUV light 252 may be improved.

Figure 3:
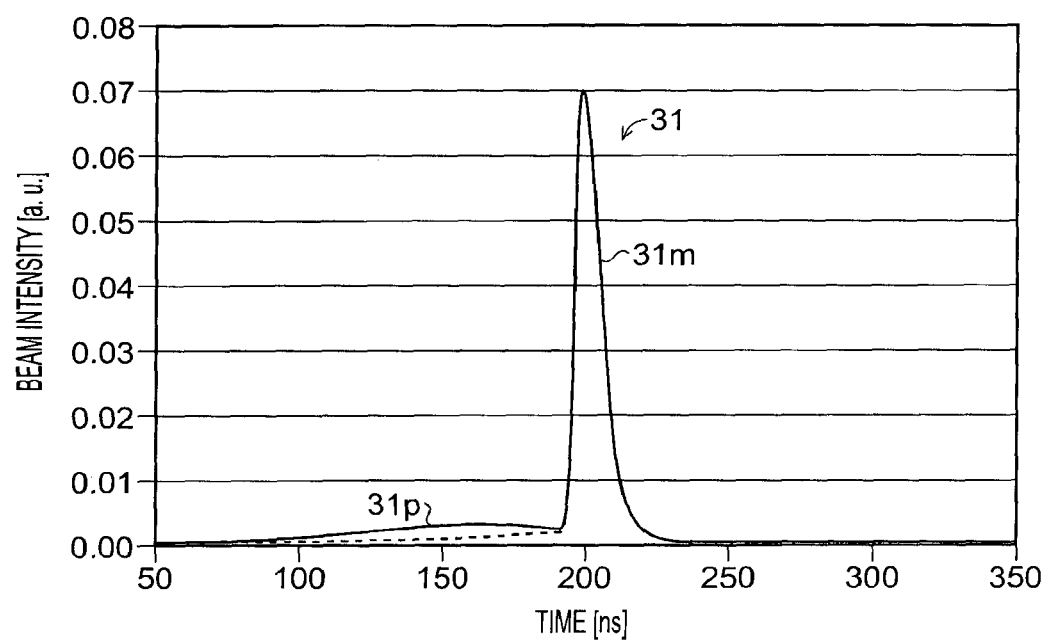
FIG. 3 shows an example of a waveform of a main pulse laser beam having a pedestal according to the first embodiment.
Figure 4:
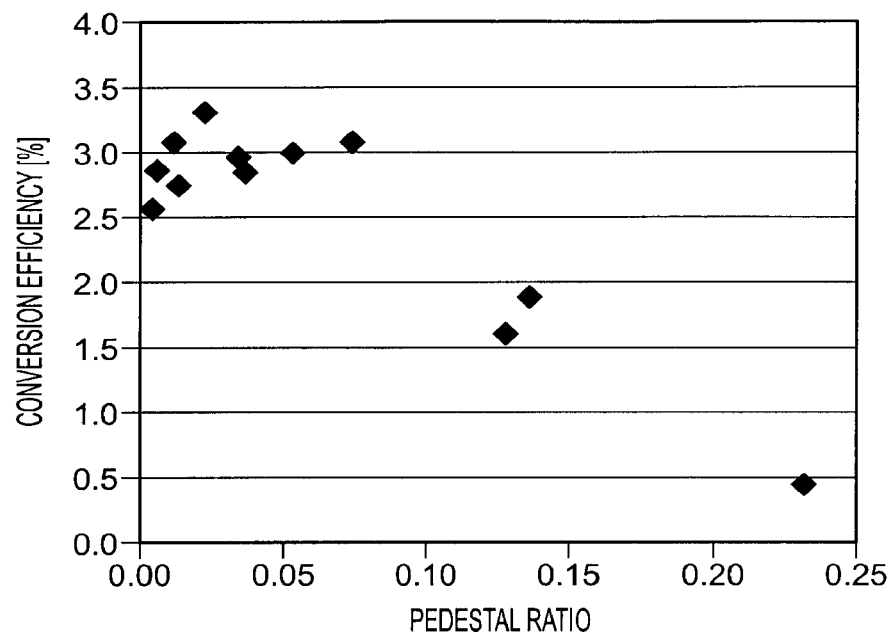
FIG. 4 shows an example of a relationship between a pedestal ratio and conversion efficiency according to the first embodiment.
Figure 5:
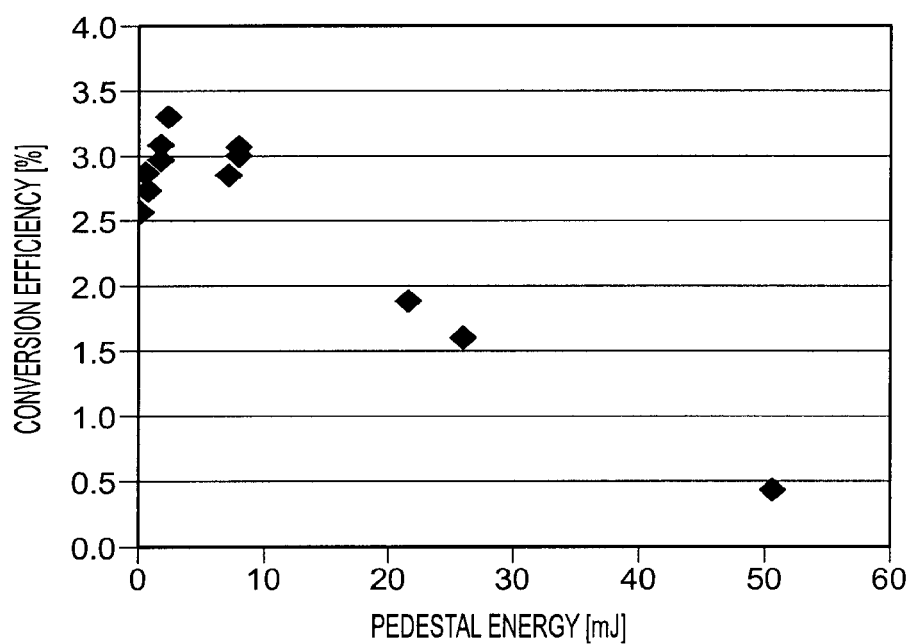
FIG. 5 shows an example of a relationship between pedestal energy and conversion efficiency according to the first embodiment.

3.3 Relationship Between Pedestal of Main Pulse Laser Beam and Conversion Efficiency Here, a relationship between a pedestal of a main pulse laser beam and conversion efficiency will be discussed in detail with reference to the drawings. Conversion efficiency is a ratio of energy of emitted EUV light to energy of a pulse laser beam in an LPP type EUV light generation apparatus. FIG. 3 shows an example of a waveform of a main pulse laser beam having a pedestal. FIG. 4 shows an example of a relationship between a pedestal ratio and conversion efficiency. FIG. 5 shows an example of a relationship between pedestal energy and conversion efficiency. Here, a pedestal ratio is a ratio of energy of a pedestal to total energy of a main pulse laser beam.

As shown in FIG. 3, a waveform of the main pulse laser beam 31 may include a pedestal 31p and a peak portion 31m. The pedestal 31p may, for example, rise gradually, and the peak portion 31m may rise in approximately 100 ns after the rise of the pedestal 31p. Beam intensity of the pedestal 31p may be sufficiently small with respect to beam intensity of the peak portion 31m.

As shown in FIG. 4, where a pedestal ratio is in a range of 1% to 10%, relatively high conversion efficiency of approximately 2.7% to 3.3% is obtained. By varying a pedestal ratio, conversion efficiency may vary. That is, by controlling a pedestal ratio, energy of emitted EUV light may be controlled.

As shown in FIG. 5, where energy of a pedestal is in a range of 1 mJ to 10 mJ, relatively high conversion efficiency of approximately 2.7% to 3.3% is obtained. By varying energy of a pedestal, conversion efficiency may vary. That is, by controlling energy of a pedestal, energy of emitted EUV light may be controlled.

3.4 Flowcharts

An operation of the EUV light generation system 11A according to the first embodiment will now be described in detail with reference to the drawings.

3.4.1 Pedestal Control Flow

Figure 6:
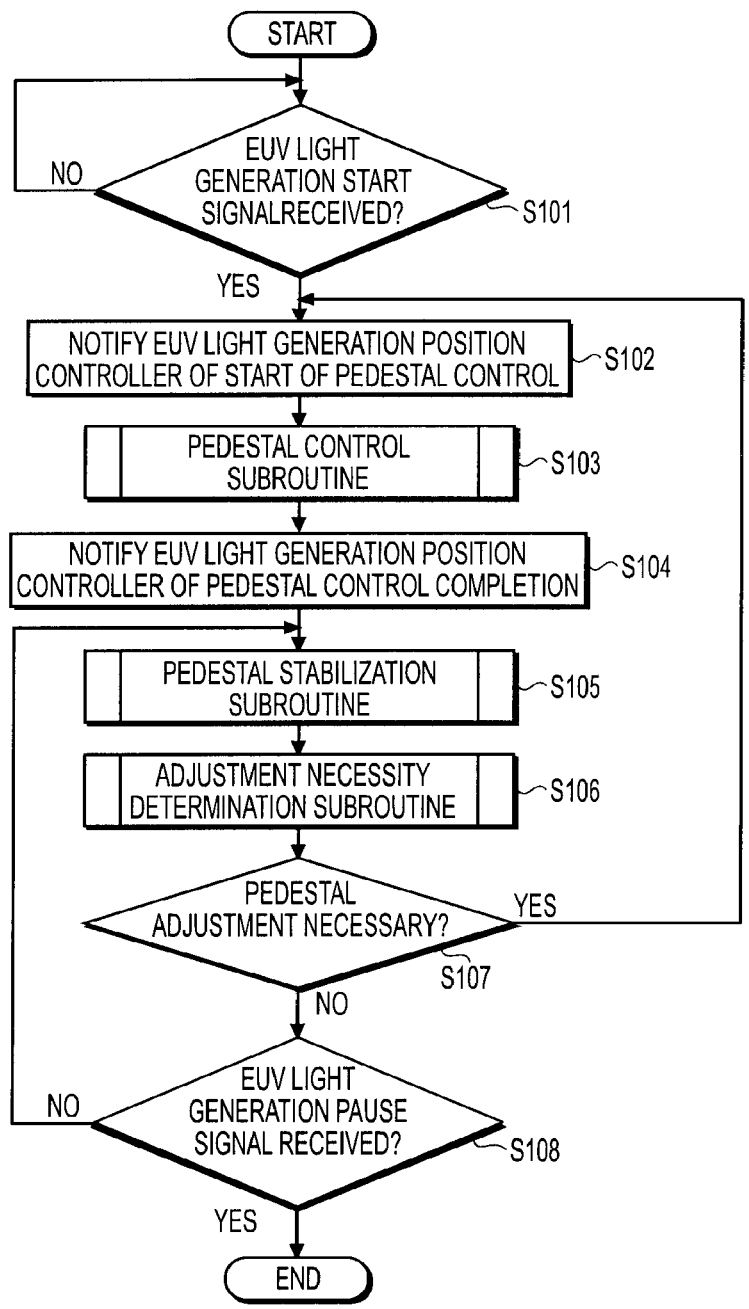
FIG. 6 is a flowchart showing an example of an overall operation of a pedestal controller according to the first embodiment.

FIG. 6 is a flowchart showing an example of an overall operation of the pedestal controller according to the first embodiment.

As shown in FIG. 6, the pedestal controller 56 may stand by until it receives an EUV light generation start signal from the EUV light generation position controller 51 (Step S101; NO). Upon receiving an EUV light generation start signal (Step S101; YES), the pedestal controller 56 may notify the EUV light generation position controller 51 of a start of pedestal control (Step S102). Then, the pedestal controller 56 may carry out a pedestal control subroutine to control the pedestal control device 320 so that a pedestal ratio or energy of a pedestal of the main pulse laser beam 31 is brought to a desired pedestal ratio or energy (Step S103).

When the control of the pedestal control device 320 is completed, the pedestal controller 56 may notify the EUV light generation position controller 51 of the completion (Step S104). Then, the pedestal controller 56 may carry out a pedestal stabilization subroutine to stabilize a pedestal of the main pulse laser beam 31 (Step S105). Here, the main pulse laser beam 31 may be outputted at a predetermined repetition rate.

Thereafter, the pedestal controller 56 may carry out an adjustment necessity determination subroutine to determine whether or not the pedestal needs to be adjusted (Step S106). Subsequently, the pedestal controller 56 may determine whether or not the pedestal needs to be adjusted based on a result of the adjustment necessity determination subroutine (Step S107). When the adjustment of the pedestal is needed (Step S107; YES), the pedestal controller 56 may return to Step S102 and repeat the subsequent steps. On the other hand, when the adjustment of the pedestal is not needed (Step S107; NO), the pedestal controller 56 may then determine whether or not an EUV light generation pause signal has been received (Step S108). When an EUV light generation pause signal has been received (Step S108; YES), the pedestal controller 56 may terminate the operation. On the other hand, when an EUV light generation pause signal has not been received (Step S108; NO), the pedestal controller 56 may return to Step S105 and repeat the subsequent steps.

With the above-described operation, the main pulse laser beam 31 having a pedestal of a desired pedestal ratio or energy may be outputted stably from the main pulse laser apparatus 3A.

3.4.1.1 Control Flow Based on Pedestal Ratio

Each of the subroutines in the pedestal control flow shown in FIG. 6 may be carried out using a pedestal ratio (see FIG. 4) as a parameter or using pedestal energy (see FIG. 5) as a parameter. Subroutines that are carried out using a pedestal ratio as a parameter will first be discussed in detail with reference to the drawings.

3.4.1.1.1 Pedestal Control Subroutine

Figure 7:
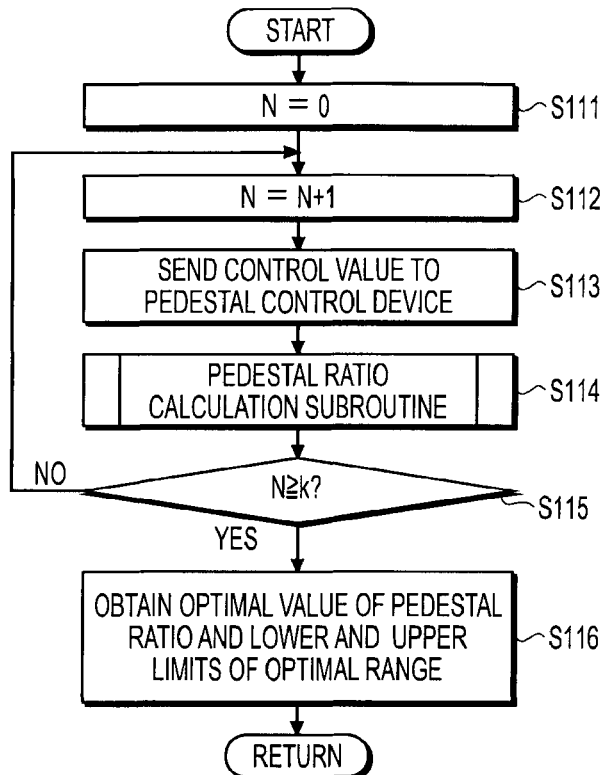
FIG. 7 shows an example of a pedestal control subroutine in Step S103 of FIG. 6.
Figure 8:
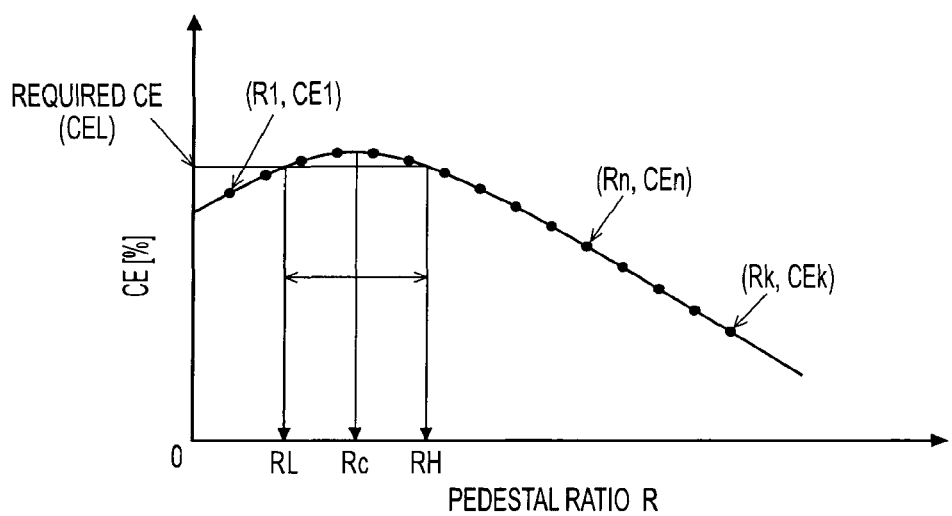
FIG. 8 shows an example of a relationship between a pedestal ratio and conversion efficiency used in the description of the pedestal control subroutine shown FIG. 7.

FIG. 7 shows an example of a pedestal control subroutine in Step S103 of FIG. 6. FIG. 8 shows an example of a relationship between a pedestal ratio and conversion efficiency used in the description of the pedestal control subroutine shown in FIG. 7.

With reference to FIG. 7, in the pedestal control subroutine, the pedestal controller 56 may first set "0" in a variable N (Step S111). Then, the pedestal controller 56 may increment the variable N by 1 (N=N+1) (Step S112).

Then, the pedestal controller 56 may send a control value P to the pedestal control device 320 (Step S113). As described in further detail later, the control value P may, for example, include a value of a voltage to be applied to a Pockels cell, a value indicating a timing at which the aforementioned voltage is applied. When the pedestal control subroutine is carried out for the first time, the smallest or largest control value P=P may be sent as an initial control value to the pedestal control device 320. Thereafter, a control value P=P+(N−1)·ΔPstp may be sent to the pedestal control device 320 for each preset change amount ΔPstp. The control value P may continue to be sent to the pedestal control device 320 until the control value P reaches an upper limit or an lower limit (P=P+(k−1)·ΔPstp) of its measurement range. Here, k may be a natural number and an upper limit of the number of measurement points, and k may be determined in advance through an experiment.

Subsequently, the pedestal controller 56 may carry out a pedestal ratio calculation subroutine to calculate a pedestal ratio R (Step S114). Here, a value of the variable N held when the pedestal ratio calculation subroutine is carried out may be used as a parameter in the pedestal ratio calculation subroutine.

Then, the pedestal controller 56 may determine whether or not the variable N has reached or exceeded the preset upper limit k (Step S115). When the variable N is smaller than the upper limit k (Step S115; NO), the pedestal controller 56 may return to Step S112 and repeat the subsequent steps. On the other hand, when the variable N has reached or exceeded the upper limit k (Step S115; YES), the pedestal controller 56 may obtain a lower limit RL and an upper limit RH of a range within which the pedestal ratio R satisfies required conversion efficiency (Step S116). At this time, a pedestal ratio Rc at which the maximum conversion efficiency CE is obtained may also be determined. Thereafter, the pedestal controller 56 may return to the operation shown in FIG. 6.

As Steps S112 through S115 shown in FIG. 7 are repeated, the k number of pedestal ratios R and the k number of conversion efficiency CE may be obtained. That is, values R1 through Rk and values CE1 through CEk may be obtained. Using these values, a relational curve between the pedestal ratio R and the conversion efficiency CE as shown in FIG. 8 may be obtained. In FIG. 8, a point (R1, CE1) indicates the lower limit of the measurement range, and a point (Rk, CEk) indicates the upper limit of the measurement range. As shown in FIG. 8, the conversion efficiency CE may have a peak between the lower limit and the upper limit of the measurement range of the pedestal ratio R. In that case, a pedestal ratio Rc corresponding to the peak in the conversion efficiency CE may be calculated. Further, when the smallest value CEL of the required conversion efficiency CE is set in advance, a range within which a value of the conversion efficiency CE exceeds the smallest value CEL may be set as a control range of the pedestal ratio R. From this control range, the lower limit RL and the upper limit RH of the control range of the pedestal ratio R may be calculated. The relational curve between the pedestal ratio R and the conversion efficiency CE may, for example, be an approximation curve calculated using the least-square approach.

3.4.1.1.2 Pedestal Control Subroutine: First Modification

Figure 9:
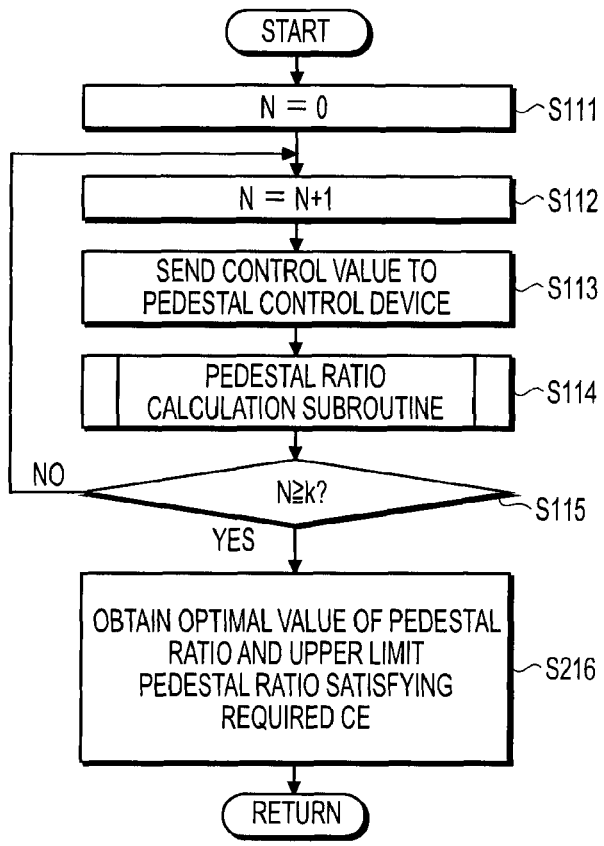
FIG. 9 shows a first modification of the pedestal control subroutine in Step S103 of FIG. 6.
Figure 10:
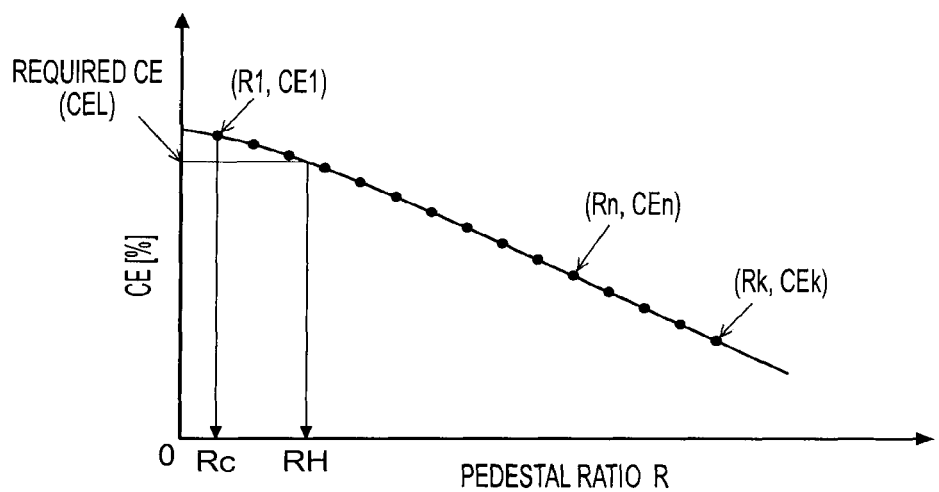
FIG. 10 shows an example of a relationship between a pedestal ratio and conversion efficiency used in the description of the pedestal control subroutine shown in FIG. 9.

The conversion efficiency CE may not have a peak within a measurement range of the pedestal ratio R. Thus, a pedestal control subroutine in a case where the conversion efficiency CE does not have a peak within the measurement range of the pedestal ratio R will now be discussed. FIG. 9 shows a first modification of the pedestal control subroutine in Step S103 of FIG. 6. FIG. 10 shows an example of a relationship between pedestal ratio and conversion efficiency used in the description of the pedestal control subroutine shown in FIG. 9.

As shown in FIG. 9, in the first modification of the pedestal control subroutine, Steps S111 through S115, which are similar to Steps S111 through S115 shown in FIG. 7, may be carried out. Detailed description thereof will be omitted here. Thereafter, the pedestal controller 56 may obtain the pedestal ratio Rc corresponding to the maximum value of the conversion efficiency CE within the measurement range. Further, the pedestal ratio R at a point where the conversion efficiency CE is at or above the minimum value CEL of the required conversion efficiency CE may be obtained to determine the upper limit RH in the control range (Step S216). Thereafter, the pedestal controller 56 may return to the operation shown in FIG. 6.

When the conversion efficiency CE does not have a peak in a measurement range of the pedestal ratio R, Steps S112 through S115 shown in FIG. 9 may be repeated, and the k number of pedestal ratios R and the k number of conversion efficiency CE may be obtained. That is, values R1 through Rk and values CE1 through CEk may be obtained. Using these values, a relational curve between the pedestal ratio R and the conversion efficiency CE as shown in FIG. 10 may be obtained. In FIG. 10, a point (R1, CE1) indicates the lower limit of the measurement range, and a point (Rk, CEk) indicates the upper limit of the measurement range. As shown in FIG. 10, the conversion efficiency CE may monotonically decrease from the lower limit to the upper limit of the measurement range of the pedestal ratio R. In that case, the conversion efficiency CE may be at the highest at the lower limit of the measurement range of the pedestal ratio R. Thus, the pedestal ratio R at the lower limit of the measurement range may be set as an optimal value Rc. Further, when the smallest value CEL of the required conversion efficiency CE is set in advance, a range from the lower limit of the measurement range to a point where a value of the conversion efficiency CE exceeds the smallest value CEL may be set as a control range of the pedestal ratio R. From this control range, the upper limit RH of the control range of the pedestal ratio R may be calculated. The relational curve between the pedestal ratio R and the conversion efficiency CE may, for example, be an approximation curve calculated using the least-square approach.

3.4.1.1.3 Pedestal Ratio Calculation Subroutine

Figure 11:
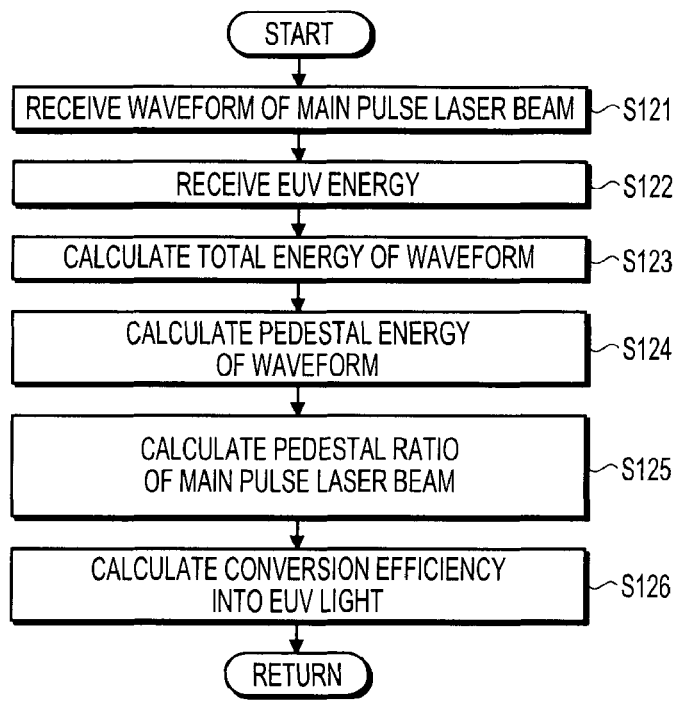
FIG. 11 shows an example of a pedestal ratio calculation subroutine in Step S114 of FIGS. 7 and 9.
Figure 12:
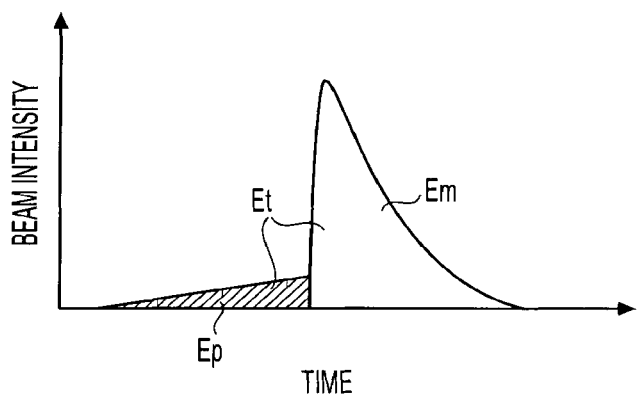
FIG. 12 shows an example of a relationship between total energy of a main pulse laser beam and energy of a pedestal of the main pulse laser beam used in the description of the pedestal ratio calculation subroutine shown FIG. 11.

FIG. 11 shows an example of a pedestal ratio calculation subroutine in Step S114 of FIGS. 7 and 9. FIG. 12 shows an example of a relationship between total energy of a main pulse laser beam and energy of a pedestal used in the description of the pedestal ratio calculation subroutine shown in FIG. 11.

As shown in FIG. 11, in the pedestal ratio calculation subroutine, the pedestal controller 56 may first receive a detected waveform of the main pulse laser beam 31 from the waveform detection unit 350 (Step S121). Then, the pedestal controller 56 may receive detected energy Eeuv of the EUV light 252 from the energy sensor 90 (Step S122).

Subsequently, the pedestal controller 56 may calculate total energy Et of a single pulse from the received waveform of the main pulse laser beam 31 (Step S123). As shown in FIG. 12, the energy Et may be an integrated value of energy Ep of a pedestal and energy Em of a peak portion.

Then, the pedestal controller 56 may calculate the energy Ep of the pedestal (Step S124). The energy Ep may be calculated as energy of a portion preceding a rise of the peak portion. Alternatively, the energy Ep may be obtained by subtracting the energy Em of the peak portion from the total energy Et. The rise of the peak portion may be determined based on whether or not the beam intensity has exceeded a predetermined threshold value.

Thereafter, the pedestal controller 56 may calculate a pedestal energy ratio Rn, where Rn=Ep/Et, with respect to the total energy Et of the main pulse laser beam 31 (Step S125). Here, a value of the variable N held when the processing has moved to the pedestal ratio calculation subroutine may be used as a parameter n. That is, n in the energy ratio Rn may be an ordinal number that is the same as the variable N. Subsequently, the pedestal controller 56 may calculate conversion efficiency CEn from the main pulse laser beam 31 to the EUV light 252 based on the aforementioned energy Eeuv of the EUV light 252 and the calculated energy Em of the peak portion (Step S126). Here, n in the conversion efficiency CEn may be an ordinal number that is the same as the variable N. Thereafter, the pedestal controller 56 may return to the pedestal control subroutine shown in FIG. 7 or 9.

3.4.1.1.4 Pedestal Stabilization Subroutine

Figure 13:
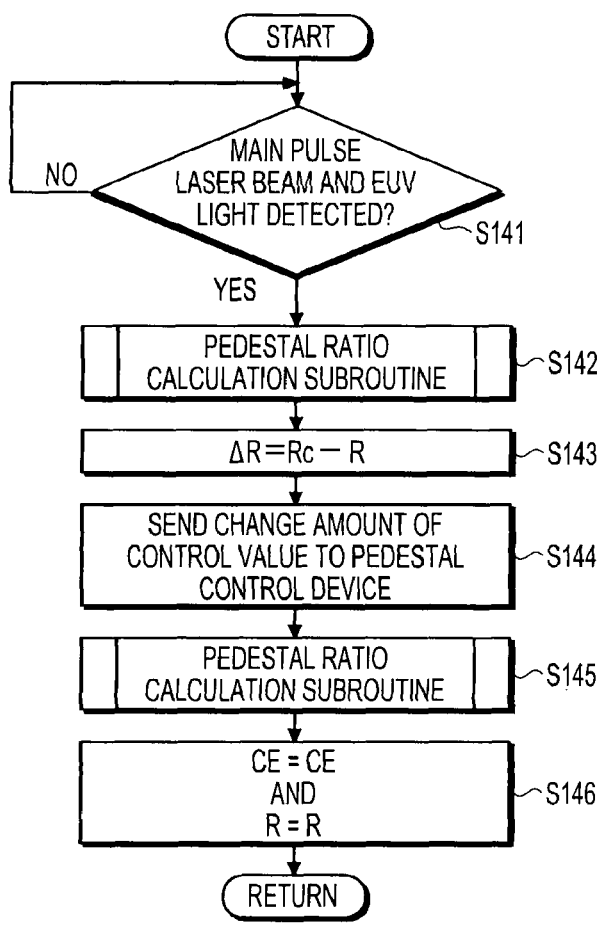
FIG. 13 shows an example of a pedestal stabilization subroutine in Step S105 of FIG. 6.

In a pedestal stabilization subroutine, the pedestal ratio R may be adjusted accordingly so that the pedestal ratio R approaches the pedestal ratio Rc corresponding to the maximum value of the conversion efficiency CE. FIG. 13 shows an example of a pedestal stabilization subroutine in Step S105 of FIG. 6.

With reference to FIG. 13, in the pedestal stabilization subroutine, the pedestal controller 56 may stand by until the waveform of the main pulse laser beam 31 is detected by the waveform detection unit 350 and the energy of the EUV light 252 is detected by the energy sensor 90 (Step S141; NO). When the waveform of the main pulse laser beam 31 and the energy of the EUV light 252 are detected (Step S141; YES), the pedestal controller 56 may carry out a modification of a pedestal ratio calculation subroutine (Step S142). The modification of the pedestal ratio calculation subroutine may be similar to the pedestal ratio calculation subroutine described with reference to FIG. 11.

Then, the pedestal controller 56 may calculate a difference ΔR, where ΔR=Rc−R, between the pedestal ratio Rc corresponding to the maximum value of the conversion efficiency CE and the pedestal ratio R obtained in the pedestal ratio calculation subroutine (Step S143). Subsequently, the pedestal controller 56 may send a change amount ΔP of the control value to the pedestal control device 320 so that the difference ΔR decreases (Step S144). The change amount ΔP may be a preset change amount ΔPstp or a value calculated in accordance with the difference ΔR.

Then, the pedestal controller 56 may again carry out the modification of the pedestal ratio calculation subroutine (Step S145). Subsequently, the pedestal controller 56 may overwrite the current conversion efficiency CE with the conversion efficiency CE calculated in the modification of the pedestal ratio calculation subroutine (CE=CE). Similarly, the current pedestal ratio R may be overwritten with a newly calculated pedestal ratio R (R=R) (Step S146). The respective values CE and R may, for example, be used in the adjustment necessity determination subroutine in Step S106 of FIG. 6. Thereafter, the pedestal controller 56 may return to the operation shown in FIG. 6.

3.4.1.1.5 Pedestal Ratio Calculation Subroutine: Modification

Figure 14:
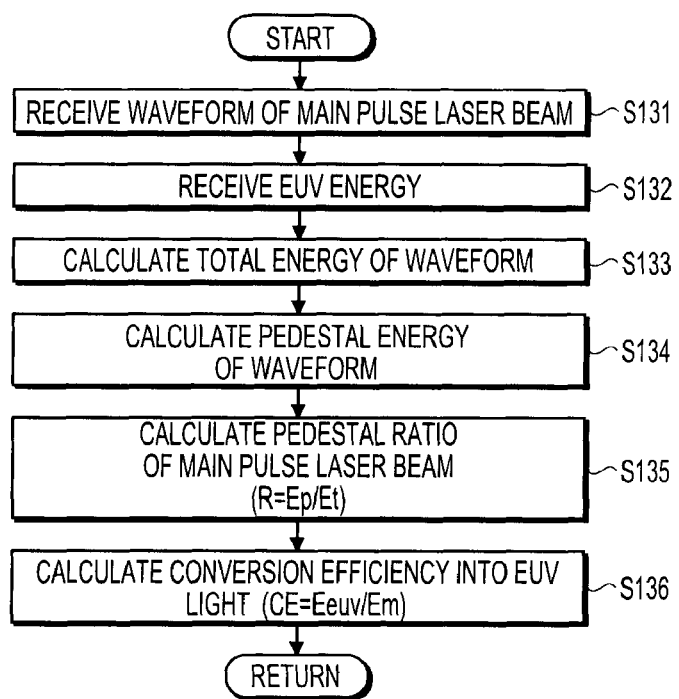
FIG. 14 shows a modification of a pedestal ratio calculation subroutine in Steps S142 and S145 of FIG. 13.

FIG. 14 shows the modification of the pedestal ratio calculation subroutine. The modification of the pedestal ratio calculation subroutine may be used in the pedestal stabilization subroutine described with reference to FIG. 13.

With reference to FIG. 14, the modification of the pedestal ratio calculation subroutine may be similar to the pedestal ratio calculation subroutine shown in FIG. 11. For simplifying the description, only the operation that differs from that shown in FIG. 11 will be described below.

In the modification of the pedestal ratio calculation subroutine, in Steps S135 and S136, the variable N may not be referenced. That is, the energy ratio R and the conversion efficiency CE at the time of carrying out the modification of pedestal ratio calculation subroutine may be calculated. Thereafter, the pedestal controller 56 may return to the pedestal control subroutine shown in FIG. 13.

3.4.1.1.6 Adjustment Necessity Determination Subroutine

Figure 15:
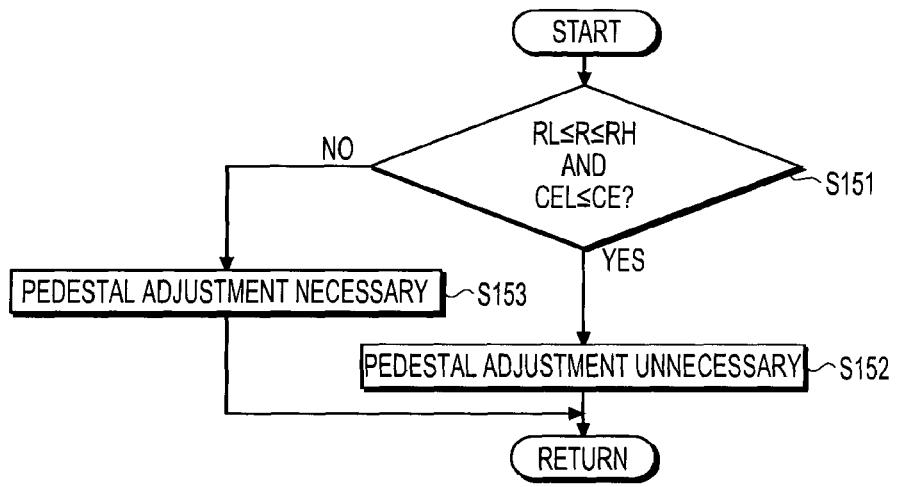
FIG. 15 shows an example of an adjustment necessity determination subroutine in Step S106 of FIG. 6.

FIG. 15 shows an example of an adjustment necessity determination subroutine in Step S106 of FIG. 6.

With reference to FIG. 15, in the adjustment necessity determination subroutine, the pedestal controller 56 may determine whether or not a value set in the pedestal ratio R falls within a range from the lower limit RL inclusive to the upper limit RH inclusive and whether or not a value set in the conversion efficiency CE is equal to or higher than the minimum value CEL (Step S151). When the pedestal ratio R falls within a range from the lower limit RL inclusive to the upper limit RH inclusive and the conversion efficiency CE is equal to or higher than the minimum value CEL (Step S151; YES), the pedestal controller 56 may determine that the pedestal does not need adjusting (Step S152). Thereafter, the pedestal controller 56 may return to the operation shown in FIG. 6. On the other hand, when the pedestal ratio R does not fall within a range from the lower limit RL inclusive to the upper limit RH inclusive or the conversion efficiency CE is smaller than the minimum value CEL (Step S151; NO), the pedestal controller 56 may determine that the pedestal need adjusting (Step S153). Thereafter, the pedestal controller 56 may return to the operation shown in FIG. 6.

3.4.1.1.7 Adjustment Necessity Determination Subroutine: First Modification

Figure 16:
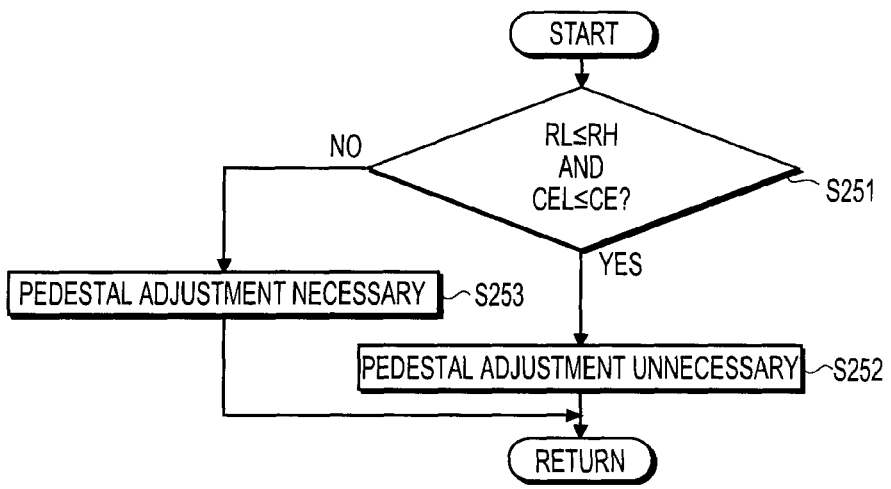
FIG. 16 shows a first modification of the adjustment necessity determination subroutine in Step S106 of FIG. 6.

When the conversion efficiency CE does not have a peak within a measurement range of the pedestal ratio R, a modification of the adjustment necessity determination subroutine as described below may be carried out. FIG. 16 shows a first modification of the adjustment necessity determination subroutine in Step S106 of FIG. 6.

With reference to FIG. 16, in the first modification of the adjustment necessity determination subroutine, the pedestal controller 56 may determine whether or not a value set in the pedestal ratio R is equal to or lower than the upper limit RH and whether or not a value set in the conversion efficiency CE is equal to or higher than the minimum value CEL (Step S251). When the pedestal ratio R is equal to or lower than the upper limit RH and the conversion efficiency CE is equal to or higher than the minimum value CEL (Step S251; YES), the pedestal controller 56 may determine that the pedestal need not adjusting (Step S252). Thereafter, the pedestal controller 56 may return to the operation shown in FIG. 6. On the other hand, when the pedestal ratio R exceeds the upper limit RH or the conversion efficiency falls below the minimum value CEL (Step S251; NO), the pedestal controller 56 may determine that the pedestal needs adjusting (Step S253). Thereafter, the pedestal controller 56 may return to the operation shown in FIG. 6.

3.4.1.2 Control Flow Based on Pedestal Energy

A subroutine where pedestal energy Ep is used as a parameter will now be described in detail with reference to the drawings.

3.4.1.2.1 Pedestal Control Subroutine: Second Modification

Figure 17:
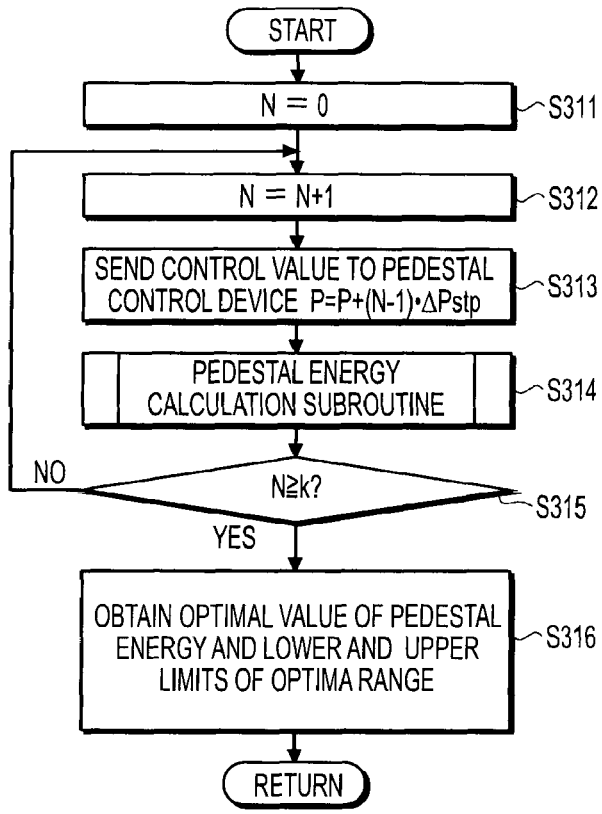
FIG. 17 shows a second modification of the pedestal control subroutine in Step S103 of FIG. 6.
Figure 18:
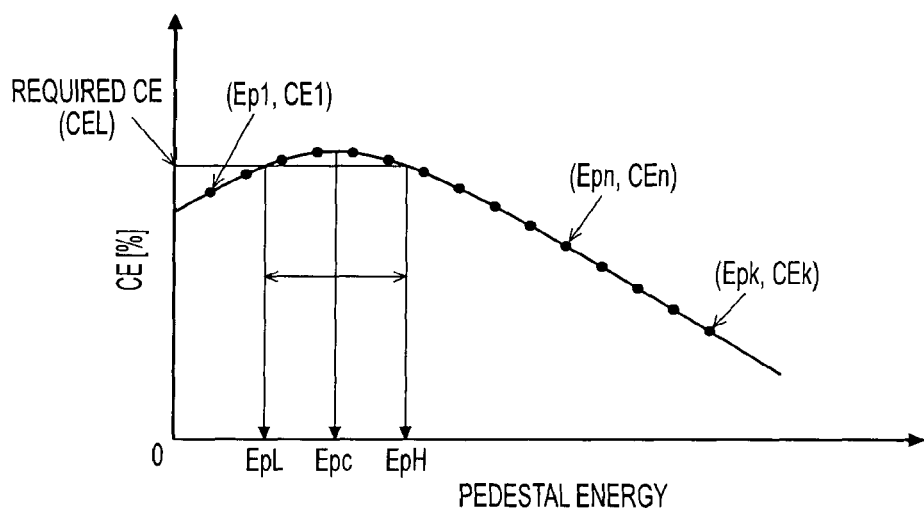
FIG. 18 shows an example of a relationship between pedestal energy and conversion efficiency used in the description of the pedestal control subroutine shown in FIG. 17.

FIG. 17 shows a second modification of the pedestal control subroutine in Step S103 of FIG. 6. FIG. 18 shows an example of a relationship between pedestal energy and conversion efficiency used in the description of the pedestal control subroutine shown in FIG. 17.

As shown in FIG. 17, in the second modification of the pedestal control subroutine, in which the pedestal energy Ep is used as a parameter, an operation similar to the pedestal control subroutine shown in FIG. 7 may be carried out. Steps S311 through S315 of FIG. 17 may correspond to Steps S111 through S115 of FIG. 7, and detailed description of Steps S311 through S315 will be omitted here. However, in Step S314, the pedestal controller 56 may carry out a pedestal energy calculation subroutine, which will be described later, to calculate the pedestal energy Ep.

As Steps S312 through S315 of FIG. 17 are repeated, a relational curve between the pedestal energy Ep and the conversion efficiency CE as shown in FIG. 18 may be obtained. In FIG. 18, a point (Ep1, CE1) indicates the lower limit of the measurement range, and a point (Epk, CEk) indicates the upper limit of the measurement range. As shown in FIG. 18, the conversion efficiency CE may have a peak between the lower limit and the upper limit of the measurement range of the pedestal energy Ep. In that case, pedestal energy Epc corresponding to the peak of the conversion efficiency CE may be calculated. When the smallest value CEL of the required conversion efficiency CE is set in advance, a range within which a value of the conversion efficiency CE exceeds the smallest value CEL may be set as a control range of the pedestal energy Ep. From this control range, the lower limit EpL and the upper limit EpH of the control range of the pedestal energy Ep may be calculated. The relational curve between the pedestal energy Ep and the conversion efficiency CE may, for example, be an approximation curve calculated using the least-square approach.

3.4.1.2.2 Pedestal Control Subroutine: Third Modification

Figure 19:
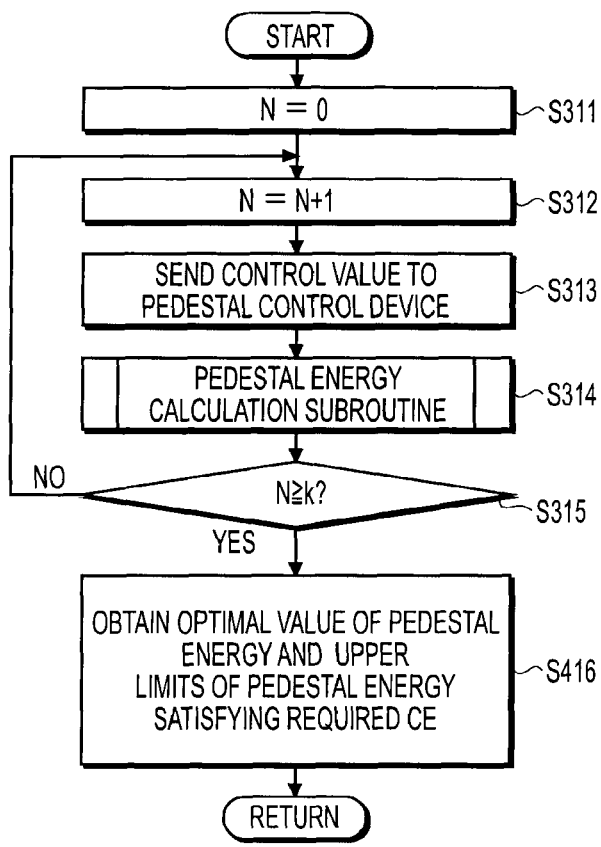
FIG. 19 shows a third modification of the pedestal control subroutine in Step S103 of FIG. 6.
Figure 20:
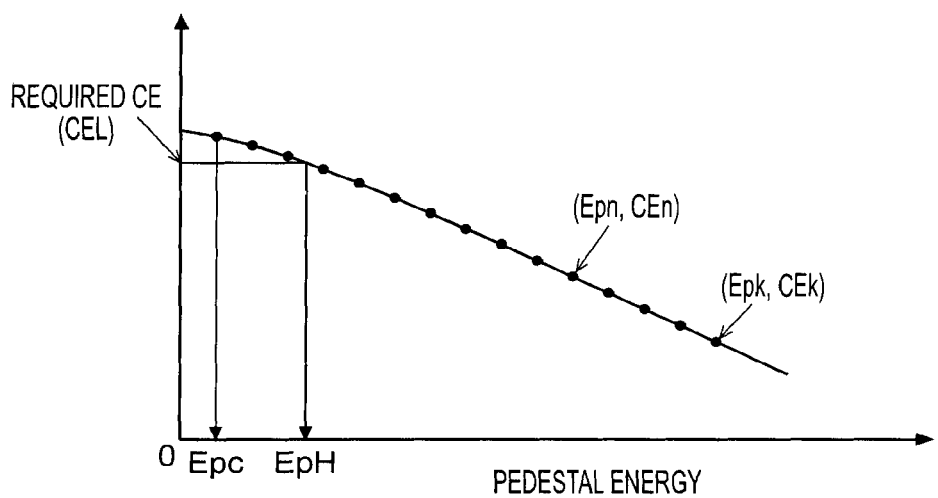
FIG. 20 shows an example of a relationship between pedestal energy and conversion efficiency used in the description of the pedestal control subroutine shown in FIG. 19.

The conversion efficiency CE may not have a peak within a measurement range of the pedestal energy Ep. Thus, a pedestal control subroutine in a case where the conversion efficiency CE does not have a peak within the measurement range of the pedestal energy Ep will be discussed below. FIG. 19 shows a third modification of the pedestal control subroutine in Step S103 of FIG. 6. FIG. 20 shows an example of a relationship between pedestal energy and conversion efficiency used in the description of the pedestal control subroutine shown in FIG. 19.

With reference to FIG. 19, in a third modification of the pedestal control subroutine, in which the pedestal energy Ep is used as a parameter, Steps S311 through S315, which are similar to Steps S311 through S315 shown in FIG. 17, may be carried out. Then, the pedestal controller 56 may obtain the pedestal energy Epc corresponding to the maximum value of the conversion efficiency CE within the measurement range. Further, the pedestal controller 56 may obtain an upper limit EpH of the pedestal energy Ep at which the required conversion efficiency CE is equal to or higher than the minimum value CEL (Step S416). Thereafter, the pedestal controller 56 may return to the operation shown in FIG. 6.

When the conversion efficiency CE does not have a peak within a measurement range of the pedestal energy Ep, by repeating Steps S312 through S315 of FIG. 19, a relational curve between the pedestal energy Ep and the conversion efficiency CE as shown in FIG. 20 may be obtained. In FIG. 20, a point (Ep1, CE1) indicates the lower limit of the measurement range, and a point (Epk, CEk) indicates the upper limit of the measurement range. As shown in FIG. 20, the conversion efficiency CE may monotonically decrease from the lower limit to the upper limit of the measurement range of the pedestal energy Ep. In that case, the conversion efficiency CE may be highest at the lower limit of the measurement range of the pedestal energy Ep. Thus, the pedestal energy Ep at the lower limit of the measurement range may be set as an optimal value Epc. When the smallest value CEL of the required conversion efficiency CE is set in advance, a range from the lower limit of the measurement range to a point where the value of the conversion efficiency CE exceeds the smallest value CEL may be set as a control range of the pedestal energy Ep. From this control range, the upper limit EpH of the control range of the pedestal energy Ep may be calculated. The relational curve between the pedestal energy Ep and the conversion efficiency CE may, for example, be an approximation curve calculated using the least-square approach.

3.4.1.2.3 Pedestal Energy Calculation Subroutine

Figure 21:
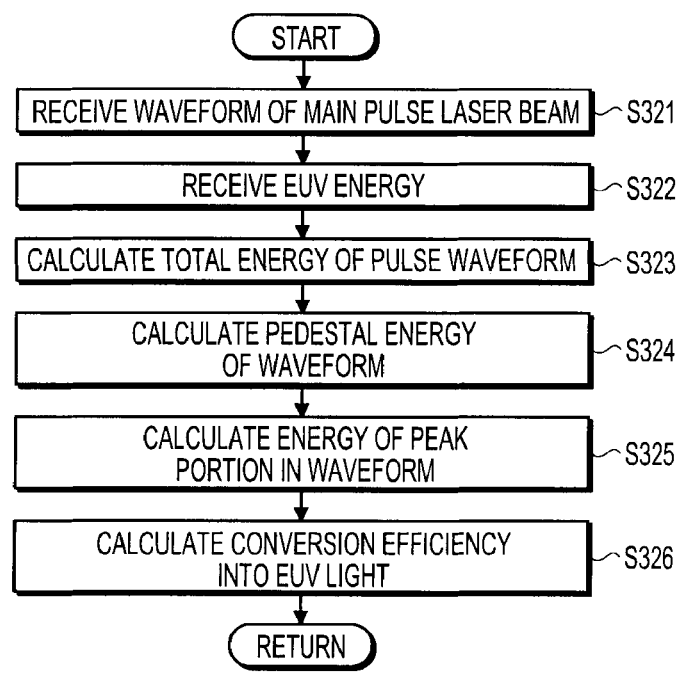
FIG. 21 shows an example of a pedestal energy calculation subroutine in Step S314 of FIGS. 17 and 19.

FIG. 21 shows an example of a pedestal energy calculation subroutine in Step S314 of FIGS. 17 and 19. Here, a relationship between the total energy of main pulse laser beam and the energy of the pedestal may, for example, be the same as that shown in FIG. 12.

With reference to FIG. 21, the pedestal energy calculation subroutine of the embodiment shown in FIG. 21 may include steps that are similar to those in the pedestal ratio calculation subroutine shown in FIG. 11. Thus, only the operations of the pedestal energy calculation subroutine of FIG. 21 that differ from those in the pedestal ratio calculation subroutine shown in FIG. 11 will be discussed below. Steps S321 through S323 correspond to Steps S121 through S123 in FIG. 11, and the description thereof will be omitted here. In Step S324, the pedestal controller 56 may calculate pedestal energy Epn of the main pulse laser beam 31. Here, a value of the variable N held when the processing has moved from the pedestal control subroutine may be used as a parameter n. That is, n in the pedestal energy Epn may be an ordinal number that is the same as the variable N.

In Step S325, the pedestal controller 56 may calculate energy Em of the peak portion in the waveform of the main pulse laser beam 31. The energy Em may be energy of a portion of the waveform corresponding to a preset duration after the rise of the peak portion. Alternatively, the energy Em may be obtained by subtracting the pedestal energy Epn from the total energy Et of the main pulse laser beam 31. The rise of the peak portion may be determined based on whether or not the beam intensity has exceeded a predetermined threshold value.

Step S326 may be similar to Step S126 shown in FIG. 11. Thereafter, the pedestal controller 56 may return to the pedestal control subroutine shown in FIG. 17 or 19.

3.4.1.2.4 Pedestal Stabilization Subroutine: Modification

Figure 22:
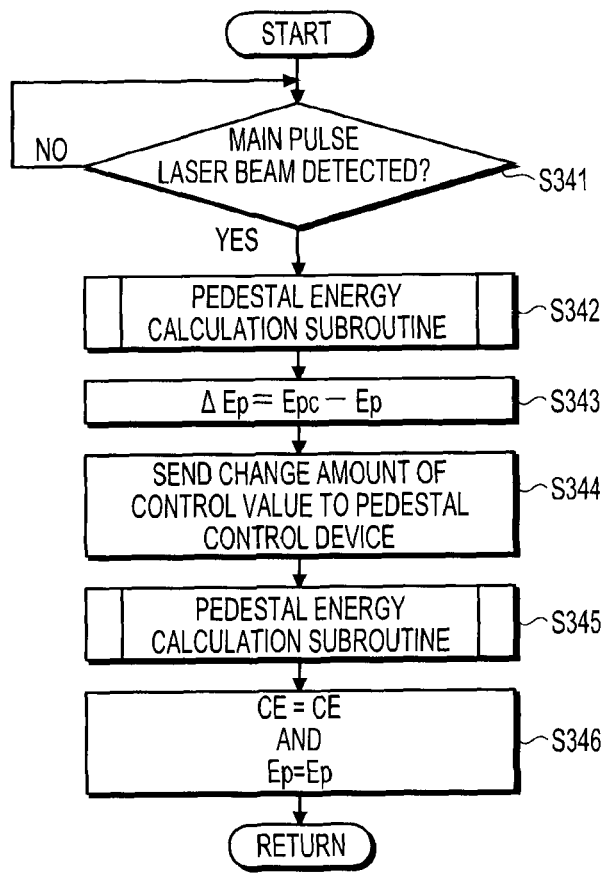
FIG. 22 shows a modification of the pedestal stabilization subroutine in Step S105 of FIG. 6.

In a modification of the pedestal stabilization subroutine, the pedestal energy Ep may be adjusted accordingly so that the pedestal energy Ep approaches the optimal value Epc. FIG. 22 shows the modification of the pedestal stabilization subroutine in Step S105 of FIG. 6.

With reference to FIG. 22, the modification of the pedestal stabilization subroutine of the embodiment shown in FIG. 21, in which the pedestal energy Ep is used as a parameter, may include steps that are similar to those in the pedestal stabilization subroutine shown in FIG. 13. Thus, only the operations of the modification of the pedestal stabilization subroutine of FIG. 21 that differ from those in the pedestal stabilization subroutine shown in FIG. 13 will be discussed below. Steps S341 and 342 may be similar to Steps S141 and S142 of FIG. 13. However, in Step 342, a modification of the pedestal energy calculation subroutine described with reference to FIG. 23 may be carried out.

In Step S343, the pedestal controller 56 may calculate a difference $\Delta Ep$, where $\Delta Ep = Epc - Ep$, the difference between the pedestal energy Epc corresponding to the maximum value of the conversion efficiency CE and the pedestal energy Ep obtained in the modification of the pedestal energy calculation subroutine. Subsequently, the pedestal controller 56 may send a change amount $\Delta P$ of the control value P to the pedestal control device 320 so that the difference $\Delta Ep$ decreases (Step S344). The change amount $\Delta P$ may be a preset change amount $\Delta Pstp$ or a value calculated in accordance with the difference $\Delta Ep$.

Then, the pedestal controller 56 may again carry out the modification of the pedestal energy calculation subroutine (Step S345). Thereafter, the pedestal controller 56 may overwrite the current conversion efficiency CE with the conversion efficiency CE calculated in the modification of the pedestal energy calculation subroutine (CE=CE). Similarly, the current energy Ep may be overwritten with newly calculated energy Ep (Ep=Ep) (Step S346). The respective values CE and Ep may, for example, be used in the adjustment necessity determination subroutine in Step S106 of FIG. 6. Thereafter, the pedestal controller 56 may return to the operation shown in FIG. 6.

3.4.1.2.5 Pedestal Energy Calculation Subroutine: Modification

Figure 23:
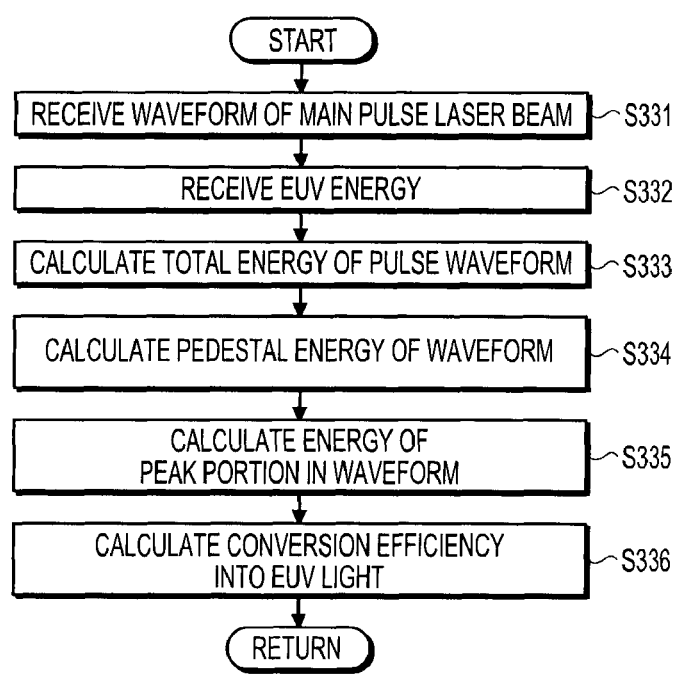
FIG. 23 shows a modification of a pedestal energy calculation subroutine in Steps S342 and S345 of FIG. 22.

FIG. 23 shows the modification of the pedestal energy calculation subroutine. The modification of the pedestal energy calculation subroutine may be used in the pedestal stabilization subroutine described with reference to FIG. 22.

With reference to FIG. 23, the modification of the pedestal energy calculation subroutine of the embodiment shown in FIG. 23 may include steps that are similar to those in the pedestal energy calculation subroutine shown in FIG. 21. As such, only the operations of the modification of the pedestal energy calculation subroutine of FIG. 23 that differ from those in the pedestal energy calculation subroutine shown in FIG. 21 will be discussed below.

In the modification of the pedestal energy calculation subroutine, in Steps S334 and S336, the variable N may not be referenced. That is, the pedestal energy Ep and the conversion efficiency CE at the time of carrying out the modification of the pedestal energy calculation subroutine may be calculated. Thereafter, the pedestal controller 56 may return to the pedestal control subroutine shown in FIG. 22.

3.4.1.2.6 Adjustment Necessity Determination Subroutine: Second Modification

Figure 24:
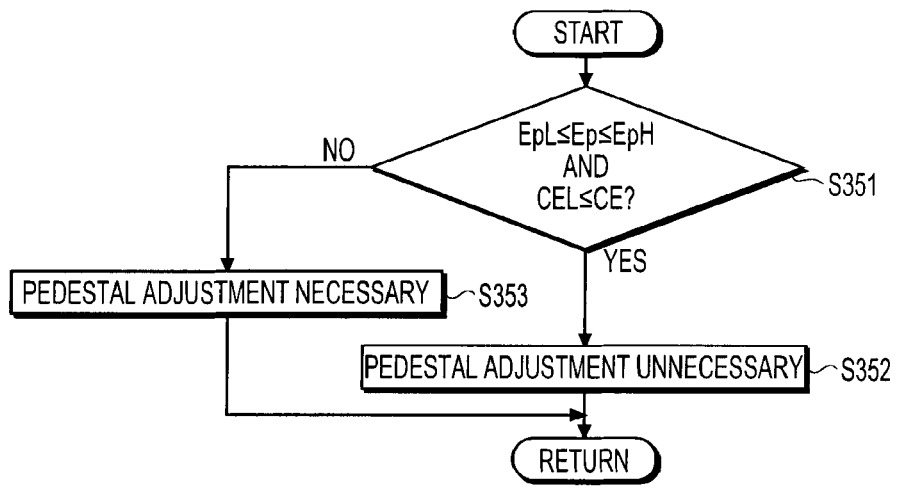
FIG. 24 shows a second modification of the adjustment necessity determination subroutine in Step S106 of FIG. 6.

FIG. 24 shows a second modification of the adjustment necessity determination subroutine in Step S106 of FIG. 6.

With reference to FIG. 24, in the second modification of the adjustment necessity determination subroutine, in which the pedestal energy Ep is used as a parameter, the pedestal controller 56 may determine whether or not a value set in the pedestal energy Ep falls within a range from the lower limit EpL inclusive to the upper limit EpH inclusive and whether or not a value set in the conversion efficiency CE is equal to or higher than the minimum value CEL (Step S351). When the pedestal energy Ep falls within a range from the lower limit EpL inclusive to the upper limit EpH inclusive and the conversion efficiency CE is equal to or higher than the minimum value CEL (Step S351; YES), the pedestal controller 56 may determine that the pedestal need not adjusting (Step S352). Thereafter, the pedestal controller 56 may return to the operation shown in FIG. 6. On the other hand, when the pedestal energy Ep does not fall within a range from the lower limit EpL inclusive to the upper limit EpH inclusive or the conversion efficiency CE is smaller than the minimum value CEL (Step S351; NO), the pedestal controller 56 may determine that the pedestal need adjusting (Step S353). Thereafter, the pedestal controller 56 may return to the operation shown in FIG. 6.

3.4.1.2.7 Adjustment Necessity Determination Subroutine: Third Modification

Figure 25:
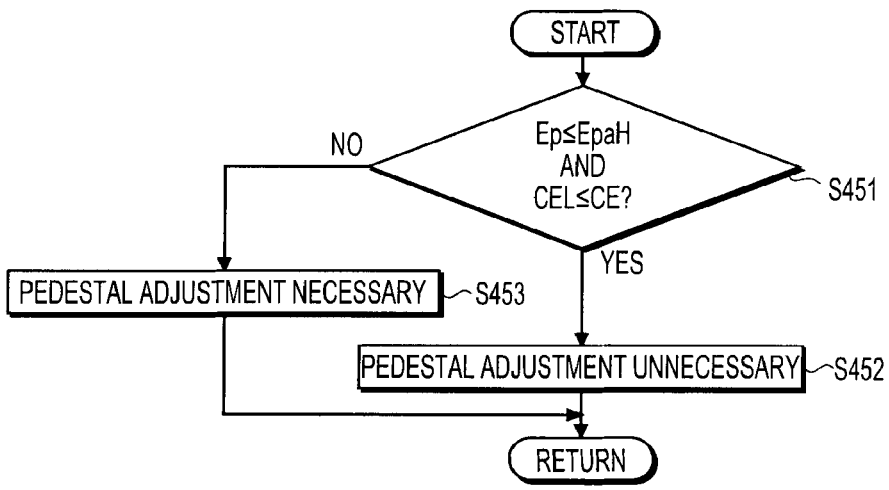
FIG. 25 shows a third modification of the adjustment necessity determination subroutine in Step S106 of FIG. 6.

When the conversion efficiency CE does not have a peak within a measurement range of the pedestal energy Ep, a third modification of the adjustment necessity determination subroutine described below may be carried out. FIG. 25 shows the third modification of the adjustment necessity determination subroutine in Step S106 of FIG. 6.

With reference to FIG. 25, in the third modification of the adjustment necessity determination subroutine, in which the pedestal energy Ep is used as a parameter, the pedestal controller 56 may determine whether or not a value set in the pedestal energy Ep is equal to or lower than the upper limit EpH and whether or not a value set in the conversion efficiency CE is equal to or higher than the minimum value CEL (Step S451). When the pedestal energy Ep is equal to or lower than the upper limit EpH and the conversion efficiency CE is equal to or higher than the minimum value CEL (Step S451; YES), the pedestal controller 56 may determine that the pedestal does not need adjusting (Step S452). Thereafter, the pedestal controller 56 may return to the operation shown in FIG. 6. On the other hand, when the pedestal energy Ep exceeds the upper limit EpH or the conversion efficiency CE falls below the minimum value CEL (Step S451; NO), the pedestal controller 56 may determine that the pedestal needs adjusting (Step S453). Thereafter, the pedestal controller 56 may return to the operation shown in FIG. 6.

4. Pedestal Control Device

Specific examples of the pedestal control device according to the first embodiment will now be described in detail with reference to the drawings.

4.1 Optical Shutter

Figure 26:
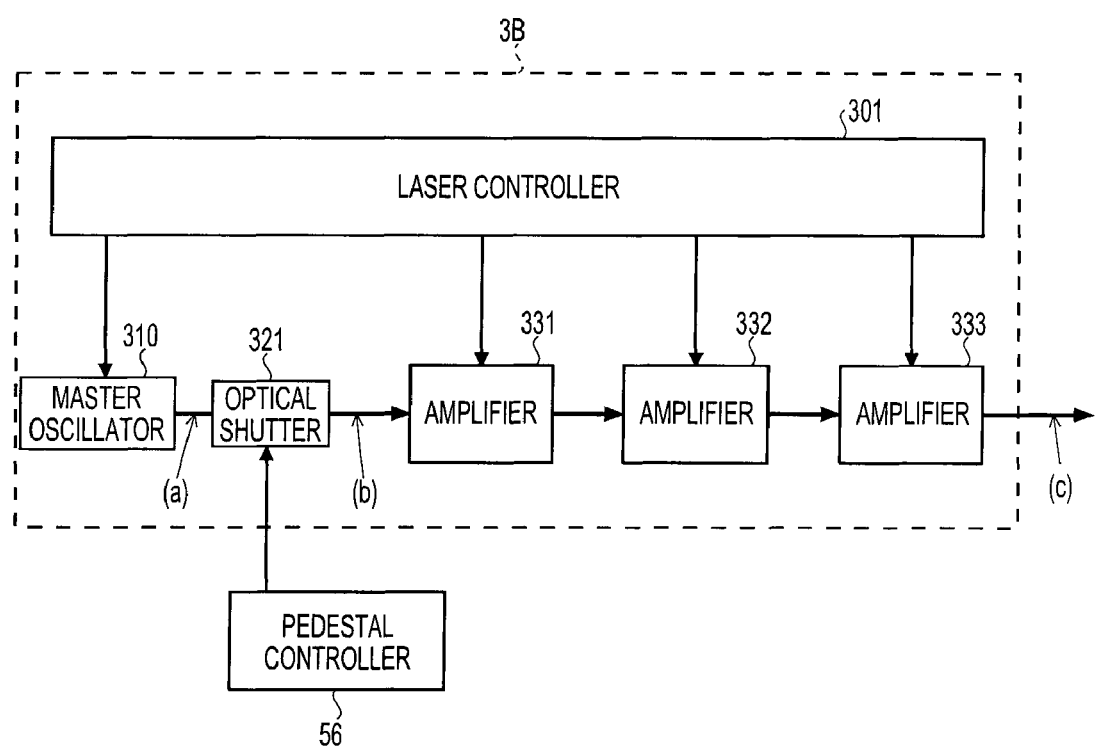
FIG. 26 schematically illustrates an exemplary configuration of a main pulse laser apparatus in which an optical shutter is used as a pedestal control device according to the first embodiment.

FIG. 26 schematically illustrates an exemplary configuration of a main pulse laser apparatus in which an optical shutter is used as a pedestal control device. As shown in FIG. 26, a main pulse laser apparatus 3B may include at least one optical shutter 321 serving as the pedestal control device 320. Other configurations may be similar to those of the main pulse laser apparatus 3A shown in FIG. 2.

The optical shutter 321 may be provided in a beam path of a pulse laser beam from the master oscillator 310. The optical shutter 321 may be configured to vary transmittance therethrough in accordance with the control of the pedestal controller 56. The pedestal controller 56 may control the transmittance of the optical shutter 321 in synchronization with a timing at which the pulse laser beam enters the optical shutter 321. The timing at which the pulse laser beam enters the optical shutter 321 may be detected by an optical sensor (not separately shown). The optical sensor may, for example, detect scattered rays of the pulse laser beam outputted from the master oscillator 310.

The optical shutter 321 may be provided in a beam path between the master oscillator 310 and the amplifier 331. Alternatively, the optical shutter 321 may be provided downstream from the amplifier 331.

When the pedestal ratio R of the main pulse laser beam 31 is not reduced to a desired value by only a single optical shutter 321, a plurality of optical shutters 321 may be used. The plurality of optical shutters 321 may be provided in a beam path between the master oscillator 310 and the amplifier 331. However, this disclosure is not limited thereto, and the optical shutter(s) 321 may be provided in a beam path between the amplifier 331 and the amplifier 332, or in a beam path between the amplifier 332 and the amplifier 333. Alternatively, the optical shutter(s) 321 may be provided downstream from the amplifier 333.

Figure 27:
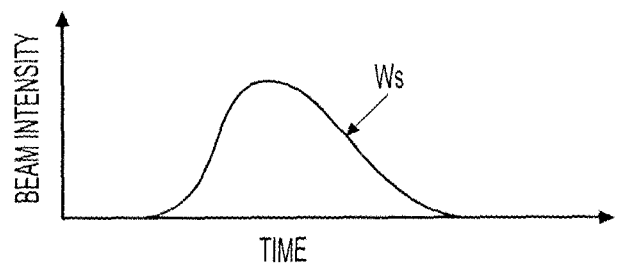
FIG. 27 shows a waveform of a pulse laser beam at a position (a) of FIG. 26.
Figure 28:
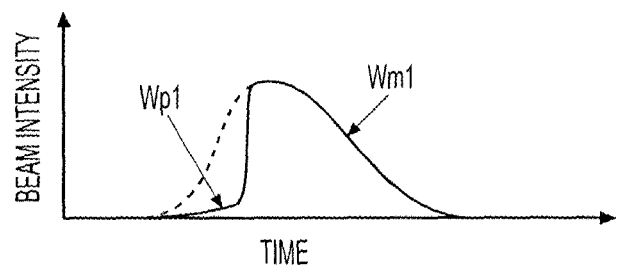
FIG. 28 shows a waveform of a pulse laser beam at a position (b) of FIG. 26.
Figure 29:
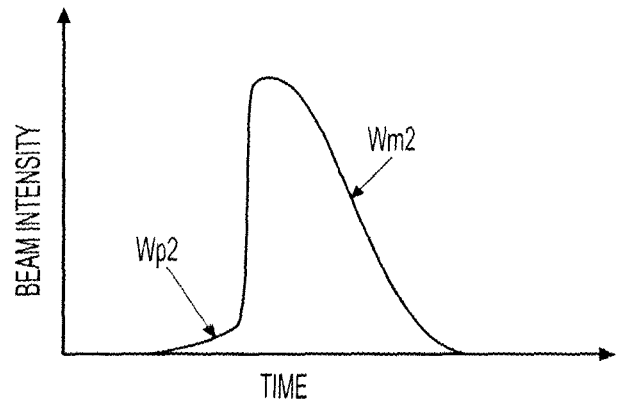
FIG. 29 shows a waveform of a pulse laser beam at a position (c) of FIG. 26.

FIGS. 27 through 29 show waveforms of a pulse laser beam at respective positions (a) through (c) in FIG. 26. As shown in FIG. 27, a pulse laser beam having a waveform Ws which includes a pedestal having a relatively high pedestal ratio R or relatively high pedestal energy Ep may be outputted from the master oscillator 310. Then, as shown in FIG. 28, the waveform of the pulse laser beam transmitted through the optical shutter 321 may be in a shape where the beam intensity of a front portion of the waveform Ws is reduced. This waveform may include a pedestal Wp1, where the pedestal energy Ep is relatively low, and a peak portion Wm1, which is a part of the waveform Ws transmitted through the optical shutter 321 with high transmittance. Subsequently, as shown in FIG. 29, the waveform of the pulse laser beam amplified in the amplifiers 331 through 333 may be in a shape where the waveform shown in FIG. 28 is amplified. Similarly to the waveform shown in FIG. 28, the waveform shown in FIG. 29 may include a pedestal Wp2, where the pedestal energy Ep is relatively low, and a peak portion Wm2, which is a part of the waveform Ws transmitted through the optical shutter 321 with high transmittance.

4.2 Optical Shutter and Saturable Absorber Device

Figure 30:
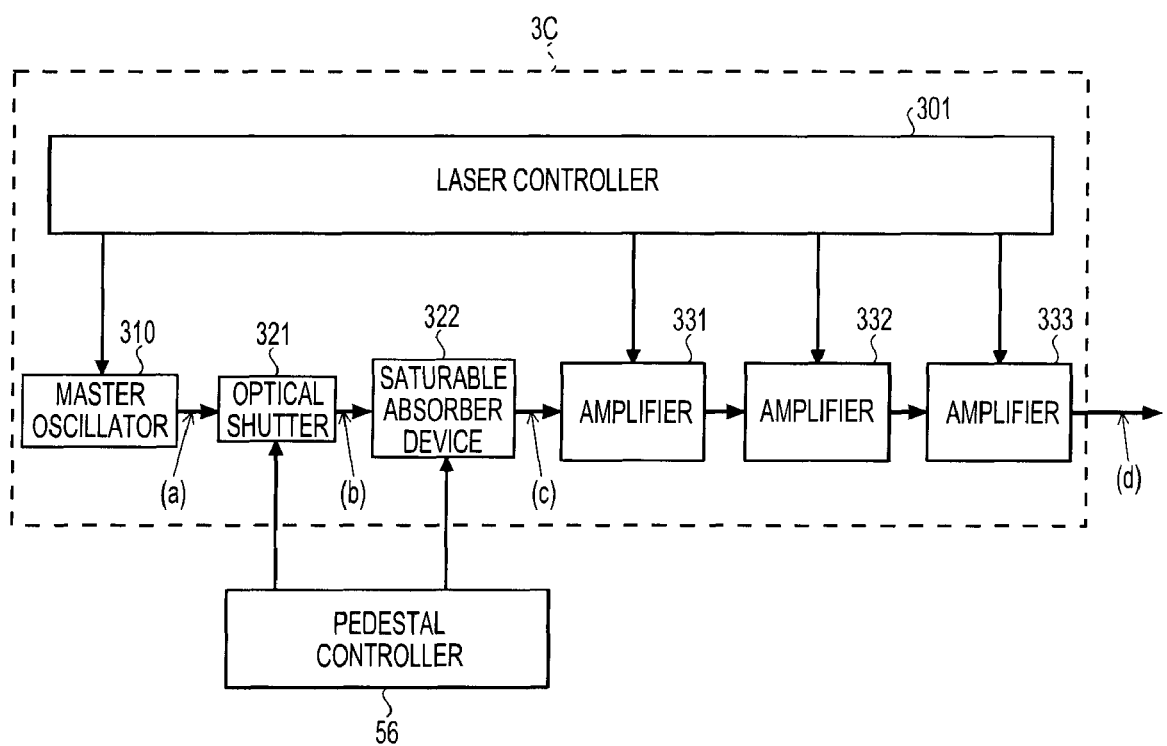
FIG. 30 schematically illustrates an exemplary configuration of a main pulse laser apparatus in which an optical shutter and a saturable absorber device are used collectively as a pedestal control device according to the first embodiment.

FIG. 30 schematically illustrates an exemplary configuration of a main pulse laser apparatus, in which an optical shutter and a saturable absorber device are collectively used as a pedestal control device. As shown in FIG. 30, a main pulse laser apparatus 3C may include at least one optical shutter 321 and at least one saturable absorber device collectively serving as the pedestal control device 320. The optical shutter 321 may be similar to the optical shutter 321 shown in FIG. 26.

The saturable absorber device 322 may be a gas cell containing a saturable absorber gas thereinside. The saturable absorber device 322 may be configured such that a concentration of the saturable absorber gas thereinside or an optical path length through the saturable absorber gas is adjustable.

The saturable absorber device 322 may be provided in a beam path of a pulse laser beam from the master oscillator 310. The saturable absorber device 322 may be provided in a beam path between the master oscillator 310 and the amplifier 331. Alternatively, the saturable absorber device 322 may be provided downstream from the amplifier 331.

The saturable absorber device 322 may be provided downstream from the optical shutter 321. With this arrangement, the pedestal energy Ep of the pedestal generated by the optical shutter 321 may be adjusted effectively. Depending on the amplification characteristics of the amplifiers 331 through 333, the gain of the pedestal may be higher than the gain of the peak portion. In such a case, a desired pedestal ratio may not be obtained solely by the optical shutter 321. Accordingly, the pedestal energy Ep may be reduced by the saturable absorber device 322. Then, a desired pedestal ratio R may be achieved. The saturable absorber device 322 may, however, be provided upstream from the optical shutter 321.

Figure 31:
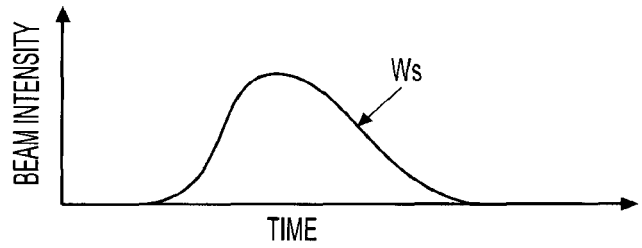
FIG. 31 shows a waveform of a pulse laser beam at a position (a) of FIG. 30.
Figure 32:
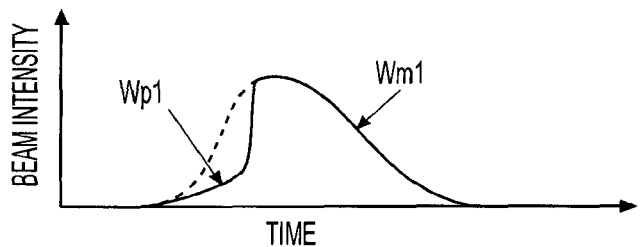
FIG. 32 shows a waveform of a pulse laser beam at a position (b) of FIG. 30.
Figure 33:
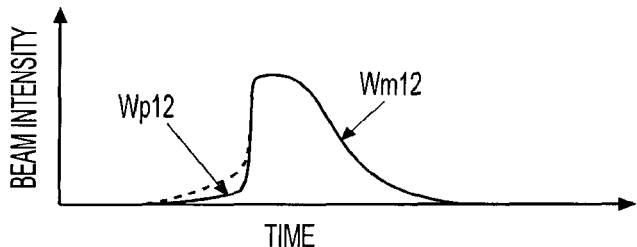
FIG. 33 shows a waveform of a pulse laser beam at a position (c) of FIG. 30.
Figure 34:
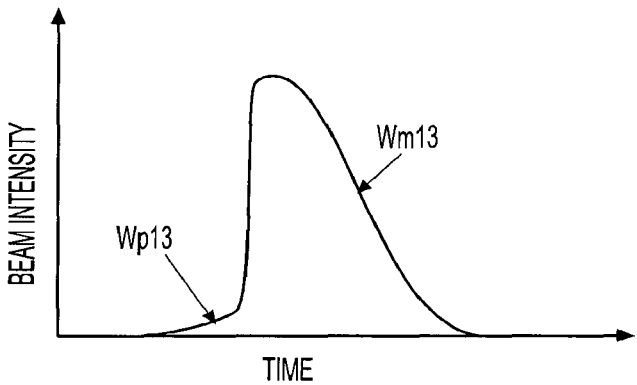
FIG. 34 shows a waveform of a pulse laser beam at a position (d) of FIG. 30.

FIGS. 31 through 34 show waveforms of a pulse laser beam at respective positions (a) through (d) in FIG. 30. As shown in FIGS. 31 and 32, a change in the waveform before and after the pulse laser beam from the master oscillator 310 passes through the optical shutter 321 may be similar to the change in the waveform described with reference to FIGS. 27 and 28. Then, as shown in FIG. 33, the waveform of the pulse laser beam that has passed through the saturable absorber device 322 may be in a shape where the pedestal energy Ep is further reduced or the pedestal ratio R is further reduced. At this point, energy of a tail portion of the waveform Ws may be reduced by the saturable absorber gas. The waveform at this point may include a pedestal Wp12, where the beam intensity is low, and a peak portion Wm12, where the beam intensity is high. Further, as shown in FIG. 34, the waveform of the pulse laser beam amplified in the amplifiers 331 through 333 may be in a shape where the waveform shown in FIG. 33 is amplified. Similarly to the waveform shown in FIG. 33, this waveform shown in FIG. 34 may include a pedestal Wp13, where the beam intensity is low, and a peak portion Wm13, where the beam intensity is high.

4.3 Combination with Pockels Cell in Master Oscillator

When a master oscillator includes a Pockels cell, the Pockels cell may be used as a part of a pedestal control device. Hereinafter, a case where the Pockels cell of the master oscillator is used in the pedestal control device will be described with specific examples.

4.3.1 Combination with Saturable Absorber Device

Figure 35:
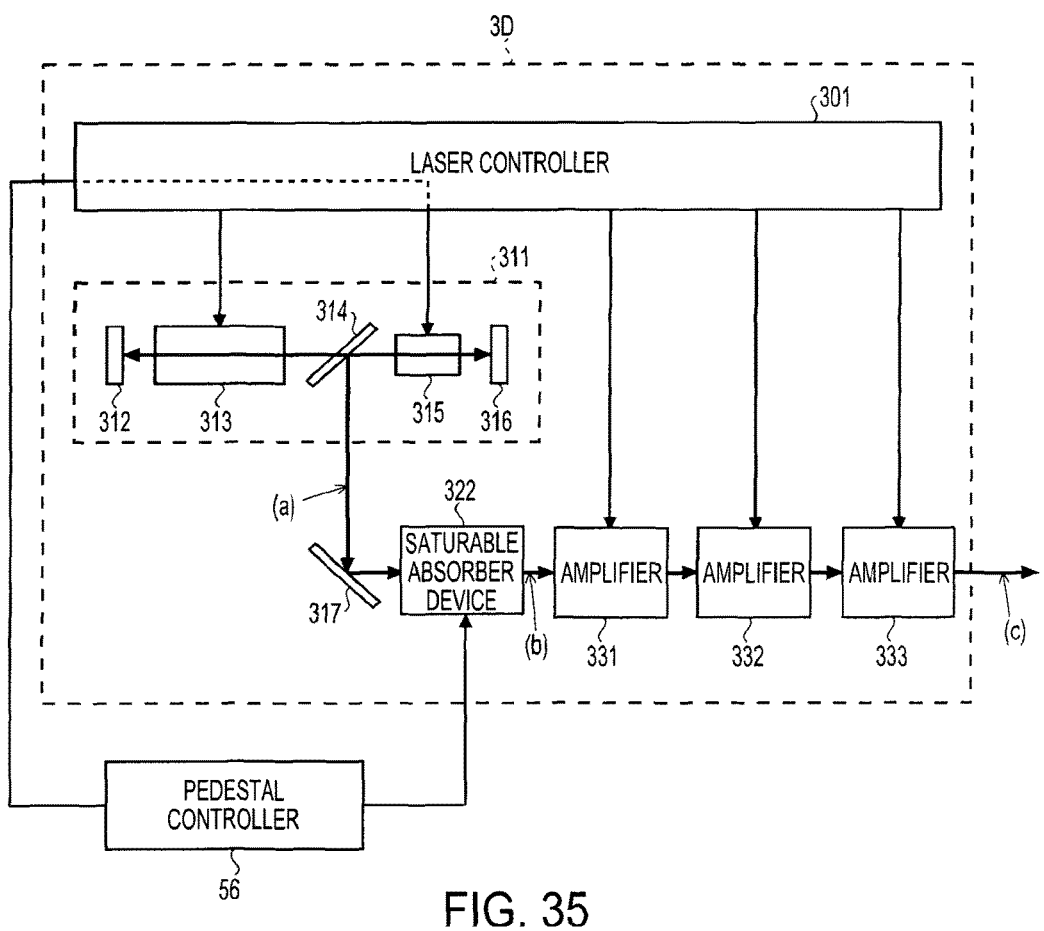
FIG. 35 schematically illustrates an exemplary configuration of a main pulse laser apparatus in which a Pockels cell in a master oscillator and a saturable absorber device are collectively used as a pedestal control device according to the first embodiment.

FIG. 35 schematically illustrates an exemplary configuration of a main pulse laser apparatus, in which a Pockels cell in a master oscillator and a saturable absorber device are collectively used as a pedestal control device. As shown in FIG. 35, a main pulse laser apparatus 3D may include a master oscillator 311, a high-reflection mirror 317, and the saturable absorber device 322.

The master oscillator 311 may include a resonator formed by high-reflection mirrors 312 and 316, an amplification part 313, a polarization beam splitter 314, and a Pockels cell 315. The Pockels cell 315 may change the polarization direction of a passing pulse laser beam in accordance with a voltage applied by the laser controller 301. The voltage applied to the Pockels cell 315 by the laser controller 301 may be controlled by the pedestal controller 56. By adjusting a voltage applied to the Pockels cell 315 when a pulse laser beam is outputted from the master oscillator 311, a pulse laser beam having a waveform in a shape where the beam intensity of a front portion of the waveform is reduced may be outputted from the master oscillator 311. That is, a pulse laser beam of which the pedestal ratio R or the pedestal energy Ep has been adjusted may be outputted from the master oscillator 311.

The pulse laser beam outputted from the master oscillator 311 may be reflected by the high-reflection mirror 317 and enter the saturable absorber device 322. The saturable absorber device 322 may be similar to the saturable absorber device 322 shown in FIG. 30. As the pulse laser beam from the master oscillator 311 passes through the saturable absorber device 322, the pedestal energy Ep thereof may be adjusted effectively.

Figure 36:
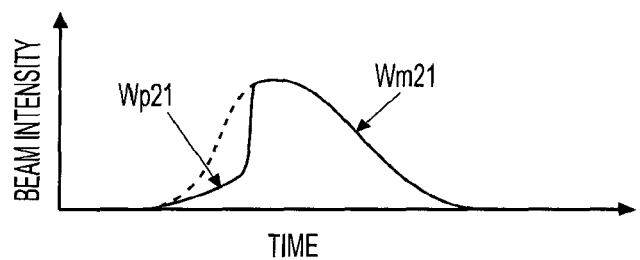
FIG. 36 shows a waveform of a pulse laser beam at a position (a) of FIG. 35.
Figure 37:
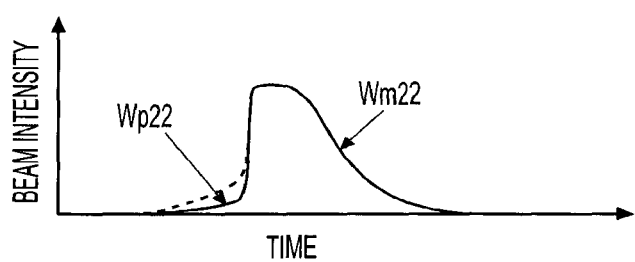
FIG. 37 shows a waveform of a pulse laser beam at a position (b) of FIG. 35.
Figure 38:
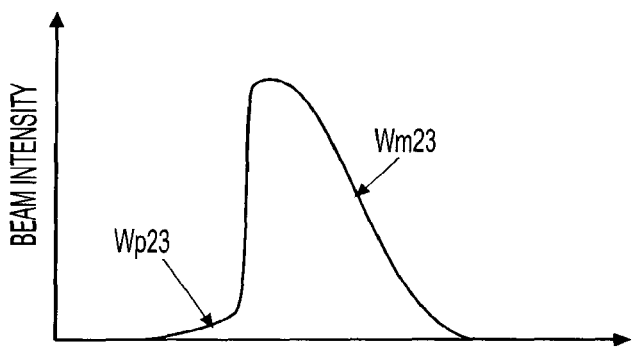
FIG. 38 shows a waveform of a pulse laser beam at a position (c) of FIG. 35.

FIGS. 36 through 38 show waveforms of a pulse laser beam at respective positions (a) through (c) in FIG. 35. As shown in FIG. 36, a pulse laser beam having a waveform in which the beam intensity of the front portion is reduced may be outputted from the master oscillator 311. This waveform may include a pedestal Wp21, where the pedestal ratio R or the pedestal energy Ep is relatively low, and a peak portion Wm21, where the energy Em is relatively high. The pedestal Wp21 may, for example, be generated by lowering a voltage applied to the Pockels cell 315. Further, the peak portion Wm21 may, for example, be generated by raising a voltage applied to the Pockels cell 315. When a relatively low voltage is applied to the Pockels cell 315, a change in the polarization direction of the pulse laser beam transmitted through the Pockels cell 315 may be small. Thus, the beam intensity of the pulse laser beam reflected by the polarization beam splitter 314 may be relatively low. On the other hand, when a relatively high voltage is applied to the Pockels cell 315, a change in the polarization direction of the pulse laser beam transmitted through the Pockels cell 315 may be close to 90 degrees. Thus, the beam intensity of the pulse laser beam reflected by the polarization beam splitter 314 may be relatively high. Then, as shown in FIG. 37, the waveform of the pulse laser beam that has passed through the saturable absorber device 322 may be in a shape where the pedestal energy Ep is further reduced or the pedestal ratio R is further reduced. This pulse waveform may include a pedestal Wp22, where the beam intensity is low, and a peak portion Wm22, where the beam intensity is high. At this point, energy of a tail portion of the peak portion Wm22 may be reduced by the saturable absorber gas. Further, as shown in FIG. 38, the waveform of the pulse laser beam amplified in the amplifiers 331 through 333 may be in a shape where the waveform shown in FIG. 37 is amplified. Similarly to the waveform shown in FIG. 37, this waveform shown in FIG. 38 may include a pedestal Wp23, where the beam intensity is low, and a peak portion Wm23, where the beam intensity is high.

4.3.2 Combination with Optical Shutter

Figure 39:
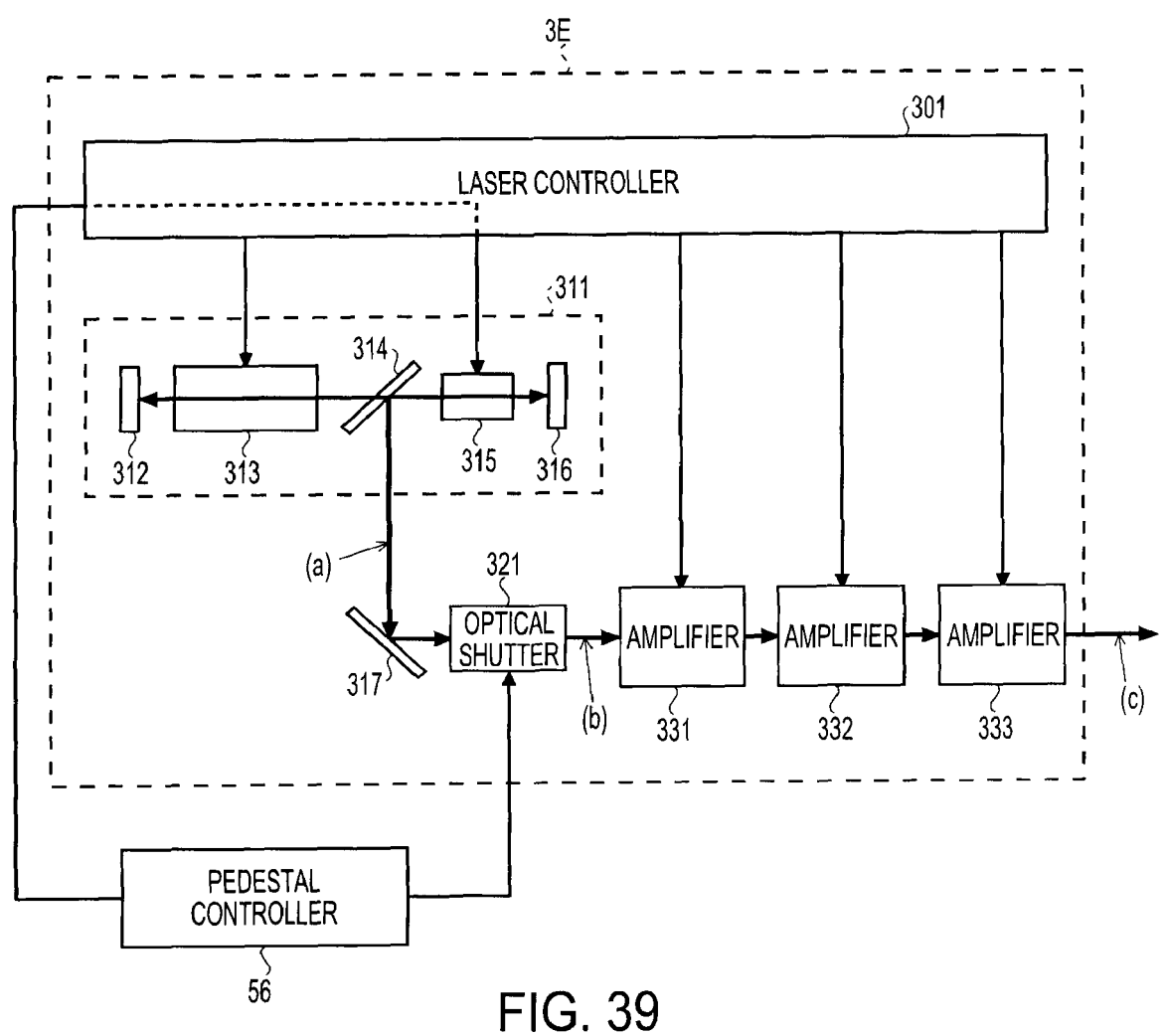
FIG. 39 schematically illustrates an exemplary configuration of a main pulse laser apparatus in which a Pockels cell in a master oscillator and an optical shutter are collectively used as a pedestal control device according to the first embodiment.

FIG. 39 schematically illustrates an exemplary configuration of a main pulse laser apparatus, in which a Pockels cell in a master oscillator and an optical shutter are collectively used as a pedestal control device. As shown in FIG. 39, a main pulse laser apparatus 3E may be similar in configuration to the main pulse laser apparatus 3D shown in FIG. 35. However, in the main pulse laser apparatus 3E, the saturable absorber device 322 may be replaced by the optical shutter 321. The optical shutter 321 may be similar to the optical shutter 321 shown in FIG. 26. When a pulse laser beam outputted from the master oscillator 311 passes through the optical shutter 321, the pedestal energy Ep of the pulse laser beam may be adjusted effectively by adjusting a voltage applied to the optical shutter 321.

4.4 Embodiment Where Master Oscillator Includes At Least Two Semiconductor Lasers A master oscillator of a main pulse laser apparatus may include at least two semiconductor lasers. In that case, at least one of the semiconductor lasers may be used as a pedestal control device.

Figure 40:
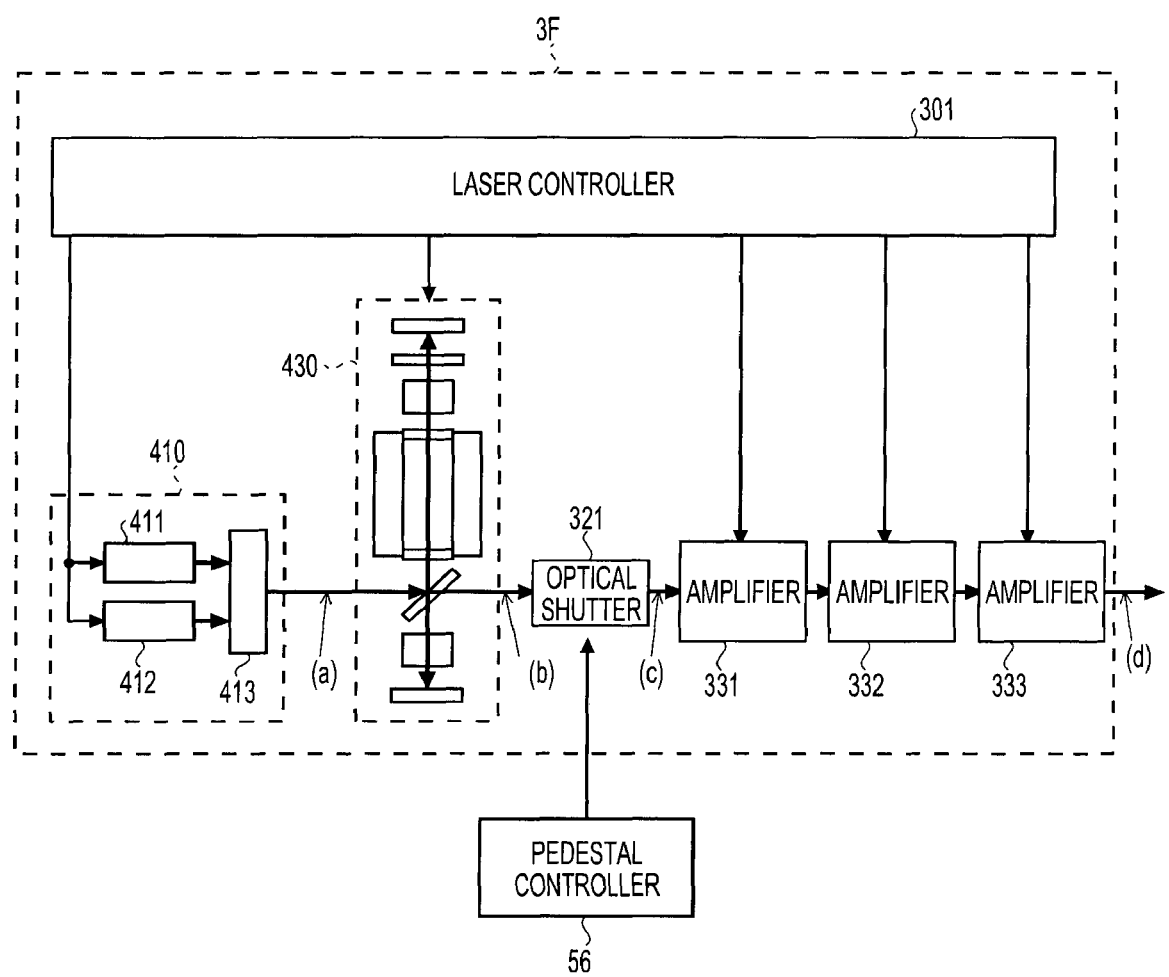
FIG. 40 schematically illustrates an exemplary configuration of a main pulse laser apparatus in which a master oscillator includes at least two semiconductor lasers according to the first embodiment.

FIG. 40 schematically illustrates an exemplary configuration of a main pulse laser apparatus in which a master oscillator includes at least two semiconductor lasers. A main pulse laser apparatus 3F shown in FIG. 40 may be similar in configuration to the main pulse laser apparatus 3B shown in FIG. 26. However, in the main pulse laser apparatus 3F, the master oscillator 310 may be replaced by a master oscillator 410. Further, the main pulse laser apparatus 3F may include a regenerative amplifier 430.

The master oscillator 410 may include semiconductor lasers 411 and 412, and a beam path adjuster 413. Each of the semiconductor lasers 411 and 412 may, for example, be a quantum cascade laser. The semiconductor lasers 411 and 412 may be configured to oscillate under the control of the laser controller 301. The beam path adjuster 413 may be positioned to adjust the beam paths of the pulse laser beams outputted from the respective semiconductor lasers 411 and 412 to substantially coincide with each other.

The laser controller 301 may, for example, control the semiconductor laser 412 to oscillate after the semiconductor laser 411 oscillates. In this case, a part of the waveform of the pulse laser beam from the semiconductor laser 411 may overlap a part of the waveform of the pulse laser beam from the semiconductor laser 412. In other embodiments, the waveform of the pulse laser beam from the semiconductor laser 411 may be temporally separated from the waveform of the pulse laser beam from the semiconductor laser 412.

Energy of the pulse laser beam from the semiconductor laser 411 may be substantially smaller than energy of the pulse laser beam from the semiconductor laser 412. When these pulse laser beams are combined such that the pulse laser beam having lower energy precedes the pulse laser beam having higher energy, a pulse laser beam that substantially includes a pedestal may be outputted from the master oscillator 410.

The pulse laser beam outputted from the master oscillator 410 may then be amplified in the regenerative amplifier 430. The amplified pulse laser beam may enter the optical shutter 321. The optical shutter 321 shown in FIG. 40 may be similar to the optical shutter 321 shown in FIG. 26. Although in this example, the optical shutter 321 is provided downstream from the regenerative amplifier 430, the optical shutter 321 may be provided in a beam path between the master oscillator 410 and the regenerative amplifier 430. By adjusting a voltage applied to the optical shutter 321 when the pulse laser beam from the master oscillator 410 passes through the optical shutter 321, pedestal energy Ep of the pulse laser beam may be adjusted effectively. Here, the optical shutter 321 may be omitted when the pedestal energy Ep obtained by adjusting the energy of the pulse laser beam from the semiconductor laser 411 is brought to desired pedestal energy even after the pulse laser beam is amplified in the amplifiers 331 through 333.

Figure 41:
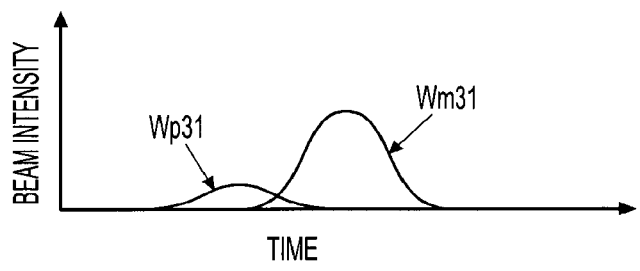
FIG. 41 shows a waveform of a pulse laser beam at a position (a) of FIG. 40.
Figure 42:
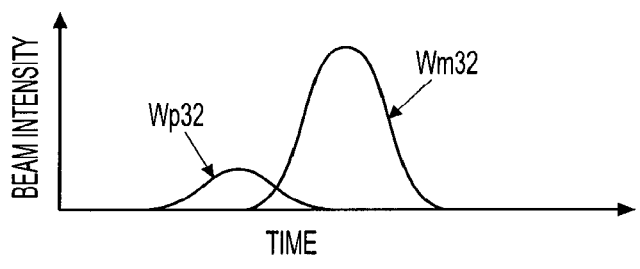
FIG. 42 shows a waveform of a pulse laser beam at a position (b) of FIG. 40.
Figure 43:
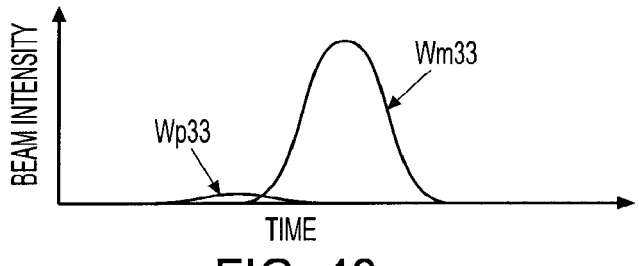
FIG. 43 shows a waveform of a pulse laser beam at a position (c) of FIG. 40.
Figure 44:
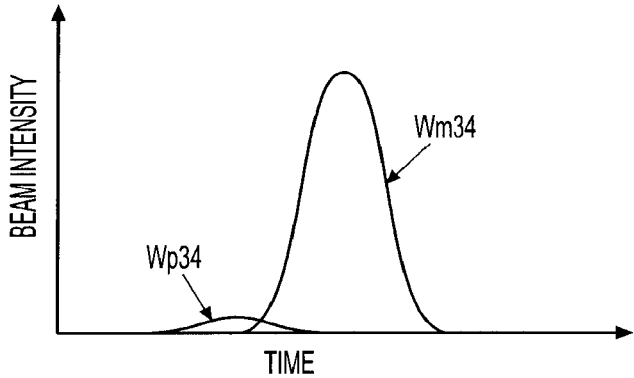
FIG. 44 shows a waveform of a pulse laser beam at a position (d) of FIG. 40.

FIGS. 41 through 44 show waveforms of a pulse laser beam at respective positions (a) through (d) in FIG. 40. As shown in FIG. 41, a waveform of the pulse laser beam from the master oscillator 411 may, for example, include a waveform Wp31, where the energy is relatively low, and a waveform Wm31, where the energy is relatively high. The waveform Wp31 may, for example, be a waveform of the pulse laser beam from the semiconductor laser 411. The waveform Wm31 may, for example, be a waveform of the pulse laser beam from the semiconductor laser 412. Then, the pulse laser beam from the master oscillator 410 may be amplified in the regenerative amplifier 430. In that case, as shown in FIG. 42, a waveform of the pulse laser beam from the regenerative amplifier 430 may include a waveform Wp32, where the energy is relatively low, and a waveform Wm32, where the energy is relatively high. Subsequently, as shown in FIG. 43, a waveform of the pulse laser beam transmitted through the optical shutter 321 may include a pedestal Wp33, where the energy of the pulse laser beam from the semiconductor 411 is reduced by the optical shutter 321 and the pedestal ratio R or the pedestal energy Ep is relative low, and a peak portion Wm33, where the energy Em is relatively high. Further, as shown in FIG. 44, a waveform of the pulse laser beam amplified in the amplifiers 331 through 333 may be in a shape where the waveform shown in FIG. 43 is amplified. Similarly to the waveform shown in FIG. 43, this waveform shown in FIG. 44 may include a pedestal Wp34, where the pedestal ratio R is relatively low or the pedestal energy Ep is relatively low, and a peak portion Wm34, where the energy Em is relatively high.

5. Controlling Energy of EUV Light by Controlling Pedestal of Main Pulse Laser Beam: Second Embodiment In the above-described EUV light generation system, the pedestal control device is adjusted in order to satisfy the required conversion efficiency. However, this disclosure is not limited thereto. For example, energy of the EUV light may be controlled by adjusting the pedestal ratio or the pedestal energy of the main pulse laser beam. Hereinafter, an EUV light generation system configured to control energy of the EUV light by adjusting the pedestal control device will be described in detail as a second embodiment of this disclosure.

5.1 Configuration

The EUV light generation system of the second embodiment may be configured similarly to the EUV light generation system 11A of the first embodiment.

5.2 Operation

The operation of the EUV light generation system of the second embodiment may be similar to that of the EUV light generation system 11A of the first embodiment. However, in the second embodiment, target energy Eeuvt of the EUV light may be inputted to the EUV light generation controller 5A from an external apparatus, such as the exposure apparatus controller 61. In that case, the EUV light generation controller 5A may control the pedestal control device 320 so that the energy of the emitted EUV light is brought to the target energy Eeuvt.

5.3 Effect

By controlling the pedestal control device 320 to adjust the conversion efficiency CE, the energy of the EUV light 252 may be controlled. Accordingly, the energy of the EUV light 252 may be controlled without largely changing the output power of the main pulse laser apparatus 3A. Thus, variation in a heat load on optical elements provided in a beam path between the main pulse laser apparatus 3A and the plasma generation region 25 may be reduced. As a result, these optical elements may be thermally stabilized. Accordingly, focusing performance of the main pulse laser beam 31 may be stabilized, and the output stability of the EUV light 252 may be improved.

5.4 Flowcharts 5.4.1 Control Flow Based on Pedestal Ratio

The operation of the EUV light generation system 11A according to the second embodiment may be based on the pedestal ratio R (see FIG. 4) or the pedestal energy Ep (see FIG. 5). The operation based on the pedestal ratio R will first be discussed in detail with reference to the drawings.

5.4.1.1 Pedestal Control Flow

Figure 45:
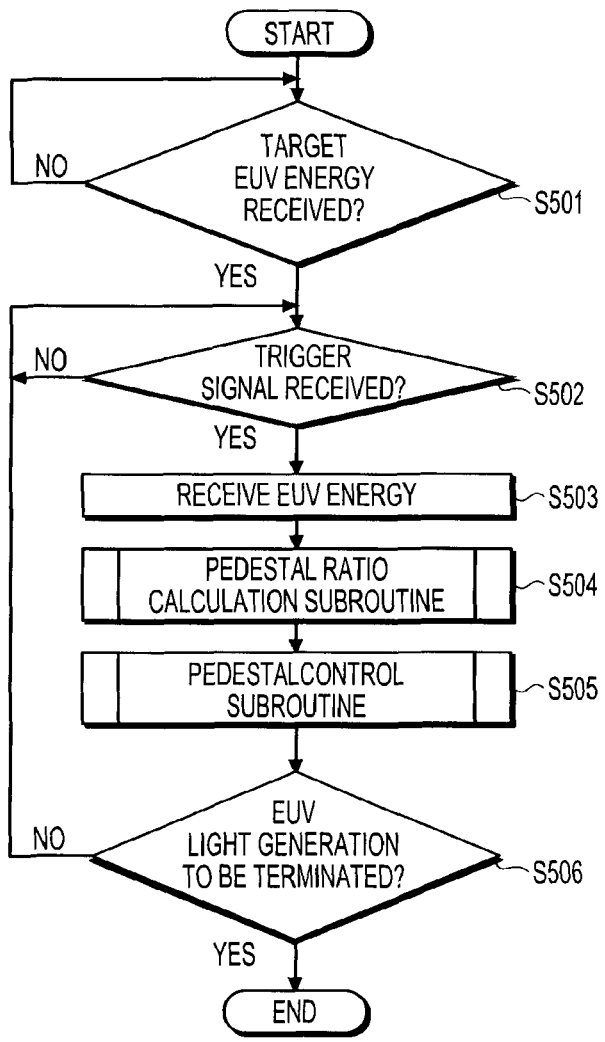
FIG. 45 is a flowchart showing an example of an overall operation of a pedestal controller according to a second embodiment of this disclosure.

FIG. 45 is a flowchart showing an example of an overall operation of a pedestal controller according to the second embodiment.

With reference to FIG. 45, the pedestal controller 56 may first stand by until it receives an target EUV energy Eeuvt of the EUV light 252 from an external apparatus, such as the exposure apparatus controller 61 (Step S501; NO). Upon receiving a target EUV energy Eeuvt (Step S501; YES), the pedestal controller 56 may then stand by until it receives a trigger signal from the EUV light generation position controller 51 (Step S502; NO). The trigger signal may be a trigger for generating a single pulse of the EUV light 252. The trigger signals may be inputted to the pedestal controller 56 at a predetermined repetition rate while the EUV light 252 is to be generated.

Upon receiving the trigger signal (Step S502; YES), the pedestal controller 56 may receive EUV energy Eeuv of the EUV light 252 detected by the energy sensor 90 (Step S503). Subsequently, the pedestal controller 56 may carry out a pedestal ratio calculation subroutine to calculate the pedestal ratio R (Step S504). The pedestal ratio calculation subroutine may be similar to the modification of the pedestal ratio calculation subroutine described with reference to FIG. 13.

Then, the pedestal controller 56 may carry out a pedestal control subroutine to control the pedestal control device 320 so that the pedestal of the main pulse laser beam 31 achieves a desired pedestal ratio R (Step S505).

Thereafter, the pedestal controller 56 may determine whether or not generation of the EUV light 252 is to be stopped (Step S506). This determination may, for example, be made in the pedestal control subroutine in Step S505.

When generation of the EUV light 252 is to be continued (Step S506; NO), the pedestal controller 56 may return to Step S502 and repeat the subsequent steps. On the other hand, when generation of the EUV light 252 is to be stopped (Step S506; YES), the pedestal controller 56 may terminate the operation.

With the above-described operation, the pedestal ratio R of the main pulse laser beam 31 may be adjusted in accordance with the target EUV energy Eeuvt. As a result, the target EUV energy Eeuvt may be achieved without largely changing the output power of the main pulse laser beam 31.

5.4.1.2 Pedestal Control Subroutine

Figure 46:
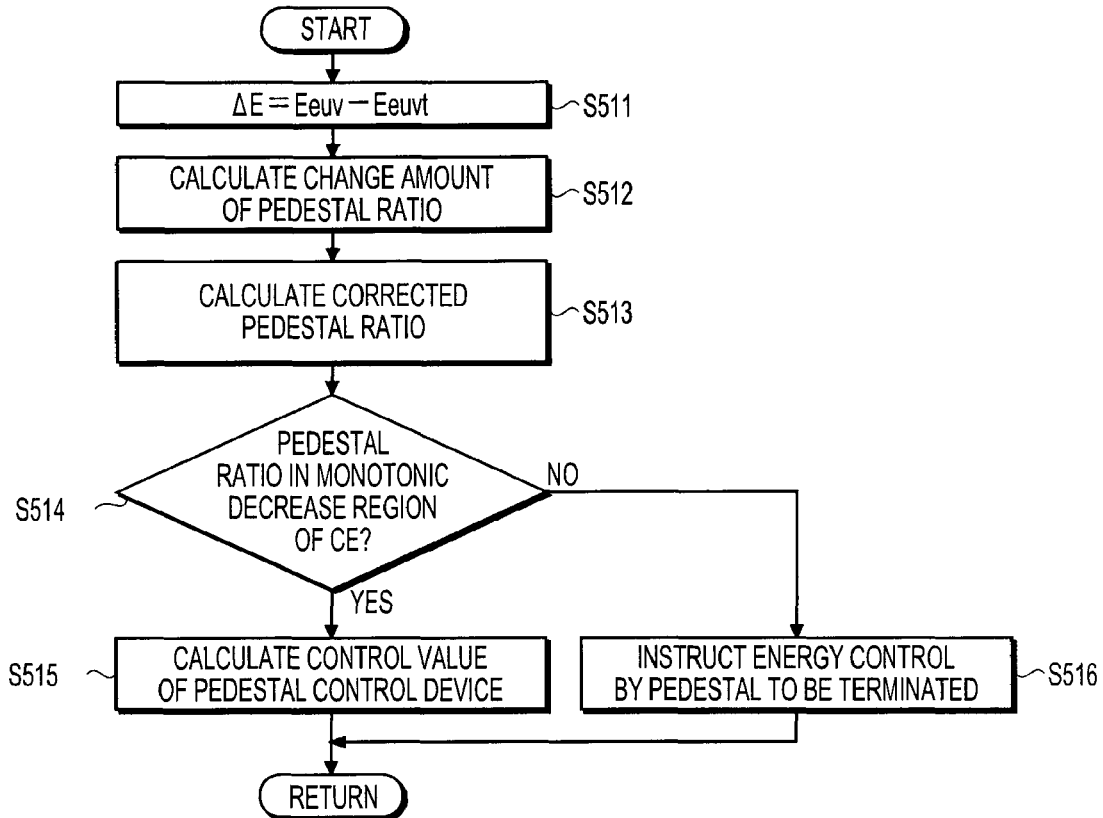
FIG. 46 shows an example of a pedestal control subroutine in Step S505 of FIG. 45.
Figure 47:
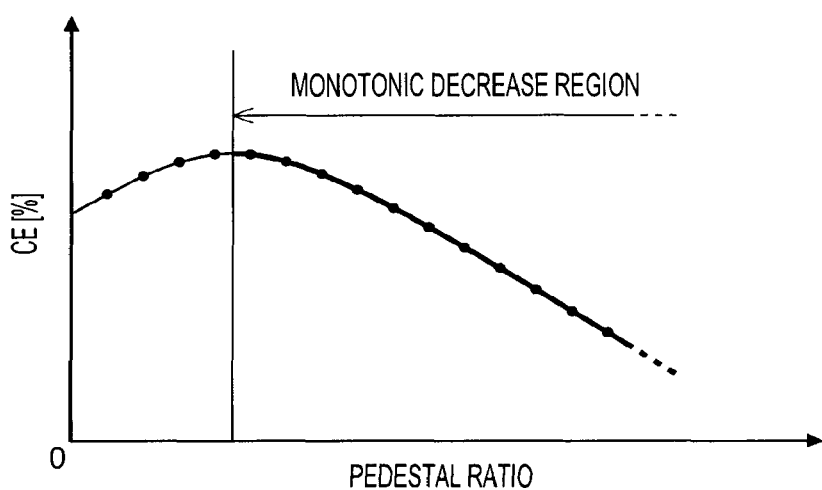
FIG. 47 shows an example of a relationship between a pedestal ratio and conversion efficiency used in the description of the pedestal control subroutine shown in FIG. 46.

FIG. 46 shows an example of a pedestal control subroutine in Step S505 of FIG. 45. FIG. 47 shows an example of a relationship between a pedestal ratio and conversion efficiency used in the description of the pedestal control subroutine shown in FIG. 46.

With reference to FIG. 46, in the pedestal control subroutine, the pedestal controller 56 may calculate a difference $\Delta E$, where $\Delta E = E_{euv} - E_{euvt}$, between the detected EUV energy Eeuv and the target EUV energy Eeuvt (Step S511). Then, the pedestal controller 56 may calculate a change amount $\Delta R$ of the pedestal ratio R corresponding to the calculated difference $\Delta E$ (Step S512). In order to calculate the change amount $\Delta R$ from the difference $\Delta E$, a relationship between a pedestal ratio Rn and the total energy Et of the main pulse laser beam to be used to obtain a relationship between the pedestal ratio R and the conversion efficiency CE shown in FIG. 47 may be used. The relationship between the pedestal ratio Rn and the total energy Et of the main pulse laser beam may be obtained by carrying out the pedestal control subroutine described with reference to FIG. 7 or 9. Subsequently, the pedestal controller 56 may calculate a corrected pedestal ratio R from the current pedestal ratio R and the calculated change amount $\Delta R$, ($R = R + \Delta R$) (Step S513).

Then, the pedestal controller 56 may determine whether or not the calculated pedestal ratio R falls within a monotonic decrease region of the conversion efficiency CE in a measurement range of the pedestal ratio R (Step S514). The monotonic decrease region of the conversion efficiency CE may be a region in which the conversion efficiency CE decreases relatively monotonically with respect to the increase in the pedestal ratio R, as shown in FIG. 47. The aforementioned determination may be made based on a value of the pedestal ratio R. Here, the relational curve between the pedestal ratio R and the conversion efficiency CE as shown in FIG. 47 may preferably be obtained in advance. This relationship may be obtained by carrying out the pedestal control subroutine described with reference to FIG. 7 or 9. In other embodiments, the relationship between the pedestal ratio R and the conversion efficiency CE obtained in advance through an experiment may be stored and referenced accordingly.

When the pedestal ratio R falls within the monotonic decrease region of the conversion efficiency CE (Step S514; YES), the pedestal controller 56 may calculate a control value P of the pedestal control device 320 to achieve the desired pedestal ratio R (Step S515). Thereafter, the pedestal controller 56 may return to the operation shown in FIG. 45. On the other hand, when the pedestal ratio R does not fall within the monotonic decrease region of the conversion efficiency CE (Step S514; NO), the pedestal controller 56 may instruct the EUV light generation controller 5A to terminate the control of the pedestal to control the energy of the EUV light 252 (Step S516). Thereafter, the pedestal controller 56 may return to the operation shown in FIG. 45.

5.4.2 Control Flow Based on Pedestal Energy

An operation based on pedestal energy will now be described in detail with reference to the drawings.

5.4.2.1 Pedestal Control Flow

Figure 48:
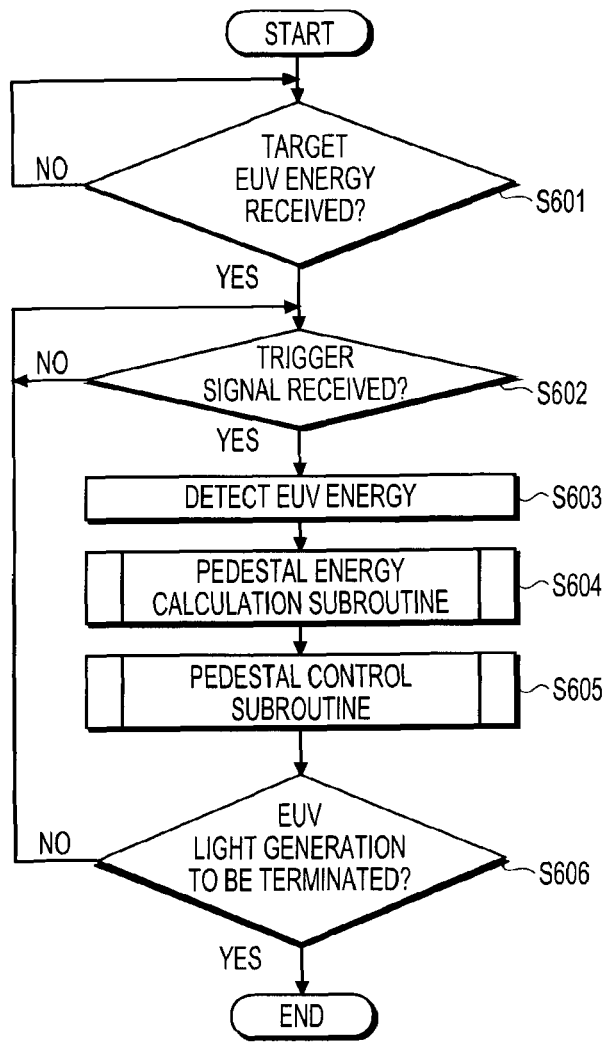
FIG. 48 is a flowchart showing an example of an overall operation of a pedestal controller according to a modification of the second embodiment.

FIG. 48 is a flowchart showing an example of an overall operation of a pedestal controller according to a modification of the second embodiment.

The pedestal control flow as shown in FIG. 48, in which the pedestal energy Ep is used as a parameter, may include steps that are similar to those of the pedestal control flow described with reference to FIG. 45. Thus, only the operations of the pedestal control flow of FIG. 48 that differ from those in the pedestal control flow shown in FIG. 45 will be discussed below. Steps S601 through S603 may be similar to Steps S501 through S503 of FIG. 45. In Step S604, the pedestal controller 56 may carry out a pedestal energy calculation subroutine to calculate the pedestal energy Ep. The pedestal energy calculation subroutine in Step S604 may be similar to the modification of the pedestal energy calculation subroutine described with reference to FIG. 22.

Then, the pedestal controller 56 may carry out a pedestal control subroutine to control the pedestal control device 320 so that a pedestal of the main pulse laser beam 31 achieves desired pedestal energy Ep (Step S605).

Step S606 of FIG. 48 may be similar to Step S506 of FIG. 45. However, when the determination is NO in Step S606, the pedestal controller 56 may return to Step S602 and repeat the subsequent steps.

With the above-described operation, the pedestal energy Ep of the main pulse laser beam 31 may be controlled in accordance with the target EUV energy Eeuvt. As a result, the target EUV energy Eeuvt may be achieved without largely changing the output power of the main pulse laser beam 31.

5.4.2.2 Pedestal Control Subroutine

Figure 49:
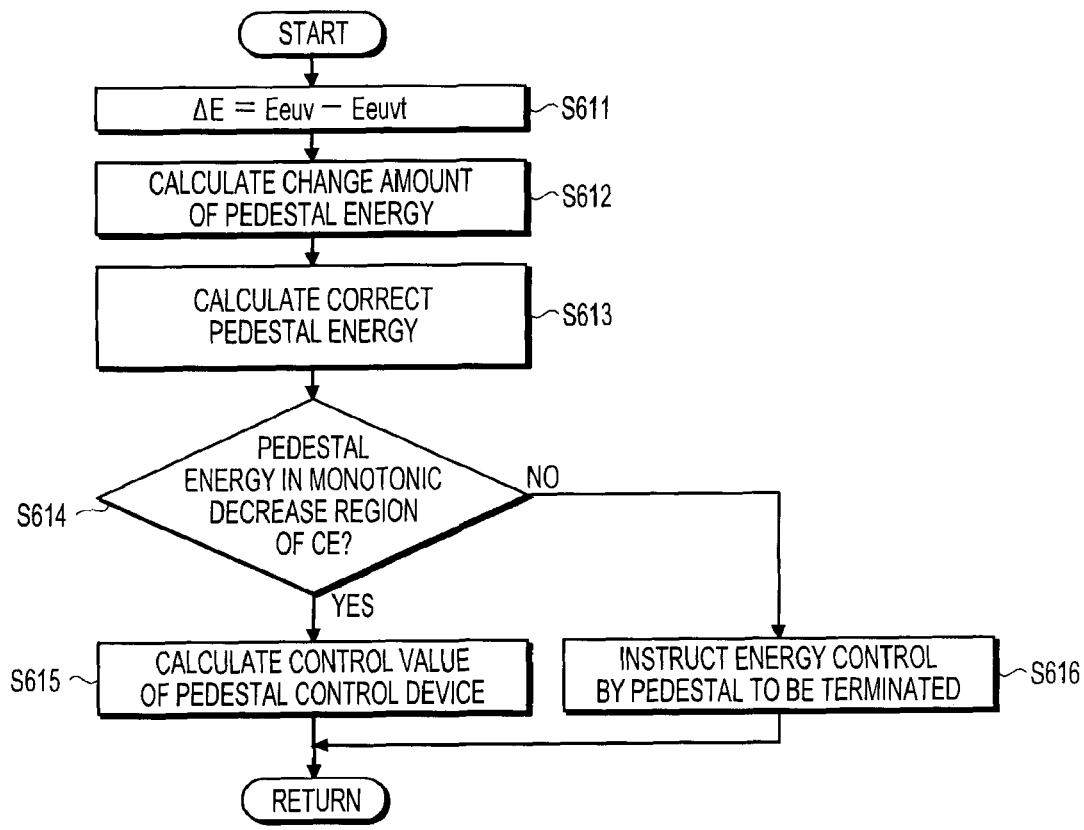
FIG. 49 shows an example of a pedestal control subroutine in Step S605 of FIG. 48.
Figure 50:
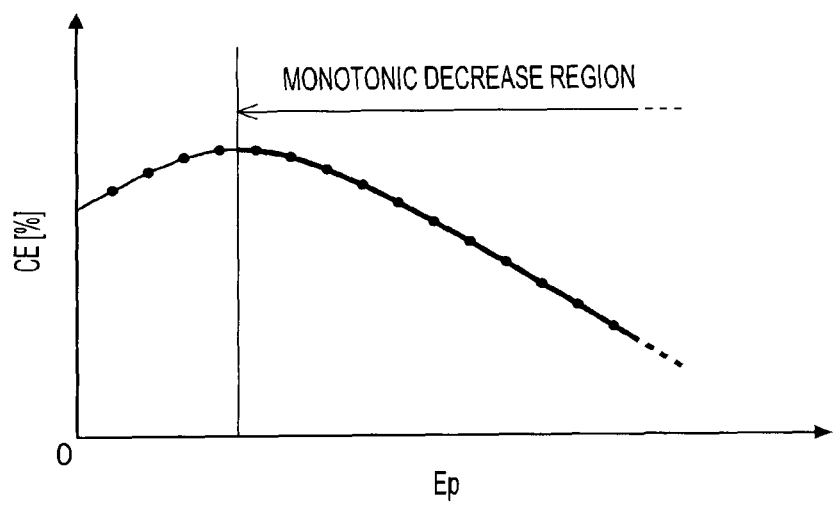
FIG. 50 shows an example of a relationship between pedestal energy and conversion efficiency used in the description of the pedestal control subroutine shown in FIG. 49.

FIG. 49 shows an example of a pedestal control subroutine in Step S605 of FIG. 48. FIG. 50 shows an example of a relationship between pedestal energy and conversion efficiency used in the description of the pedestal control subroutine shown in FIG. 49.

With reference to FIG. 49, in the pedestal control subroutine, the pedestal controller 56 may calculate a difference $\Delta E$, where $\Delta E = E_{euv} - E_{euvt}$, between the detected EUV energy Eeuv and the target EUV energy Eeuvt (Step S611). Then, the pedestal controller 56 may calculate a change amount $\Delta Ep$ of the pedestal energy Ep corresponding to the calculated difference $\Delta E$ (Step S612). Subsequently, the pedestal controller 56 may calculate corrected pedestal energy Ep, where $Ep = Ep + \Delta Ep$, from the current pedestal energy Ep and the calculated change amount $\Delta Ep$ (Step S613).

Then, the pedestal controller 56 may determine whether or not the calculated pedestal energy Ep falls within a monotonic decrease region of the conversion efficiency CE in a measurement range of the pedestal energy Ep (Step S614). The monotonic decrease region of the conversion efficiency CE may be a region in which the conversion efficiency CE decreases relatively monotonically with respect to the increase in the pedestal energy Ep, as shown in FIG. 50. The above determination may be made based on a value of the pedestal energy Ep. Here, a relational between the pedestal energy Ep and the conversion efficiency CE as shown in FIG. 50 may preferably be obtained in advance. This relationship may be obtained by carrying out the pedestal control subroutine described with reference to FIG. 17 or 19. In other embodiments, a relationship between the pedestal energy Ep and the conversion efficiency CE obtained in advance through an experiment may be stored and referenced accordingly.

When the pedestal energy Ep falls within the monotonic decrease region of the conversion efficiency CE (Step S614; YES), the pedestal controller 56 may calculate a control value P of the pedestal control device 320 to achieve the desired pedestal energy Ep (Step S615). Thereafter, the pedestal controller 56 may return to the operation shown in FIG. 48. On the other hand, when the pedestal energy Ep does not fall within the monotonic decrease region of the conversion efficiency CE (Step S614; NO), the pedestal controller 56 may instruct the EUV light generation controller 5A to terminate the control of the pedestal to control of the energy of the EUV light 252 (Step S616). Thereafter, the pedestal controller 56 may return to the operation shown in FIG. 48.

6. Optical Shutter

The optical shutter of the above-described embodiments will now be described with specific examples.

6.1 Combination of Pockels Cell and Polarizer

Figure 51:
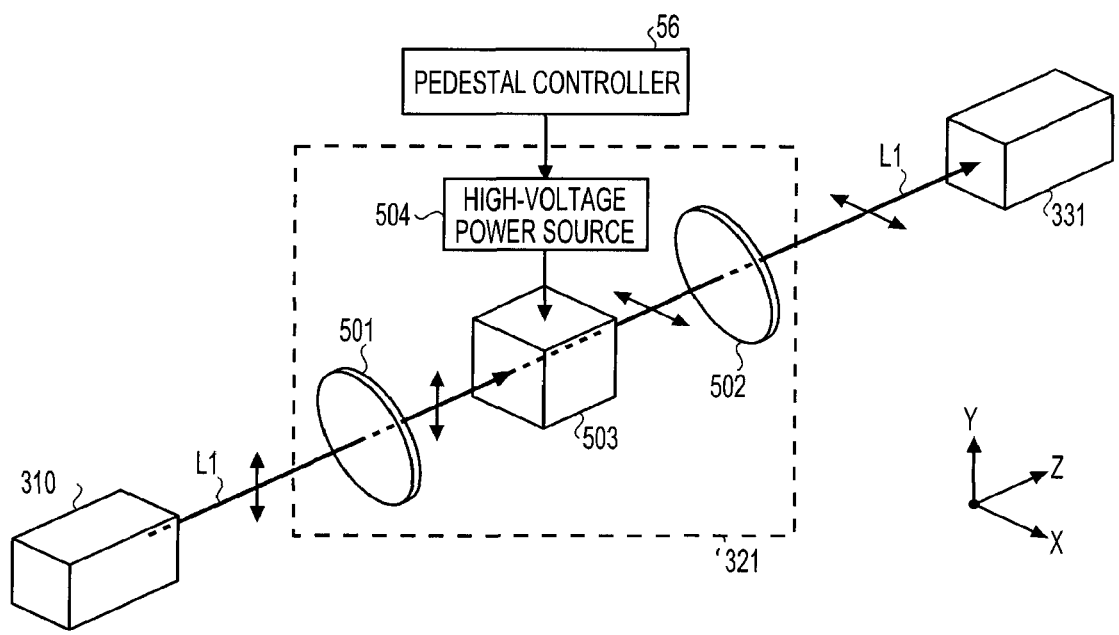
FIG. 51 illustrates an example of an optical shutter including two polarizers and a Pockels cell.

FIG. 51 illustrates an exemplary configuration of an optical shutter which includes two polarizers and a Pockels cell. A Pockels cell typically has a responsiveness in the order of a few nanoseconds and is considered to be suitable as an optical shutter in a laser apparatus where high-speed switching is required.

In the configuration shown in FIG. 51, a polarizer 501 may transmit a Y-polarization component of a laser beam incident thereon and block an X-polarization component thereof by reflecting or absorbing the X-polarization component. On the other hand, a polarizer 502 may transmit an X-polarization component of a laser beam incident thereon and block a Y-polarization component thereof by reflecting or absorbing the Y-polarization component. In this way, the polarizers 501 and 502 may be arranged to transmit different polarization components. In this example, the polarizers 501 and 502 may be arranged so that the polarization direction of the laser beam transmitted through the polarizer 501 differs by 90 degrees from the polarization direction of the laser beam transmitted through the polarizer 502.

A high-voltage pulse may be applied to a Pockels cell 503 by a high-voltage power source 504 under the control of the pedestal controller 56. The Pockels cell 503 may, for example, rotate the polarization direction of the entering laser beam while the high-voltage pulse is applied thereto. In this example, a high-voltage pulse at a value for rotating the polarization direction of the entering laser beam incident beam by a predetermined amount may be applied to the Pockels cell 503 by the high-voltage power source 504.

When a pulse laser beam L1 containing largely a Y-polarization component outputted from the master oscillator 310 enters the optical shutter 321 configured as described above, the pulse laser beam L1 may first be incident on the polarizer 501. The polarizer 501 may transmit a Y-polarization component of the pulse laser beam L1. The pulse laser beam L1 transmitted through the polarizer 501 may then enter the Pockels cell 503.

When a high-voltage pulse is not applied to the Pockels cell 503, the pulse laser beam L1 may be outputted from the Pockels cell 503 without having the polarization direction thereof rotated. The outputted pulse laser beam L1 may then be incident on the polarizer 502, and the polarizer 502 may block the pulse laser beam L1 in this case. As a result, the pulse laser beam L1 may be blocked by the optical shutter 321.

Meanwhile, when a high-voltage pulse is applied to the Pockels cell 503, the polarization direction of the pulse laser beam L1 entering the Pockels cell 503 may be rotated by a predetermined amount. The outputted pulse laser beam L1 may then be incident on the polarizer 502, and the polarizer 502 may transmit an X-polarization component of the pulse laser beam L1. As a result, a part of the pulse laser beam L1 may be outputted from the optical shutter 321.

Figure 52:
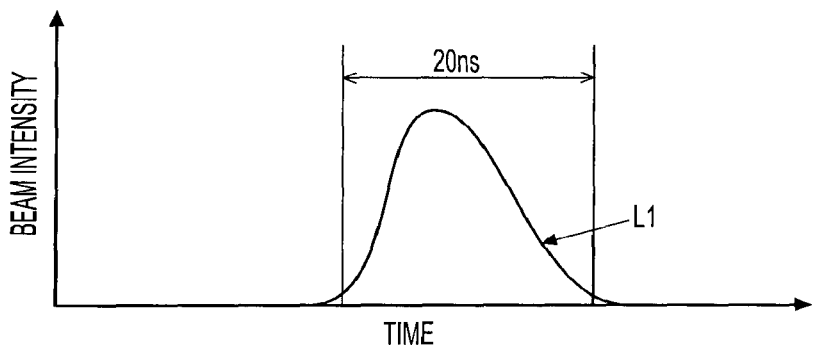
FIG. 52 shows an example of a pulse laser beam entering the optical shutter shown in FIG. 51.
Figure 53:
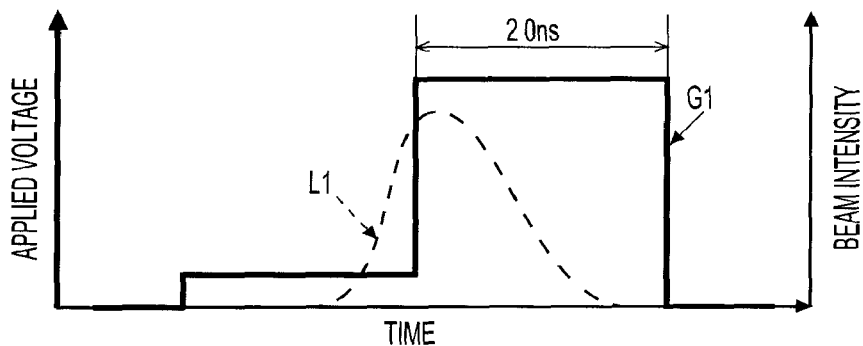
FIG. 53 shows an example of a high-voltage pulse applied to the Pockels cell in the optical shutter shown in FIG. 51.

As shown in FIG. 52, a pulse laser beam L1 having a pulse duration of about 20 ns may enter the optical shutter 321. Then, as shown in FIG. 53, a high-voltage pulse of a duration in which a temporal jitter of the pulse laser beam L1 is absorbed may be applied to the Pockels cell 503. For example, when the pulse duration of the pulse laser beam L1 is 20 ns, and the temporal jitter is 10 ns, the duration of the high-voltage pulse G1 may be approximately 40 ns.

Figure 54:
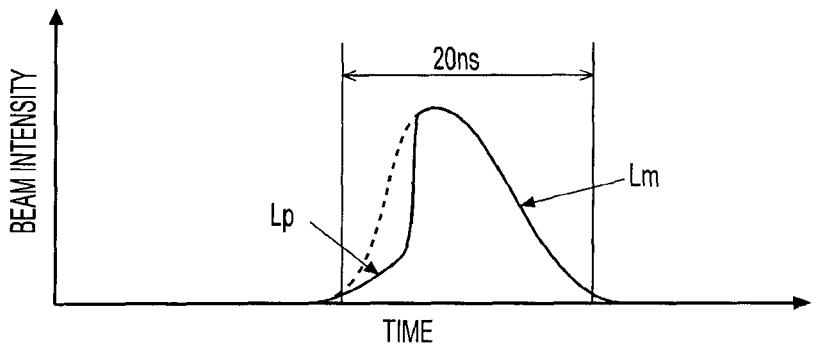
FIG. 54 shows an example of a pulse laser beam outputted from the optical shutter when the high-voltage pulse shown in FIG. 53 is applied to the Pockels cell shown in FIG. 51.

Further, the high-voltage pulse G1 may have a step-like pulse shape in which a voltage of a portion where a pedestal Lp is to be generated from the pulse laser beam L1 is low and a voltage of the remaining portion is high to generate a peak portion Lm. By applying a high-voltage pulse having such a pulse shape to the Pockels cell 503, a waveform of the pulse laser beam L1 may be transformed into such a waveform that contains the pedestal Lp and the peak portion Lm, as shown in FIG. 54.

In this example, the polarizers 501 and 502 are arranged such that the polarization direction of the pulse laser beam L1 transmitted through the polarizer 501 differs by 90 degrees from that of the pulse laser beam L1 transmitted through the polarizer 502. However, this disclosure is not limited thereto. For example, the polarizers 501 and 502 may be arranged such that the polarization direction of the pulse laser beam L1 transmitted through the polarizer 501 may be the same as that of the pulse laser beam L1 transmitted through the polarizer 502. In that case, while a high-voltage pulse is not applied to the Pockels cell 503, the optical shutter 321 may transmit the pulse laser beam L1.

6.2 Variations of Optical Shutter

6.2.1 First Modification

Figure 55:
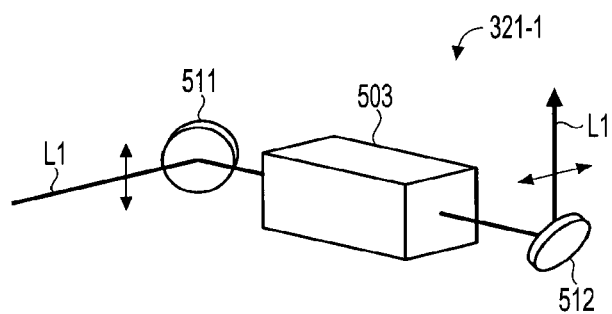
FIG. 55 schematically illustrates an exemplary configuration of a first modification of an optical shutter.

FIG. 55 schematically illustrates an exemplary configuration of an optical shutter of a first modification. In an optical shutter 321-1, reflective polarizers 511 and 512 may, for example, be used in place of the transmissive polarizers 501 and 502. A polarizer such as an absorbing thin-film reflector (ATFR) may be used for each of the polarizers 511 and 512. Even with such a configuration, a similar function to that of the optical shutter 321 shown in FIG. 51 may be achieved. In FIG. 55, the high-voltage power source 504 is omitted.

6.2.2 Second Modification

Figure 56:
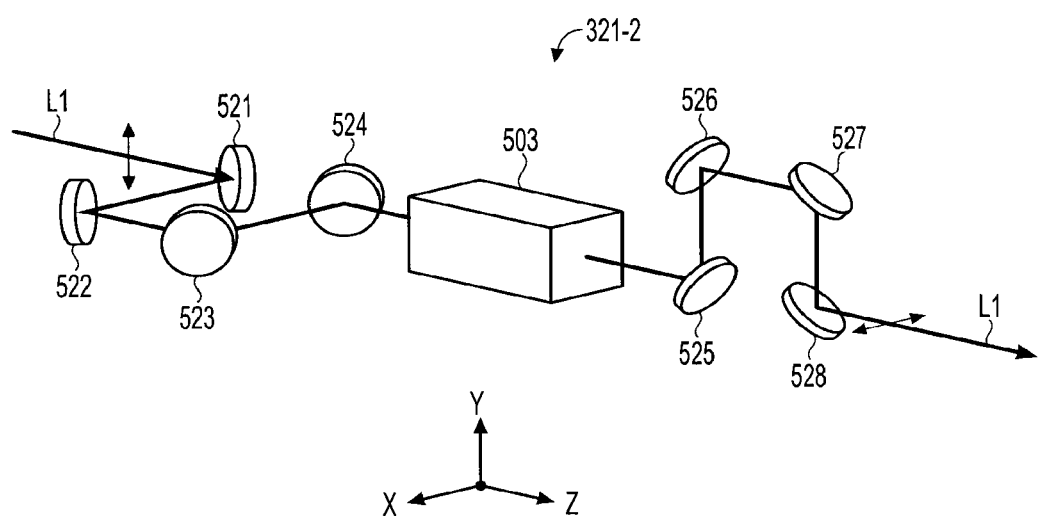
FIG. 56 schematically illustrates an exemplary configuration of a second modification of an optical shutter.

FIG. 56 schematically illustrates an exemplary configuration of an optical shutter of a second modification. As shown in FIG. 56, in an optical shutter 321-2, four reflective polarizers 521 through 524 may be provided upstream from the Pockels cell 503, and four reflective polarizers 525 through 528 may be provided downstream from the Pockels cell 503. An ATFR may be used for each of the polarizers 521 and 528. The polarizers 521 through 524 may, for example, be arranged to reflect a Y-polarization component of the pulse laser beam L1 and absorb the other polarization component thereof. The polarizers 525 through 528 may, for example, be arranged to reflect an X-polarization component of the pulse laser beam L1 and absorb the other polarization component thereof. When a plurality of polarizers that reflects the same polarization component and absorbs the other polarization component is provided upstream and downstream from the Pockels cell 503, respectively, the total absorptance of a polarization component to be absorbed may be increased. Thus, the purity of a given polarization component may be increased.

6.2.3 Third Modification

Figure 57:
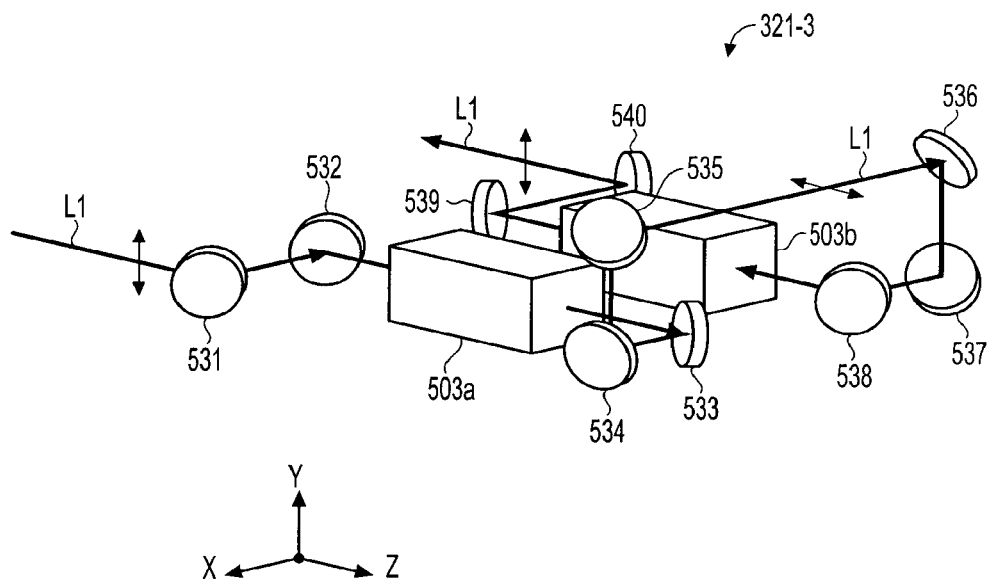
FIG. 57 schematically illustrates an exemplary configuration of a third modification of an optical shutter.

FIG. 57 schematically illustrates an exemplary configuration of an optical shutter of a third modification. As shown in FIG. 57, an optical shutter 321-3 may include two Pockels cells 503a and 503b. Each of the Pockels cells 503a and 503b may be similar to the Pockels cell 503 of FIG. 55 or 56. The Pockels cells 503a may be provided upstream from the Pockels cell 503b. Reflective polarizers 531 and 532 provided upstream from the Pockels cell 503a and reflective polarizers 539 and 540 provided downstream from the Pockels cell 503b may, for example, reflect a Y-polarization component of the pulse laser beam L1 and absorb the other polarization component. Reflective polarizers 534 through 537 may be provided in a beam path between the Pockels cell 503a and the Pockels cell 503b. The polarizers 534 through 537 may, for example, reflect a Z-polarization component of the pulse laser beam L1 and absorb the other polarization component. A high-reflection mirror 533 may be provided downstream from the Pockel cell 503a and a high-reflection mirror 538 may be provided upstream from the Pockels cell 503b. When the plurality of Pockels cells 503a and 503b are used, total absorptance of a polarization component to be absorbed may be increased. Thus, the purity of a certain polarization component may be increased.

6.2.4 Fourth Modification

Figure 58:
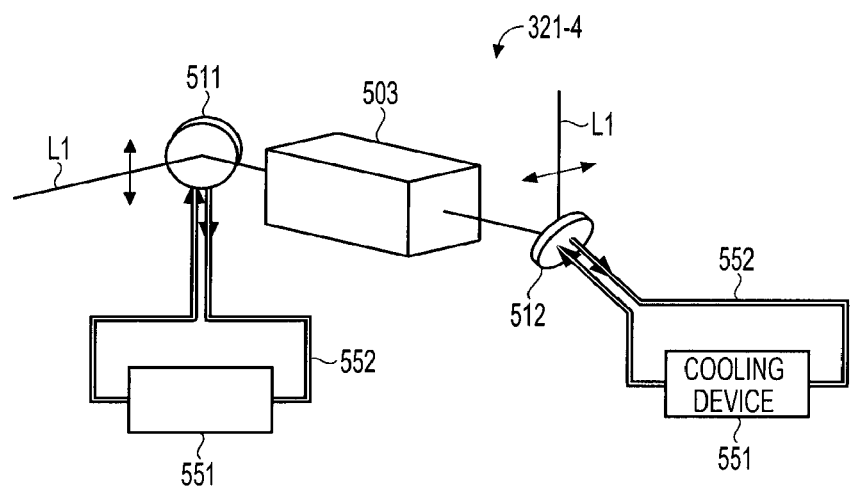
FIG. 58 schematically illustrates an exemplary configuration of a fourth modification of an optical shutter.

FIG. 58 schematically illustrates an exemplary configuration of an optical shutter of a fourth modification. An optical shutter 321-4 as shown in FIG. 58 may be similar in a configuration to the optical shutter 321-1 shown in FIG. 55, but may differ in that the polarizers 511 and 512 may respectively be provided with cooling devices 551. A cooling medium supplied from the cooling device 551 may flow through a flow channel 552 and into an internal flow channel of each of the polarizers 511 and 512. Each of the polarizers 511 and 512 may be provided with an internal flow channel to allow the cooling medium to flow efficiently behind a reflective surface. Cooling the reflective surfaces of the polarizers 511 and 512 efficiently and in a balanced manner may suppress thermal deformation in the respective reflective surfaces. As a result, the direction and the wavefront of the pulse laser beam L1 transmitted through the optical shutter 321-4 may be stabilized. Note that a cooling device may also be provided on the Pockels cell 503 to suppress overheating in the Pockels cell 503.

7. Saturable Absorber Device

The saturable absorber device of the above-described embodiments will now be described with specific examples.

7.1 Adjusting Concentration of Saturable Absorber Gas

Figure 59:
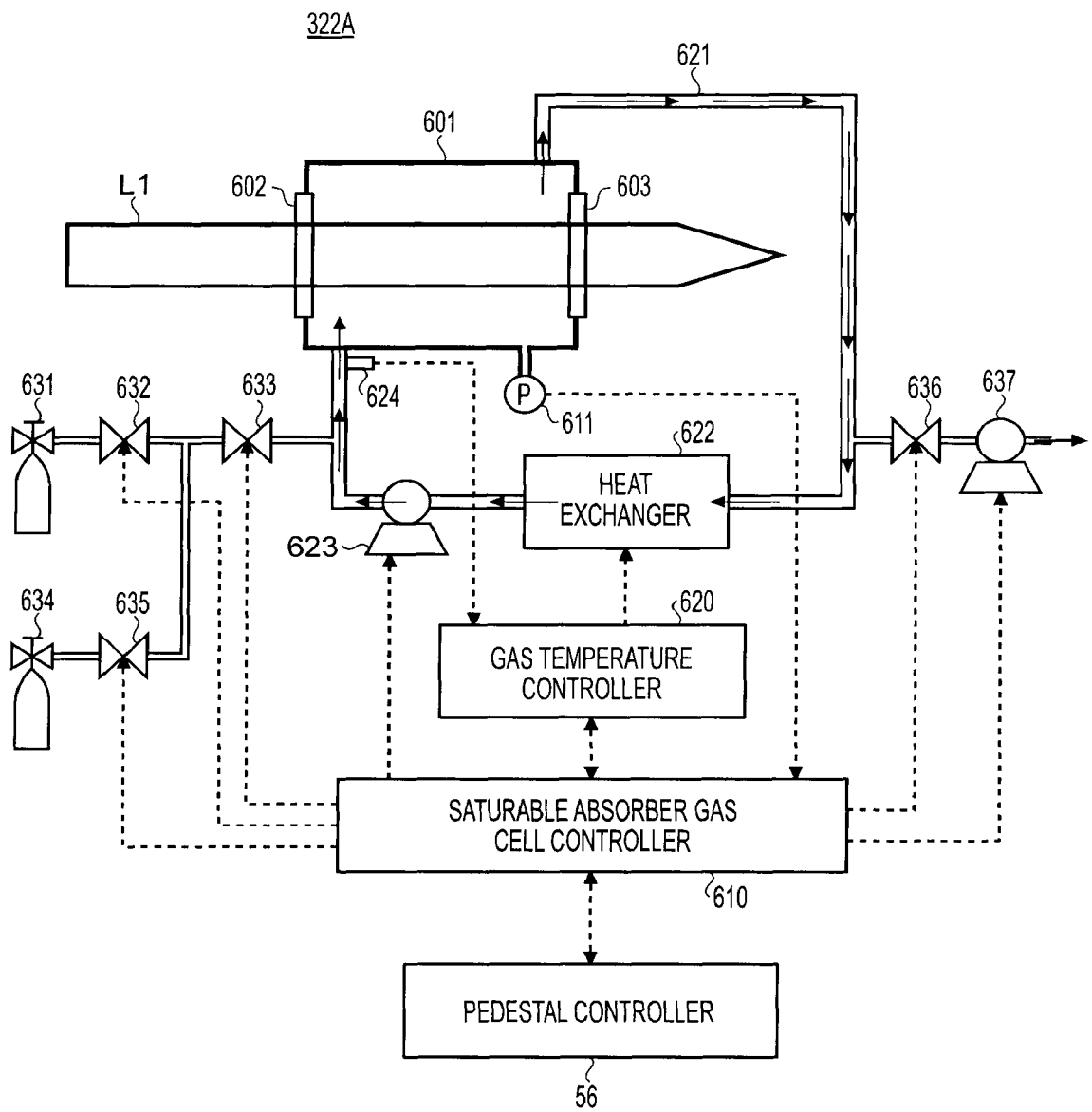
FIG. 59 schematically illustrates an exemplary configuration of a saturable absorber device in which a concentration of a saturable absorber gas is adjustable.

A saturable absorber device in which a concentration of a saturable absorber gas can be adjusted will now be described with reference to the drawing. FIG. 59 schematically illustrates an exemplary configuration of such a saturable absorber device.

As shown in FIG. 59, a saturable absorber device 322A may include a saturable absorber gas cell 601, a heat exchanger 622, a gas temperature controller 620, and a saturable absorber gas cell controller 610. The saturable absorber gas cell controller 610 may control each component of the saturable absorber device 322A in accordance with a signal from the pedestal controller 56.

The saturable absorber gas cell 601 may include windows 602 and 603, through which the pulse laser beam L1 may travel. A pressure sensor 611 may be connected to the saturable absorber gas cell 601 to measure a pressure inside the saturable absorber gas cell 601. The pressure sensor 611 may be connected to the saturable absorber gas cell controller 610. The interior of the saturable absorber gas cell 601 may be in communication with the heat exchanger 622 through a gas pipe 621. A gas pump 623 may be provided in the gas pipe 621 to allow the saturable absorber gas in the gas pipe 621 to circulate between the saturable absorber gas cell 601 and the heat exchanger 622. Further, a temperature sensor 624 may be provided in the gas pipe 621 to detect a temperature of the saturable absorber gas circulating in the gas pipe 621. The gas temperature controller 620 may be connected to the temperature sensor 624. The gas temperature controller 620 may drive the heat exchanger 622 based on a signal from the saturable absorber gas cell controller 610, to thereby control a temperature of the circulating saturable absorber gas.

The saturable absorber gas cell controller 610 may be connected to the gas pump 623. The saturable absorber gas cell controller 610 may control the number of revolutions of the gas pump 623, to thereby control a flow rate of the saturable absorber gas circulating in the gas pipe 621.

An $SF_6$ gas cylinder 631 may be connected to the gas pipe 621 through valves 633 and 632. Further, a buffer gas cylinder 634 may be connected to the gas pipe 621 through valves 633 and 635. A buffer gas may be $N_2$, He, or the like. Furthermore, a discharge pump 637 may be connected to the gas pipe 621 through a valve 636. The valves 632, 633, 635, and 636 may be connected to the saturable absorber gas cell controller 610. The discharge pump 637 may also be connected to the saturable absorber gas cell controller 610. The saturable absorber gas cell controller 610 may appropriately adjust opening of the valves 632, 633, 635, and 636 and the number of revolutions of the discharge pump 637, to thereby adjust a gas pressure in the gas pipe 621 and a concentration of the saturable absorber gas.

By adjusting a concentration of the saturable absorber gas in the saturable absorber gas cell 601, pedestal energy of the pulse laser beam L1 passing through the saturable absorber device 322A may be adjusted.

7.2 Adjusting Optical Path Length Through Saturable Absorber Gas

Figure 60:
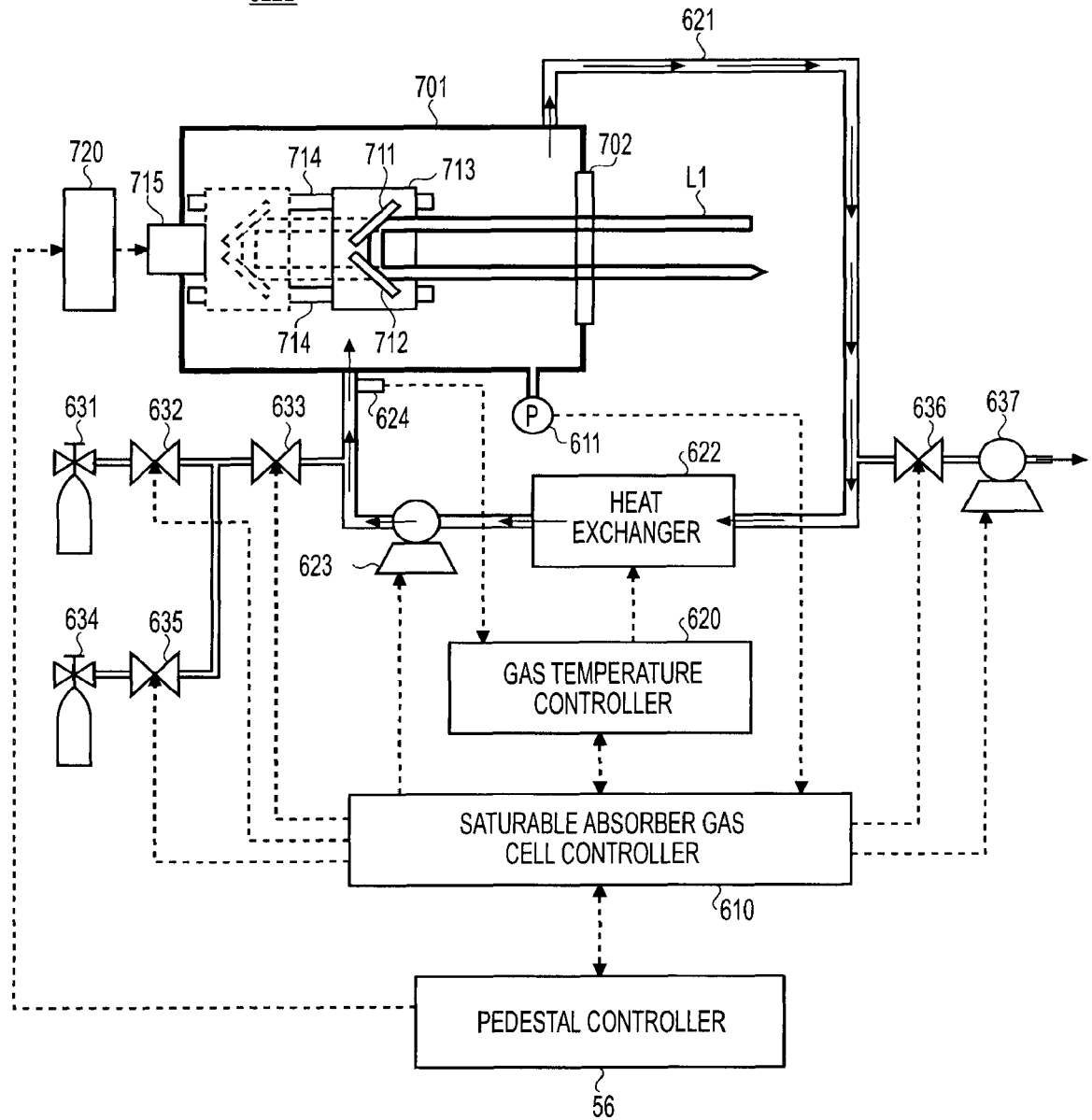
FIG. 60 schematically illustrates an exemplary configuration of a saturable absorber device in which an optical path length through a saturable absorber gas is adjustable.

A saturable absorber device in which an optical path length through a saturable absorber gas can be adjusted will now be described with reference to the drawing. FIG. 60 schematically illustrates an exemplary configuration of such a saturable absorber device.

As shown in FIG. 60, a saturable absorber device 322B may be similar in configuration to the saturable absorber device 322A shown in FIG. 59. However, the saturable absorber device 322B of FIG. 60 may include a saturable absorber gas cell 701 in place of the saturable absorber gas cell 601.

As shown in FIG. 60, the saturable absorber gas cell 701 may include a window 702, through which the pulse laser beam L1 may travel. High-reflection mirrors 711 and 712 may be provided inside the saturable absorber gas cell 701 to bend a beam path of the pulse laser beam L1. The high-reflection mirrors 711 and 712 may be positioned so that the pulse laser beam L1 entering the saturable absorber gas cell 701 through the window 702 is reflected sequentially by the high-reflection mirrors 711 and 712 to be outputted through the window 702.

The high-reflection mirrors 711 and 712 may be fixed to a moving stage 713. The moving stage 713 may be movable along rails 714 provided in the saturable absorber gas cell 701. The rails 714 may extend in a direction parallel to the travel direction of the pulse laser beam L1.

Further, a moving device 715 may be provided in the saturable absorber gas cell 701 to move the moving stage 714 along the rails 714. The moving device 715 may be connected to a driver 720. The pedestal controller 56 may control the moving device 715 through the driver 720 to move the moving stage 713, to thereby adjust an optical path length inside the saturable absorber gas cell 701.

By adjusting an optical path length inside the saturable absorber gas cell 701, pedestal energy of the pulse laser beam L1 passing through the saturable absorber device 322B may be adjusted.

8. Supplementary Descriptions

8.1 Diffused Target

In the preceding description, a diffused target may be a target in a state where particles containing at least one of atoms, molecules, clusters, fine droplets of a target material are diffused in a mist or gas form. A diffused target may contain a target material that in part is turned into plasma.

Figure 61:
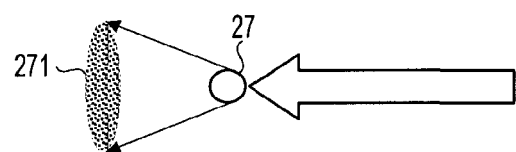
FIG. 61 shows a target irradiated with a pre-pulse laser beam.

FIG. 61 shows a target irradiated with a pre-pulse laser beam. As shown in FIG. 61, a diffused target 271 may be generated when a target 27 is irradiated with a pre-pulse laser beam 41. When the spherical or droplet-shaped target 27 is irradiated with the pre-pulse laser beam 41, a torus-shaped or disc-shaped diffused target 271 may be generated.

8.1.1 Generation of Diffused Target

Figure 62:
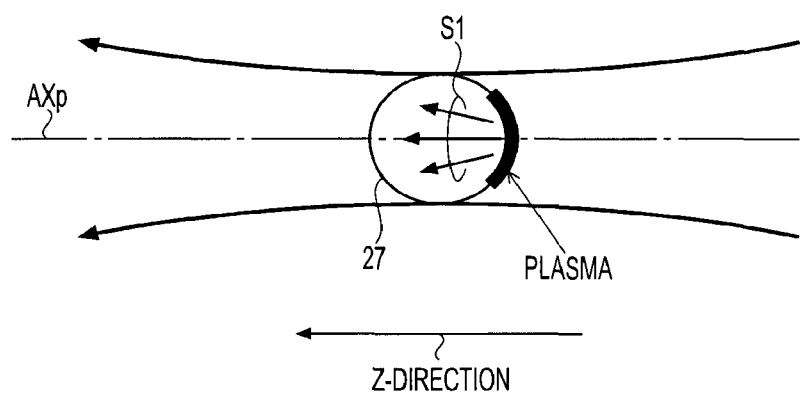
FIG. 62 shows a target irradiated with a pre-pulse laser beam, as viewed in a direction perpendicular to the travel direction of the pre-pulse laser beam.
Figure 63:
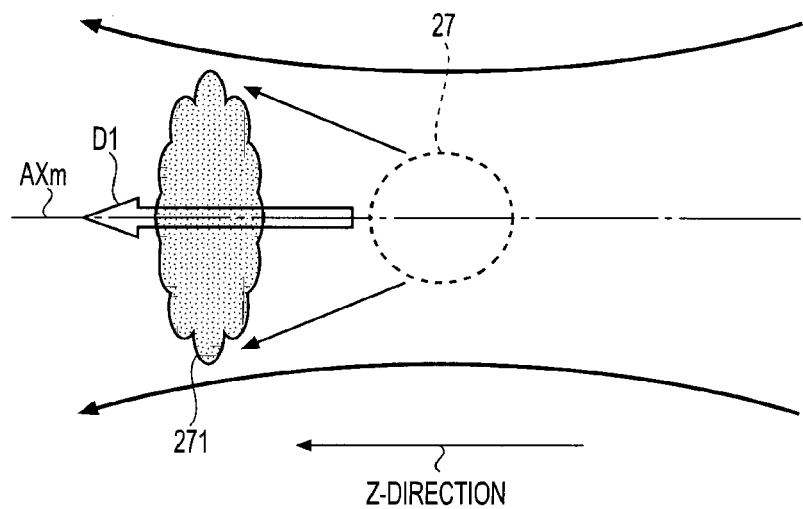
FIG. 63 shows a diffused target, which is generated when a target is irradiated with a pre-pulse laser beam, irradiated with a main pulse laser beam, as viewed in a direction perpendicular to the travel direction of the main pulse laser beam.
Figure 64:
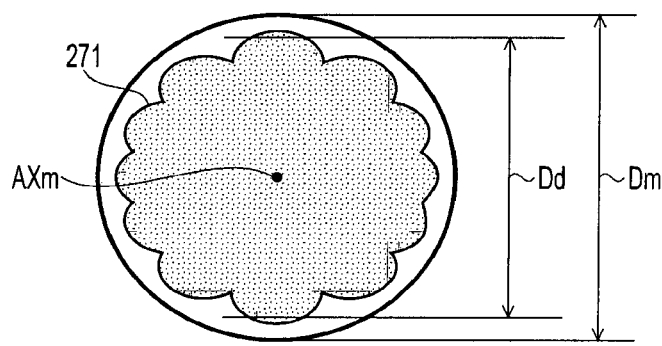
FIG. 64 shows a diffused target irradiated with a main pulse laser beam, as viewed in the travel direction of the main pulse laser beam.

Generation process of a diffused target will be described in detail with reference to FIGS. 62 through 64. FIG. 62 shows a target irradiated with a pre-pulse laser beam, as viewed in a direction perpendicular to the travel direction of the pre-pulse laser beam. FIG. 63 shows a diffused target generated when a target is irradiated with a pre-pulse laser beam being irradiated with a main pulse laser beam, as viewed in a direction perpendicular to the travel direction of the main pulse laser beam. FIG. 64 shows a diffused target generated when a target is irradiated with a pre-pulse laser beam being irradiated with a main pulse laser beam, as viewed in the travel direction of the main pulse laser beam.

As shown in FIG. 62, when the target 27 is irradiated with the pre-pulse laser beam 41, plasma may be generated by laser ablation to a side of the target 27 irradiated with the pre-pulse laser beam 41. When the plasma diffuses, a shock wave S1 generated as the reaction to the laser ablation may propagate into the target 27. As a result, the target 27 may be broken up, and the diffused target 271 may be generated.

As shown in FIG. 63, the diffused target 271 may typically move with a component in a direction D1 the same as the travel direction of the pre-pulse laser beam 41. The main pulse laser beam 31 may be focused to pass through a space including a range within which the diffused target 271 moves and/or diffuses. For example, as shown in FIG. 64, a diameter Dm of the main pulse laser beam 31 in the plasma generation region 25 may be larger than a diffusion range Dd of the diffused target 271 diffused in a torus-shape or in a disc-shape.

Figure 65:
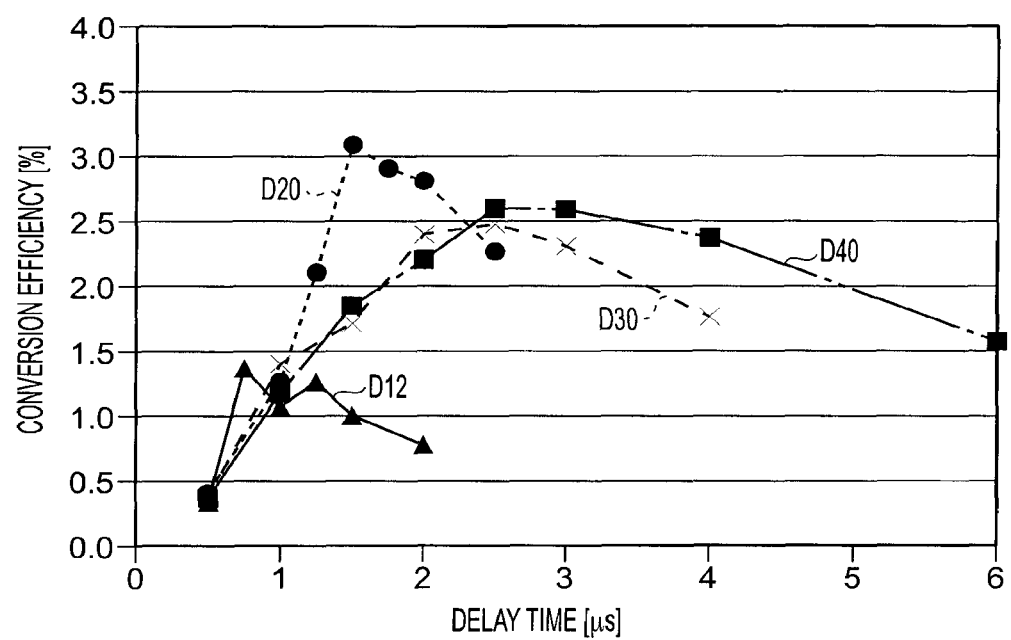
FIG. 65 shows an example of a relationship between conversion efficiency and a delay time from irradiation of a target with a pre-pulse laser beam to irradiation with a main pulse laser beam.

8.2 Relationship Between Delay Time for Main Pulse Laser Beam and Conversion Efficiency FIG. 65 shows an example of a relationship between conversion efficiency and a delay time from the irradiation of a target with a pre-pulse laser beam until the irradiation of the target with a main pulse laser beam. FIG. 65 shows a case where the wavelength of the pre-pulse laser beam 41 is 1.06 µm, the pulse duration is 5 ns, and the fluence is 490 mJ/cm$^2$, and where the main pulse laser apparatus 3A is a $CO_2$ laser, the pulse duration of the main pulse laser beam 31 is 20 ns, and the beam intensity is $6.0 \times 10^9$ W/cm$^2$.

In FIG. 65, a line D12 shows a case where the diameter of the target 27 is 12 µm, a line D20 shows a case where the diameter of the target 27 is 20 µm, a line D30 shows a case where the diameter of the target 27 is 30 µm, and a line D40 shows a case where the diameter of the target 27 is 40 µm.

When the diameter of the target 27 is 12 µm, a delay time for the main pulse laser beam 31 with respect to the pre-pulse laser beam 41 may be in a range of 0.5 µs to 2.0 µs. In other examples, the delay time may be in a range of 0.6 µs to 1.5 µs. In yet other examples, the delay time may be in a range of 0.7 µs to 1.0 µs.

When the diameter of the target 27 is 20 µm, a delay time for the main pulse laser beam 31 with respect to the pre-pulse laser beam 41 may be in a range of 0.5 µs to 2.5 µs. In other examples, the delay time may be in a range of 1.0 µs to 2.0 µs. In yet other examples, the delay time may be 1.3 µs.

When the diameter of the target 27 is 30 µm, a delay time for the main pulse laser beam 31 with respect to the pre-pulse laser beam 41 may be in a range of 0.5 µs to 4.0 µs. In other examples, the delay time may be in a range of 1.5 µs to 3.5 µs. In yet other examples, the delay time may be in a range of 2.0 µs to 3.0 µs.

When the diameter of the target 27 is 40 µm, a delay time for the main pulse laser beam 31 with respect to the pre-pulse laser beam 41 may be in a range of 0.5 µs to 6.0 µs. In other examples, the delay time may be in a range of 1.0 µs to 5.0 µs. In yet other examples, the delay time may be in a range of 2.0 µs to 4.0 µs.

8.3 Relationship Between Fluence of Pre-Pulse Laser Beam and Shape of Diffused Target A relationship between a fluence of a pre-pulse laser beam and a shape of a diffused target will now be discussed in detail with reference to the drawings.

FIGS. 66 through 69 show a shape of a diffused target and plasma observed in a case where a fluence of a pre-pulse laser beam is 480 mJ/cm$^2$. FIG. 66 shows a case where an elapsed time from irradiation with the pre-pulse laser beam is 0 µs. FIG. 67 shows a case where an elapsed time from irradiation with the pre-pulse laser beam is 0.5 µs. FIG. 68 shows a case where an elapsed time from irradiation with the pre-pulse laser beam is 1.0 µs. FIG. 69 shows a case where an elapsed time from irradiation with the pre-pulse laser beam is 1.5 µs.

FIGS. 70 through 73 show a shape of a diffused target and plasma observed in a case where a fluence of a pre-pulse laser beam is 96 mJ/cm$^2$. FIG. 70 shows a case where an elapsed time from irradiation with the pre-pulse laser beam is 0 µs. FIG. 71 shows a case where an elapsed time from irradiation with the pre-pulse laser beam is 0.5 µs. FIG. 72 shows a case where an elapsed time from irradiation with the pre-pulse laser beam is 1.0 µs. FIG. 73 shows a case where an elapsed time from irradiation with the pre-pulse laser beam is 1.5 µs.

FIGS. 74 through 77 show a shape of a diffused target and plasma observed in a case where a fluence of a pre-pulse laser beam is 19.5 mJ/cm$^2$. FIG. 74 shows a case where an elapsed time from irradiation with the pre-pulse laser beam is 0 µs. FIG. 75 shows a case where an elapsed time from irradiation with the pre-pulse laser beam is 0.5 µs. FIG. 76 shows a case where an elapsed time from irradiation with the pre-pulse laser beam is 1.0 µs. FIG. 77 shows a case where an elapsed time from irradiation with the pre-pulse laser beam is 1.5 µs.

Further, FIGS. 66 through 77 show a case where Sn is used as the target material, the diameter of the target 27 is 20 µm, a YAG laser is used as the pre-pulse laser apparatus 40, and the pulse duration of the pre-pulse laser beam 41 is 5 ns. In each of FIGS. 66 through 77, the pre-pulse laser beam 41 strikes the target 27 from the right side of the paper plane.

As shown in FIGS. 66, 70, and 74, at a point where an elapsed time from irradiation with the pre-pulse laser beam 41 is 0 µs, that is, at the time when the target 27 is irradiated with the pre-pulse laser beam 41, the diffused target 271 was not observed and only plasma 272 of the target material was observed.

As shown in FIGS. 67 through 69, when a fluence of the pre-pulse laser beam 41 is 480 mJ/cm², the torus-shaped diffused target 271 was observed where an elapsed time from the irradiation with the pre-pulse laser beam 41 is in a range of 0.5 μs to 1.5 μs. When an elapsed time is equal to or greater than 1.5 μs, if the spot size Dm of the main pulse laser beam 31 is about 300 μm, a large portion of the diffused target 271 may be irradiated with the main pulse laser beam 31.

As shown in FIGS. 71 through 73 and 75 through 77, when a fluence of the pre-pulse laser beam 41 is 96 mJ/cm² or 19.5 mJ/cm², the disc-shaped diffused target 271 was observed where an elapsed time from the irradiation with the pre-pulse laser beam 41 is in a range of 0.5 μs to 1.5 μs. Further, as the elapsed time increases, the diffusion range of the diffused target 271 increased. When a fluence of the pre-pulse laser beam 41 is 96 mJ/cm², the diffusion range of the diffused target 271 was greater, compared to the case when a fluence of the pre-pulse laser beam 41 is 19.5 mJ/cm².

In any of the cases shown in FIGS. 66 through 77, the EUV light 252 was generated when the diffused target 271 and/or the plasma 272 were/was irradiated with the main pulse laser beam 31.

8.4 Regenerative Amplifier

Figure 78:
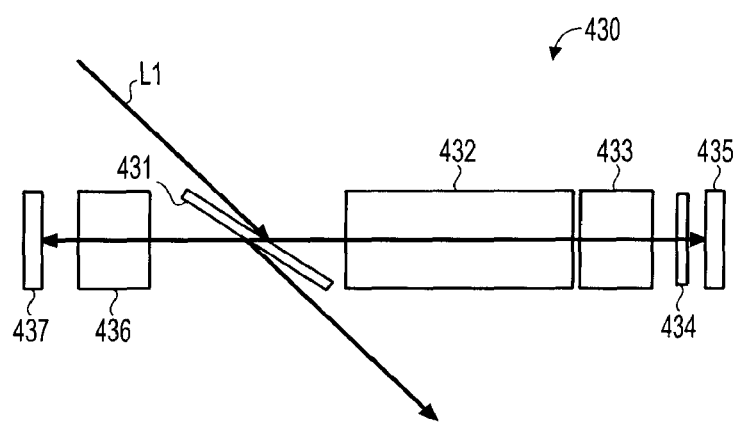
FIG. 78 schematically illustrates an exemplary configuration of a regenerative amplifier.

FIG. 78 illustrates an exemplary configuration of a regenerative amplifier. The regenerative amplifier 430 may include a polarization beam splitter 431, a $CO_2$ gas amplification part 432, Pockels cells 433 and 436, a quarter-wave plate 434, and resonator mirrors 435 and 437.

The polarization beam splitter 431 may, for example, be formed of a thin-film polarizer. The polarization beam splitter 431 may, for example, reflect an S-polarization component and transmit a P-polarization component of a laser beam incident thereon. When the pulse laser beam L1 that largely contains an S-polarization component with respect to the polarization beam splitter 431 enters the regenerative amplifier 430, the pulse laser beam L1 may first be reflected by the polarization beam splitter 431. Thus, the pulse laser beam L1 may be taken into the resonator formed by the resonator mirrors 435 and 437. The pulse laser beam L1 taken into in the resonator may be amplified as it passes through the $CO_2$ gas amplification part 432. The pulse laser beam L1 may pass through the Pockels cell 433, to which a voltage is not applied, be transmitted through the quarter-wave plate 434, be reflected by the resonator mirror 435, and again be transmitted through the quarter-wave plate 434. With this configuration, the polarization direction of the pulse laser beam L1 may be rotated by 90 degrees.

Thereafter, the pulse laser beam L1 may pass through the Pockels cell 433 again, to which a voltage is not applied. At this point, a predetermined voltage may be applied to the Pockels cell 433 after the pulse laser beam L1 passes therethrough. The Pockels cell 433, to which a voltage is applied, may give a quarter-wave phase shift to the pulse laser beam L1 passing therethrough. Accordingly, while the predetermined voltage is applied to the Pockels cell 433, the polarization direction of the pulse laser beam L1 incident on the polarization beam splitter 431 may largely include a P-polarization component with respect thereto. Thus, the pulse laser beam L1 may be trapped in the resonator.

Then, at a timing at which the pulse laser beam L1 is to be outputted, a predetermined voltage may be applied to the Pockels cell 436. The pulse laser beam L1 traveling back and forth in the resonator may be transmitted through the polarization beam splitter 431 and then be subjected to a quarter-wave phase shift when passing through the Pockels cell 436. Then, the linearly polarized pulse laser beam L1 may be transformed into the circularly polarized pulse laser beam L1. Thereafter, the pulse laser beam L1 may be reflected by the resonator mirror 437 and again pass through the Pockels cell 436. Thus, the circularly polarized pulse laser beam L1 may be transformed into the linearly polarized pulse laser beam L1. The pulse laser beam L1 at this point may largely include an S-polarization component with respect to the polarization beam splitter 431 and be reflected thereby. Accordingly, the pulse laser beam L1 may be outputted from the regenerative amplifier 430.

The above-described embodiments and the modifications thereof are merely examples for implementing this disclosure, and this disclosure is not limited thereto. Making various modifications according to the specifications or the like is within the scope of this disclosure, and other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. A system for generating extreme ultraviolet light, the system comprising:
   a master oscillator configured to output a laser beam pulse, the laser beam pulse having a waveform including a first portion and a second portion following the first portion;
   an optical element positioned in a beam path of the laser beam pulse, the optical element configured to transform the waveform of the laser beam pulse to a second waveform, the second waveform including a pedestal and a peak, the pedestal being formed by transformation of the first portion to the pedestal by the optical element, and the peak being the second portion;
   an amplifier including a gain medium, the amplifier configured to amplify the pedestal and the peak to form an amplified pedestal and an amplified peak; and
   the amplified pedestal and the amplified peak containing sufficient energy to turn a target material into a plasma that emits EUV light.

2. The system according to claim 1, wherein energy of the amplified pedestal is in a range from 1 mJ to 10 mJ.

3. The system according to claim 1, wherein a ratio of energy of the amplified pedestal to total energy of the amplified pedestal and the amplified peak is in a range from 1% to 10%.

4. The system of claim 1, wherein the amplifier is configured to amplify the pedestal by a greater amount than the peak is amplified.

5. The system of claim 1, wherein the pedestal and the peak are temporally connected, and the amplified pedestal and the amplified peak maintain the temporal connection.

6. The system of claim 1, wherein the amplified pedestal has a maximum energy that is less than the maximum energy of the amplified peak.

7. A method of irradiating a target, comprising:
outputting a laser beam pulse, the laser beam pulse having a first waveform, the first waveform including a leading side and a trailing side temporally connected to the leading side, the trailing side including a peak having a peak intensity of the laser beam pulse;
transforming the laser beam pulse from the first waveform to a second waveform by controlling an optical element to control transmission of the laser beam pulse through the optical element, the second waveform including a first portion and a second portion temporally connected to the first portion, the second portion including the peak having the peak intensity of the laser beam pulse;
amplifying the second waveform while maintaining the temporal connection between the first portion and the second portion, the amplified second waveform including an amplified first portion and an amplified second portion; and
irradiating the target with the amplified first portion and the amplified second portion to turn the target into a plasma that emits extreme ultraviolet light.

8. The method of claim 7, wherein the amplified first portion has a maximum energy that is less than the maximum energy of the amplified second portion.

9. The method of claim 7, including irradiating the target with a pre-pulse laser beam prior to irradiating the target with the amplified first portion of the laser beam pulse.

10. The method of claim 7, wherein a ratio of energy of the amplified first portion to total energy of the amplified first portion and the amplified second portion is in a range of 1% to 10%.

11. The method of claim 7, wherein energy of the amplified first portion is in a range of 1 mJ to 10 mJ.

12. The method of claim 7, wherein a temporal profile of the second portion is based on a temporal profile of the trailing side of the laser beam pulse and a temporal profile of the first portion is different from the temporal profile of the leading side of the laser beam pulse.

13. A system for an extreme ultraviolet (EUV) light source, the system comprising:
a light generator configured to output an optical pulse;
an optical element configured to transform a waveform of the optical pulse;
a controller configured to determine a characteristic of the transformed waveform;
wherein the transformed waveform includes a first portion and a second portion, the second portion having a temporal energy profile based on a temporal profile of the optical pulse and the first portion having a temporal energy profile that is different from the temporal energy profile of the optical pulse; and
the second portion includes energy to convert a target to a plasma that emits EUV light.

14. The system of claim 13, wherein the light generator includes a laser.

15. The system of claim 13, wherein the optical element includes a Pockels cell.

16. The system of claim 13, wherein the optical element includes a shutter.

17. The system of claim 13, including an amplifier configured to amplify the transformed waveform, the amplified waveform including an amplified first portion and an amplified second portion, the amplified first portion having a maximum energy that is less than the maximum energy of the amplified second portion.

18. The system of claim 17, wherein a ratio of energy of the amplified first portion to total energy of the amplified first portion and the amplified second portion is in a range of 1% to 10%.

19. The system of claim 17, wherein energy of the amplified first portion is in a range of 1 mJ to 10 mJ.

20. The system of claim 13, wherein the first portion includes a pedestal, and the second portion includes a peak.

* * * * *